(12) United States Patent
Kogiso et al.

(10) Patent No.: US 10,822,465 B2
(45) Date of Patent: Nov. 3, 2020

(54) BLACK RESIN COMPOSITION, POLYIMIDE WITH BLACK RESIN CURED FILM AND PRODUCTION METHOD THEREFOR, AND FLEXIBLE PRINTED WIRING BOARD USING BLACK RESIN CURED FILM

(71) Applicant: KANEKA CORPORATION, Osaka-shi (JP)

(72) Inventors: Tetsuya Kogiso, Otsu (JP); Tomohiro Koda, Otsu (JP); Masayoshi Kido, Otsu (JP)

(73) Assignee: KANEKA CORPORATION, Osaka (JP)

( * ) Notice: Subject to any disclaimer, the term of this patent is extended or adjusted under 35 U.S.C. 154(b) by 247 days.

(21) Appl. No.: 15/772,352

(22) PCT Filed: Nov. 4, 2016

(86) PCT No.: PCT/JP2016/082839
§ 371 (c)(1),
(2) Date: Apr. 30, 2018

(87) PCT Pub. No.: WO2017/078152
PCT Pub. Date: May 11, 2017

(65) Prior Publication Data
US 2018/0319945 A1 Nov. 8, 2018

(30) Foreign Application Priority Data
Nov. 6, 2015 (JP) .................................. 2015-218669

(51) Int. Cl.
*C08J 7/04* (2020.01)
*B05D 7/04* (2006.01)
(Continued)

(52) U.S. Cl.
CPC .............. *C08J 7/0427* (2020.01); *B05D 1/02* (2013.01); *B05D 3/007* (2013.01); *B05D 7/04* (2013.01); *B05D 7/24* (2013.01); *B32B 7/12* (2013.01); *B32B 15/08* (2013.01); *B32B 17/064* (2013.01); *B32B 27/20* (2013.01); *B32B 27/281* (2013.01); *B32B 27/34* (2013.01); *B32B 27/38* (2013.01); *C08G 18/44* (2013.01); *C08G 18/758* (2013.01); *C08J 7/04* (2013.01); *C08K 5/0041* (2013.01); *C08K 5/18* (2013.01); *C08K 5/3417* (2013.01); *C08K 5/5313* (2013.01); *C08L 75/04* (2013.01); *C08L 79/08* (2013.01); *C09D 4/00* (2013.01); *C09D 7/63* (2018.01); *C09D 175/04* (2013.01); *H05K 1/036* (2013.01); *H05K 1/0393* (2013.01); *H05K 3/28* (2013.01); *H05K 3/285* (2013.01); *H05K 3/287* (2013.01); *B05D 3/10* (2013.01); *B32B 2250/02* (2013.01); *B32B 2255/06* (2013.01);
*B32B 2255/10* (2013.01); *B32B 2255/20* (2013.01); *B32B 2255/24* (2013.01); *B32B 2255/26* (2013.01);
(Continued)

(58) Field of Classification Search
CPC ... B05D 7/04; B05D 1/02; B05D 3/10; B05D 3/007; B05D 7/24; B32B 27/20; B32B 27/34; B32B 17/064; B32B 27/281; B32B 15/08; B32B 7/12; B32B 27/38; B32B 2307/306; B32B 2255/10; B32B 2307/706; B32B 2307/536; B32B 2307/7145; B32B 2307/714; B32B 2307/732; B32B 2457/08; B32B 2255/28; B32B 2307/41; B32B 2255/24; B32B 2255/06; B32B 2255/20; B32B 2307/546; B32B 2255/26; B32B 2250/02; B32B 2307/3065; C08J 7/0427; C08J 7/04; C08J 2377/00; C08J 2433/10; C08J 2475/04; C08G 18/758; C08G 18/44; C08L 75/04; C08L 79/08; C09D 7/63; C09D 175/04; C09D 133/10; C09D 4/00; H05K 3/287; H05K 1/036; H05K 1/0393; H05K 3/285; H05K 1/0274; H05K 2203/161; H05K 2201/012; H05K 2201/0154; H05K 2201/0195; H05K 3/28; C08K 5/0041; C08K 5/18; C08K 5/3417; C08K 5/5313
See application file for complete search history.

(56) References Cited

U.S. PATENT DOCUMENTS

2014/0370301 A1 12/2014 Sekito

FOREIGN PATENT DOCUMENTS

| CN | 101876788 A | 11/2010 |
| JP | 2008-257045 A | 10/2008 |

(Continued)

OTHER PUBLICATIONS

International Search Report dated Jan. 31, 2017 in PCT/JP2016/082839, 2 pages.
(Continued)

*Primary Examiner* — Patrick D Niland
(74) *Attorney, Agent, or Firm* — Oblon, McClelland, Maier & Neustadt, L.L.P.

(57) ABSTRACT

A production method for a polyimide with a black resin cured film includes a process of obtaining the black resin cured film by curing a black resin composition on the polyimide. The process of obtaining the black resin cured film includes a process of processing the black resin composition with a predetermined spray impact. A distance from a point where a line that is perpendicular to a surface of the polyimide and that passes through a substrate-adhered edge between the black resin cured film and the polyimide intersects a top portion of the black resin cured film to an edge of the top portion is 25 μm or less.

21 Claims, 1 Drawing Sheet

(51) Int. Cl.
    C08G 18/75    (2006.01)
    C08L 75/04    (2006.01)
    C08G 18/44    (2006.01)
    B32B 27/20    (2006.01)
    H05K 3/28     (2006.01)
    B32B 27/34    (2006.01)
    B32B 17/06    (2006.01)
    B32B 27/28    (2006.01)
    B32B 15/08    (2006.01)
    B32B 7/12     (2006.01)
    B32B 27/38    (2006.01)
    B05D 3/00     (2006.01)
    B05D 7/24     (2006.01)
    C08K 5/00     (2006.01)
    C08K 5/18     (2006.01)
    C08K 5/3417   (2006.01)
    C08K 5/5313   (2006.01)
    C08L 79/08    (2006.01)
    C09D 4/00     (2006.01)
    C09D 7/63     (2018.01)
    B05D 1/02     (2006.01)
    C09D 175/04   (2006.01)
    H05K 1/03     (2006.01)
    H05K 1/02     (2006.01)
    B05D 3/10     (2006.01)
    C09D 133/10   (2006.01)

(52) U.S. Cl.
    CPC ..... B32B 2255/28 (2013.01); B32B 2307/306 (2013.01); B32B 2307/3065 (2013.01); B32B 2307/41 (2013.01); B32B 2307/536 (2013.01); B32B 2307/546 (2013.01); B32B 2307/706 (2013.01); B32B 2307/714 (2013.01); B32B 2307/7145 (2013.01); B32B 2307/732 (2013.01); B32B 2457/08 (2013.01); C08J 2377/00 (2013.01); C08J 2433/10 (2013.01); C08J 2475/04 (2013.01); C09D 133/10 (2013.01); H05K 1/0274 (2013.01); H05K 2201/012 (2013.01); H05K 2201/0154 (2013.01); H05K 2201/0195 (2013.01); H05K 2203/161 (2013.01)

(56) References Cited

FOREIGN PATENT DOCUMENTS

| | | |
|---|---|---|
| JP | 2010-91876 A | 4/2010 |
| JP | 2010-256891 A | 11/2010 |
| JP | 2013-61457 A | 4/2013 |
| JP | 2013-80206 A | 5/2013 |
| JP | 2014-160228 A1 | 9/2014 |
| JP | 5586729 B2 | 9/2014 |
| JP | 2015-200774 A | 11/2015 |
| TW | 201042378 A1 | 12/2010 |
| TW | 201335290 A1 | 9/2013 |
| WO | WO 2012/045736 A1 | 4/2012 |
| WO | WO 2013/111481 A1 | 8/2013 |
| WO | WO 2016/103994 A1 | 6/2016 |
| WO | WO 2016/158114 A1 | 10/2016 |

OTHER PUBLICATIONS

International Preliminary Report on Patentability dated May 17, 2018 in PCT/JP2016/082839 (submitting English translation only), 7 pages.

Combined Office Action and Search Report dated Aug. 28, 2018 in Taiwan Patent Application No. 105135876 (with English translation), 14 pages.

Chinese Office Action dated Jul. 27, 2020, in Chinese Patent Application No. 201680064682.X (with English Translation).

BLACK RESIN COMPOSITION, POLYIMIDE WITH BLACK RESIN CURED FILM AND PRODUCTION METHOD THEREFOR, AND FLEXIBLE PRINTED WIRING BOARD USING BLACK RESIN CURED FILM

TECHNICAL FIELD

The present invention relates to a black resin composition, a polyimide with a black resin cured film and a method for producing the polyimide with a black resin cured film, and a flexible printed board using a black resin cured film.

TECHNICAL BACKGROUND

In general, a film-like printed wiring board (hereinafter abbreviated as a flexible printed wiring board) mounted on a small device such as a mobile phone or a digital camera is produced by going through (1) a circuit forming process of a copper-clad laminated plate, (2) a protection process of a circuit board using a coverlay and a cover coat, (3) a surface treatment process in which an exposed part of a copper foil or a component mounting part is subjected to a gold plating treatment or the like, (4) a process of adhering a reinforcing plate, and (5) an outer shape processing process such as punching. Thereafter, depending on an intended use, (6) various surface treatment processes are selected for the exposed part of the copper foil or the component mounting part; a gold plating treatment is performed for a flexible printed wiring board having a switch contact point or an anisotropic conductive film (ACF) connection terminal; and a gold plating treatment or a rust prevention (OSP) treatment is performed for a flexible printed wiring board for high density mounting.

In particular, for a flexible printed wiring board, as (2) the protection process of a circuit board using a coverlay and a cover coat, a photosensitive resin composition excellent in insulation performance, heat resistance, solvent resistance, flame resistance and the like is pasted in a film-like form or is applied in a liquid form on the circuit board to form a film of the photosensitive resin composition, and thereafter, exposure, development and heating are performed using a photographic technology, and thereby, a fine pattern (insulating film) is easily formed and the circuit board is protected.

As the coverlay, a coverlay film obtained by applying an adhesive to a polyimide film or the like has been used. When the coverlay film is adhered on a flexible circuit board, a method is commonly used in which an opening part is provided in advance using a method such as punching in a terminal part of a circuit or a portion connecting to a component and positioning is performed and thereafter thermocompression bonding is performed by hot pressing or the like. However, it is difficult to provide a high precision opening in a thin coverlay film. Further, since positioning at the time of bonding is often performed manually, workability and positional accuracy are also poor and the coverlay film is pasted to unnecessary portions, and thus the number of wasted portions is large and there is also a problem in cost. On the other hand, as a cover coat favorable in cost, a solder resist or the like is used. In particular, when fine processing is required, a solder resist having a photosensitive function is preferably used.

Further, along with advances in thickness reduction of a flexible printed wiring board, high flame resistance is demanded for each member, and it is also demanded to perform formulation design by selecting a flame retardant such that processability and mountability are not impaired and bleed out does not occur on a surface of an insulating film during a processing process such as hot pressing and during long-term use.

In recent years, along with the advances in size reduction of an electronic device, a printed wiring board has become more highly precise and complex. For a purpose of protecting design information of a circuit pattern or a purpose of preventing image noise or the like due to light reflection, attempts have been made to impart opacity by coloring a coverlay film or a photosensitive solder resist, which is a surface protection material for a circuit board, in black.

In particular, for a photosensitive solder resist, photosensitivity, flexibility, heat resistance, plating resistance, blackness and opacity are important, and various proposals have been made to allow these properties to be developed. For example, a black photosensitive solder resist that has sufficient blackness and is also excellent in resolution has been proposed (for example, see Patent Documents 1 and 2).

Further, recently, there is a growing demand for high density and multilayering in a printed wiring board. Excellent coatability even on an uneven or stepped portion of a substrate surface circuit, and that conventional characteristics are developed without impairing processing characteristics even on a circuit copper foil or a base material such as polyimide, are demanded.

In particular, in a photosensitive solder resist applied in a liquid form, thickness variation due to a step is large, and thus, for multilayering, it is necessary to be able to process regardless of a film thickness. In order to be applicable to a recent printed wiring board, a photosensitive resin composition having a good pattern shape even with a film thickness of 30 μm or more has been proposed. In order to be applicable to a recent printed wiring board, a photosensitive resin composition having a good pattern shape even with a film thickness of 30 μm or more has been proposed (for example, see Patent Document 3).

Naturally, when a black photosensitive resin composition having excellent opacity is used, due to that an added colorant absorbs or reflects light, it is more difficult for light to pass through to a bottom portion and it may be impossible to sufficiently ensure a photocuring property. Therefore, a photosensitive film using a specific colorant or a photopolymerization initiator or the like, a more sensitive photopolymerization initiator and a photosensitive solder resist using the more sensitive photopolymerization initiator, and a photosensitive solder resist using a specific pigment have been proposed (for example, see Patent Documents 4-6).

RELATED ART

Patent Documents

[Patent Document 1] Japanese Patent Laid-Open Publication No. 2008-257045.
[Patent Document 2] Japanese Patent Laid-Open Publication No. 2010-091876.
[Patent Document 3] Japanese Patent No. 5586729
[Patent Document 4] Japanese Patent Laid-Open Publication No. 2013-080206.
[Patent Document 5] International Publication No. WO 2012/045736.
[Patent Document 6] Japanese Patent Laid-Open Publication No. 2013-061457.

SUMMARY OF THE INVENTION

Problems to be Solved by the Invention

However, the technologies described in the above Patent Documents 1-6 were not sufficient for a purpose of obtaining a polyimide with a black resin cured film that has excellent flame resistance and high opacity and allows a shape and adhesion to be sufficiently maintained with respect to a gold plating chemical liquid or a flux solder in a mounting process.

An object of the present invention is to obtain a polyimide with a black resin cured film that has excellent flame resistance and high opacity and allows a shape and adhesion to be sufficiently maintained with respect to a gold plating chemical liquid or a flux solder in a mounting process, and to obtain a method for producing the polyimide with the black resin cured film, and to obtain a flexible printed wiring board having the polyimide with the black resin cured film.

Means for Solving the Problems

As a result of an intensive study in order to achieve the above object, the present inventors have accomplished the present invention.

That is, an embodiment of the present invention includes the following aspects.

[1] A production method for a polyimide with a black resin cured film includes a process of obtaining the black resin cured film by curing a black resin composition at a thickness of 40-70 μm on the polyimide. The process of obtaining the black resin cured film includes a process of processing the black resin composition at a spray impact of 0.10-10.0 kg/cm$^2$ of development equipment. In a cross section of the black resin cured film, when a vertical line (L) passing through a substrate-adhered edge (E) between the black resin cured film and the polyimide is drawn with respect to a surface of the polyimide, a distance (U) from an intersection point between the vertical line (L) and a top portion of the black resin cured film to an edge of the top portion is 25 μm or less.

[2] A black resin composition includes, at least, (a) a carboxyl group-containing photosensitive resin, (b) a photopolymerization initiator, (c) a colorant, (d) organic fine particles, and (e) a phosphinate compound. (a) The carboxyl group-containing photosensitive resin is a carboxyl group-containing photosensitive resin having one or more partial structures selected from a bisphenol A structure, a bisphenol F structure, a biphenol structure, a biphenol novolac structure, a bisxylenol structure, a biphenyl novolac structure and a urethane structure. (b) The photopolymerization initiator is a photopolymerization initiator having a structure represented by the following general formula (1) or the following general formula (2) or is a photopolymerization initiator obtained by combining a photopolymerization initiator having a structure represented by the following general formula (1) and a photopolymerization initiator having a structure represented by the following general formula (2). (c) The colorant contains at least a perylene-based colorant and/or a phthalocyanine-based colorant. When the black resin cured film obtained by curing the black resin composition has a thickness of 20 μm, a blackness (L*) value is 10-30.

[Chemical Formula 1]

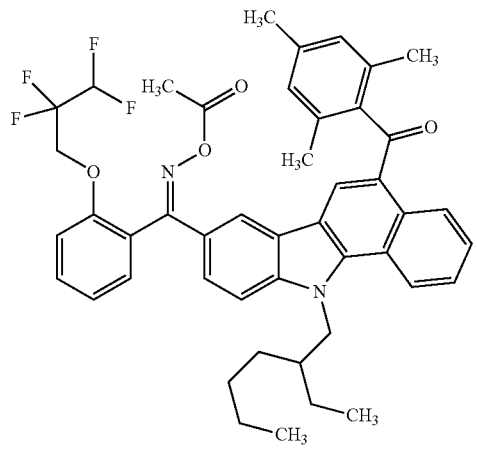

General Formula (1)

[Chemical Formula 2]

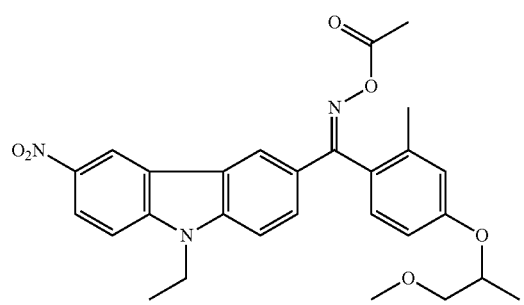

General Formula (2)

[3] A black resin composition includes, at least, (a) a carboxyl group-containing photosensitive resin, (b) a photopolymerization initiator, (c) a colorant, (d) organic fine particles, and (e) a phosphinate compound. (a) The carboxyl group-containing photosensitive resin is a carboxyl group-containing photosensitive resin having one or more partial structures selected from a bisphenol A structure, a bisphenol F structure, a biphenol structure, a biphenol novolac structure, a bisxylenol structure, a biphenyl novolac structure and a urethane structure. (b) The photopolymerization initiator is a photopolymerization initiator obtained by combining two kinds of oxime ester-based photopolymerization initiators, the two kinds of oxime ester-based photopolymerization initiators including, an oxime ester-based photopolymerization initiator having a structure represented by the following general formula (1) and an oxime ester-based photopolymerization initiator having a structure represented by the following general formula (2), or an oxime ester-based photopolymerization initiator having a structure represented by the following general formula (2) and an oxime ester-based photopolymerization initiator having a structure represented by the following general formula (11), and a relation between an additive amount (X) of the oxime ester-based photopolymerization initiator having a structure represented by the following general formula (1) or the following general formula (11) and an additive amount (Y) of the oxime ester-based photopolymerization initiator having a structure represented by the following general formula (2) is X:Y=0.1:0.9-0.9:0.1. (c) The colorant contains at least a perylene-based colorant and/or a phthalocyanine-based colorant. When the black resin cured film obtained by curing the black resin composition has a thickness of 20 μm, a blackness (L*) value is 10-30.

[Chemical Formula 3]

General Formula (1)

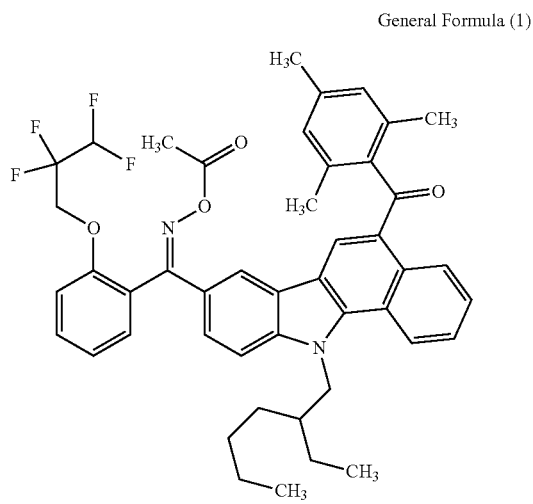

[Chemical Formula 4]

General Formula (2)

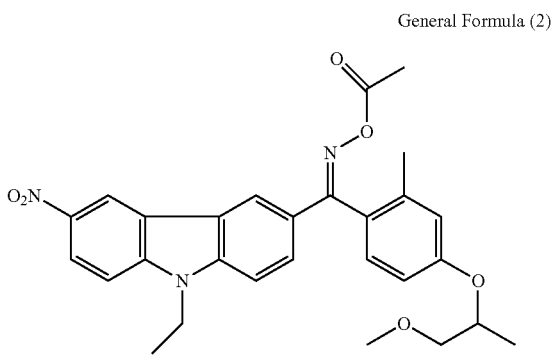

[Chemical Formula 5]

General Formula (11)

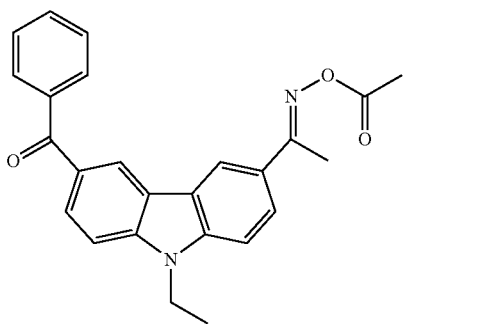

Effect of the Invention

According the present invention, it is possible to provide a polyimide with a black resin cured film that has excellent flame resistance and high opacity and allows a shape and adhesion to be sufficiently maintained with respect to a gold plating chemical liquid or a flux solder in a mounting process, and to provide a method for producing the polyimide with the black resin cured film, and to provide a flexible printed wiring board having the polyimide with the black resin cured film.

MODE FOR CARRYING OUT THE INVENTION

Figure 1:
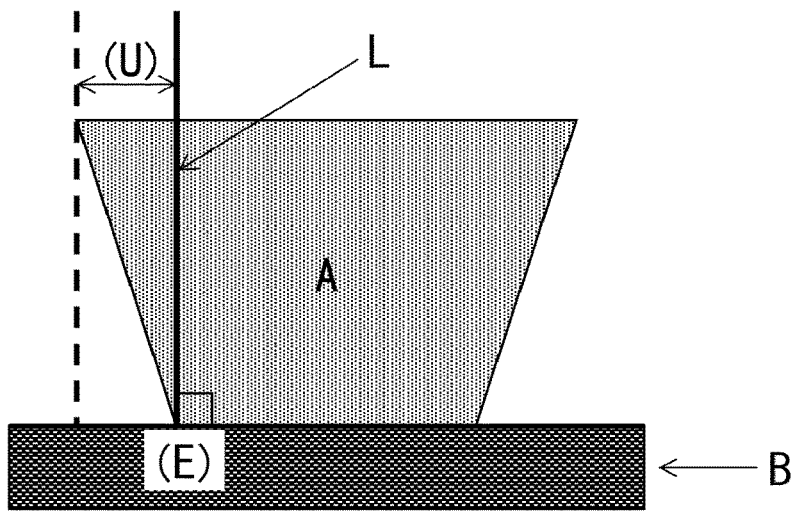
FIG. 1 is a schematic view of a cross section of a polyimide with a black resin cured film.

An embodiment of the present invention is described below. However, the present invention is not limited to this. The present invention is not limited to structures described below, and various modifications are possible within the scope of the claims. Further, embodiments and/or examples obtained by appropriately combining technical means respectively disclosed in different embodiments and/or examples are also included in the technical scope of the present invention. Further, all of scientific literature and patent documents described in the present specification are incorporated by reference in the present specification. Further, in the present specification, unless otherwise specified, "A-B" representing a numerical range means "A or more (including A and larger than A) and B or less (including B and smaller than B)."

As results of intensive studies by the present inventors, the above-described technologies of Patent Documents 1-6 are disclosed. However, in Patent Documents 1 and 2, when a film thickness was 40 μm or more, adhesion to a substrate extremely decreased, and even when a processing condition was adjusted, an undercut was large, and it was not possible to obtain processing characteristics satisfying the requirement for multilayering.

In Patent Document 3, in a case where a black colorant was added until a circuit pattern was concealed, when a film thickness was 40 μm or more, in particular, adhesion on a polyimide decreased, and even when a processing condition was adjusted, an undercut remained large.

Further, in Patent Documents 4 and 5, it was reported that, by using a photopolymerization initiator of a specific structure, even when a film thickness was about 100 μm, excellent bottom curability was obtained. However, for example, in a case such as that where a film having a thickness of 30 μm or more was formed on a polyimide having a thickness of 12.5 μm by one side coating, sufficient flame resistance was not obtained. Further, when a black colorant was added, an exposure amount required for bottom curing increased and thus, a difference relative to surface curing increased and an undercut increased.

In Patent Document 6, by adjusting an optical density using titanium black and a red pigment at the same time, it was possible to improve photosensitivity of a resist. However, when a film thickness was 20 μm or less, opacity was poor, and when an amount of a pigment was increased in order to improve opacity, an exposure amount required for bottom curing increased and thus, a difference relative to surface curing increased and, in particular, an undercut on a polyimide was increased.

More importantly, the present inventors found that, in all of Patent Documents 1-6, unless an impact force (spray impact) of a liquid developer during a development process is properly adjusted, even when a film thickness is less than 40 μm, an undercut is increased and adhesion is significantly impaired.

As described above, in all of the conventional technologies for producing a polyimide with a black resin cured film, there were problems in maintaining sufficient shape and adhesion with respect to a gold plating chemical liquid or flux solder in a mounting process, and in flame resistance and opacity. Therefore, it was still unable to obtain a polyimide with a black resin cured film that has excellent flame resistance and high opacity and allows a shape and adhesion to be sufficiently maintained with respect to a gold plating chemical liquid or a flux solder in a mounting process, and to obtain a method for producing the polyimide with the black resin cured film, and to obtain a flexible printed wiring board having the polyimide with the black resin cured film, and thus there were still unsolved problems.

The present inventors have accomplished the present invention in order to solve such problems. Specifically, the present inventors have found that it is possible to at least provide a production method for a polyimide with a black resin cured film. The production method includes a process of obtaining the black resin cured film by curing a black resin composition at a thickness of 40-70 μm on the polyimide. The process of obtaining the black resin cured film includes a process of processing the black resin composition at a spray impact of 0.10-10.0 kg/cm$^2$ of development equipment. In a cross section of the black resin cured film, when a vertical line (L) passing through a substrate-adhered edge (E) between the black resin cured film and the polyimide is drawn with respect to a surface of the polyimide, a distance (U) from an intersection point between the vertical line (L) and a top portion of the black resin cured film to an edge of the top portion is 25 μm or less. Further, it is found that, by adopting a structure of a flexible printed wiring board having the polyimide with the black resin cured film produced using the production method for the polyimide with the black resin cured film, it is possible to provide a flexible printed wiring board having the polyimide with the black resin cured film that has excellent flame resistance and high opacity and allows a shape and adhesion to be sufficiently maintained with respect to a gold plating chemical liquid or a flux solder in a mounting process.

Further, when the distance (U) is described using FIG. 1, when the vertical line (L) that is perpendicular to the surface of the polyimide (B) and that passes through the substrate-adhered edge (E) between the black resin cured film (A) and the polyimide (B) is drawn, the distance (U) is the distance from the intersection point between the vertical line (L) and the top portion of the black resin cured film (A) to the edge of the top portion. In other words, drawing the vertical line (L) that is perpendicular to the surface of the polyimide (B) and that passes through the substrate-adhered edge (E) between the black resin cured film (A) and the polyimide (B) means drawing the vertical line (L) that is perpendicular to the surface of the polyimide (B) and that passes through the substrate-adhered edge (E).

The present inventors found that the polyimide with the black resin cured film according to an embodiment of the present invention is excellent in various characteristics. This is speculated to be due to the following reasons.

For the resistance to a gold plating chemical liquid or a flux solder in a mounting process, it is important that the shape of the cured film, that is, an adhesion area of the cured film on the polyimide, is sufficiently large, and that the adhesion between the cured film and the polyimide is sufficiently large. However, in a long cured film that has high opacity and a thickness of 40-70 μm and further has a narrow line width, due to influence of light absorption, light scattering and the like of an added colorant or filler, light energy is reduced toward a bottom part, and light energy required for a reaction of an photopolymerization initiator tends to be insufficient. When a film of a black resin composition is formed on a copper foil, light transmitted through the black resin composition is reflected by a copper foil surface, and causes photocuring of the black resin composition to proceed in a vicinity of an interface between the black resin composition and the copper foil. On the other hand, when a film of a black resin composition is formed on a polyimide, since the polyimide film itself absorbs light, reflected light from the polyimide is weakened. Therefore, it becomes difficult for a photocuring reaction to proceed in a vicinity of an interface between the film of the black resin composition and the polyimide. As described above, it is found that, in particular, in the vicinity of the interface between the film and the polyimide, since a photocuring reaction is difficult to proceed, adhesion to the polyimide tends to be sufficient.

The present inventors have found that, in order to improve the adhesion of the interface with the polyimide, it is important to severely manage a condition in a development process, and, by calculating a spray impact on a development target and managing the spray impact to be within a range of 0.10-10.0 kg/cm$^2$ (not a spray pressure that is generally managed in a development process), the polyimide with the black resin cured film is obtained in which, in a cross section of the black resin cured film, as illustrated in FIG. 1, when the vertical line (L) that is perpendicular to the surface of the polyimide (B) and that passes through the substrate-adhered edge (E) between the black resin cured film (A) and the polyimide (B) is drawn, the distance (U) from the intersection point between the vertical line (L) and the top portion of the black resin cured film (A) to the edge of the top portion is 25 μm or less, and the shape and the adhesion can be sufficiently maintained with respect to a gold plating chemical liquid or a flux solder in a mounting process.

Conventionally, management is performed using a spray pressure in order to manage a development process of a photosensitive solder resist. However, in practice, there are various shapes of nozzles and various distances from nozzles to development targets, and, by changing a spray pressure, not only the pressure but also a spray angle of a liquid developer from a nozzle is changed. Therefore, it was not possible to linearly manage a spray impact (impact force) applied to a development target. In a complex photosensitive solder resist requiring highly precise developability, a magnitude of a spray impact determines a convection state of a liquid developer. Therefore, when proper management is not performed, over development and development failure occur, and, in particular, for a pressure film, photocurability is more likely to be impaired at a bottom part, and it was difficult to obtain a desired pattern shape due to a slight difference in the convection state.

Further, more excellent effects are obtained by selecting a resin, a photopolymerization initiator, a colorant and a filler added to the black resin composition, or a color tone and the like of the obtained black resin cured film.

In the following, for an embodiment of the present invention, a polyimide with a black resin cured film and a production method therefor, a composition of a black resin composition, a gold plating treatment process and a gold plating resistance test, a flux resistance test and other measurement methods are described.

[Polyimide with Black Resin Cured Film]

The polyimide with a black resin cured film according to an embodiment of the present invention is a polyimide with a black resin cured film having a black resin cured film obtained by curing a black resin composition at a thickness of 40-70 μm on the polyimide. The black resin cured film obtained by curing the black resin composition is processed at a spray impact of 0.10-10.0 kg/cm² of development equipment. A cross section of the black resin cured film is not particularly limited as long as that, as illustrated in FIG. 1, when the vertical line (L) that is perpendicular to the surface of the polyimide (B) and that passes through the substrate-adhered edge (E) between the black resin cured film (A) and the polyimide (B) is drawn, the distance (U) from the intersection point between the vertical line (L) and the top portion of the black resin cured film (A) to the edge of the top portion is 25 μm or less. In the present specification, "polyimide" and "polyimide film" are used interchangeably.

The polyimide according to an embodiment of the present invention is not particularly limited as long as the polyimide has an imide skeleton that is generally obtained by causing an acid anhydride and a diamine to react with each other. However, examples of the polyimide include thermosetting polyimides such as a condensation polymer of an aromatic diamine and an aromatic tetracarboxylic acid, a bismaleimide resin that is an addition polymer of an aromatic diamine and bismaleimide, a polyaminobismaleimide resin that is an addition polymer of aminobenzoic acid hydrazide and bismaleimide, and a bismaleimide triazine resin composed of a dicyanate compound and a bismaleimide resin. More specifically, examples of the polyimide include: polyimide films manufactured by Kaneka Corporation including Apical 12.5 AH, Apical 25NPI, Apical 25NPI, Apical 50NPI, PIXEO BP, and PIXEO BP-S; polyimide films manufactured by Toray Du Pont Corporation including Kapton 40EN, Kapton 50EN, 80EN, 100EN, 150EN, 200EN, Kapton H, Kapton V, and Kapton EN-S; polyimide films manufactured by Ube Industries, Ltd. including Upilex 12.5S, Upilex 7.5S, Upilex 12.5CA, Upilex 8CA, and Upilex VT; polyimides manufactured by Timerid Technology including TH-012, TH-025, TH-050, TH-075, and TL-012; and the like.

Further, as the polyimide in an embodiment of the present invention, a polyimide present in a circuit board used in a flexible printed wiring board can also be used. Such a polyimide present in a circuit board can be manufactured, for example, using a copper-clad laminated plate obtained by bonding a polyimide film described above and a copper foil to each other. For bonding the polyimide film and the copper foil to each other, it is possible to select a method in which an adhesive is used or a method in which an adhesive is not used. for a method in which an adhesive is not used, a casting method, a lamination method or a metallization method can be selected. Thereafter, when necessary, by performing circuit formation using a subtract method (for example, a method in which circuit formation is performed by performing a via hole processing process, a desmear treatment process, a via plating process, an etching resist formation process, an etching process and a resist removal process in this order), a polyimide portion in a circuit board can be formed.

Further, as a method for producing a polyimide portion in a circuit board using another method for producing a circuit board according to an embodiment of the present invention, a semi-additive method (a method in which a seed layer of nickel chromium or the like is provided on a base film such as a polyimide film and electrolytic copper plating is performed after providing a sputtered layer of copper; thereafter, circuit formation is performed by performing an etching resist formation process, an exposure process, a development process, a copper plating process and a plating resist removal process in this order) can also be selected. Thereafter, the circuit board can also be used after being subjected to a roughening treatment.

Further, examples of roughening methods for the circuit board include physical polishing such as buffing, scrubbing or grinder polishing, chemical polishing using a microetching agent, and the like. In particular, micro etching is preferred for processing a substrate having a fine pattern. As a microetching agent, an etching agent containing sulfuric acid and hydrogen peroxide as main components, an etching agent containing iron (III) chloride or iron (III) sulfate as a main component, or an organic acid-based etchant, or the like can be used. Examples of such a microetching agent include MEC Etch Bond STZ-3100, STL-3300, CZ-8100, CZ-8101, MEC V Bond BO-7780V, BO-7790V, MEC Bright CB-5004, CB-5530, SF-5420, CA-91Y, CB-801Y, CB-5602AY and the like, manufactured by MEC Corporation.

Further, the copper foil of the circuit board may have a rust preventive layer and/or an organic or inorganic primer layer. Further, those having effects of a rust preventive layer and a primer layer at the same time are also included. Examples of such rust preventive agent and primer treatment agent include MEC Etch Bond CL-8300, CL-8301, MEC Bright CAU-5232C and the like manufactured by MEC Corporation. Examples of methods of rust preventive treatment and primer treatment include a method of immersing the circuit board in a chemical solution, a method of spraying with a spray, and the like. Further, a surface treatment may be performed so as to improve an adhesion imparting property of the black resin cured film using a silane coupling agent or the like.

From a point of view of ensuring sufficient connection reliability after a component is mounted to a flexible printed wiring board using the black resin cured film and preventing a mounting defect of the component due to a solder outflow, a thickness of the black resin cured film is preferably 40-70 μm, more preferably 45-65 μm, and even more preferably 50-60 μm.

From a point of view that sufficient adhesion between the black resin cured film and a substrate is ensured and that the black resin cured film functions as a solder dam capable of withstanding an external stress generated in a processing process and chemical changes caused by processing liquids such as a chemical liquid and solder, the distance (U) is preferably 25 μm or less, more preferably 20 μm or less, even more preferably 15 μm or less, and particularly preferably 10 μm or less.

Further, a line width (w) and a line length (W) of the black resin cured film obtained by curing a black resin composition of the polyimide with the black resin cured film is not particularly limited. From a point of view of producing a flexible substrate (FPC) on which components are mounted at a higher density, the line width (w) is preferably 100 μm or less, more preferably 75 μm or less, and even more preferably 50 μm or less. From a point of view of ensuring sufficient connection reliability between a component or another circuit board and the flexible printed wiring board using the black resin cured film, the line length (W) is preferably 500 μm or more, more preferably 1000 μm or more, even more preferably 1,500 μm or more, and particularly preferably 2000 μm or more.

Figure 2:
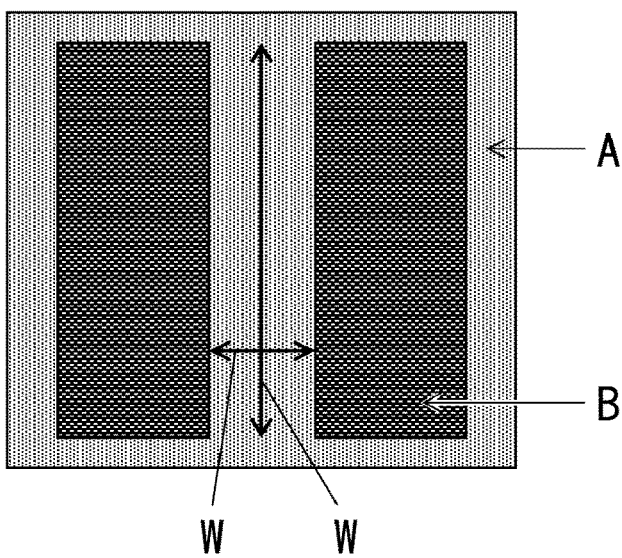
FIG. 2 is a schematic view of the polyimide with a black resin cured film observed from a surface thereof.

The line width (w) and the line length (W) in this specification are described with reference to FIG. 2. In FIG. 2, "A" is a black resin cured film, and "B" is a polyimide. As illustrated in FIG. 2, the line width (w) is a distance of the black resin cured film (A) between polyimides (B); and the line length (W) is a distance of a region of the black resin cured film (A) sandwiched by polyimides (B) in a direction perpendicular to the line width.

[Spray Impact]

A theoretical value of the spray impact of the development equipment for producing the black resin cured film according to an embodiment of the present invention can be calculated using the following formula as a momentum of an object per unit time.

Theoretical spray impact (I) of an injection port of the development equipment=$0.024 \times Q \times \sqrt{P}$, where I: spray impact ($kg/cm^2$), Q: flow rate (L/s) of a liquid developer, and P: spray pressure (MPa).

Further, since a spray impact on a development target varies depending on a shape of an injection nozzle, it is necessary to derive a theoretical value by multiplying a reduction rate, which is obtained by dividing an injection nozzle opening area by an injection area obtained from an injection distance and an injection angle from an injection port to the development target, by the theoretical spray impact of the injection port. Further, as another method for measuring the spray impact, it is also possible to install an integrated pressure gauge or the like on a development target to perform direct measurement.

The spray impact of the development equipment for producing the black resin cured film according to an embodiment of the present invention is 0.10-10.0 $kg/cm^2$, preferably 0.50-7.0 $kg/cm^2$, and more preferably 0.50-5.0 $kg/cm^2$. When the spray impact is below this range, developability of the black resin composition decreases and problems occur such as that residues are generated on a surface of a substrate. When the spray impact is above this range, an undercut of the black resin cured film obtained by curing the black resin composition becomes large, and adhesion cannot be maintained and peeling occurs during development.

[Black Resin Composition]

The black resin composition according to an embodiment of the present invention is not particularly limited as long as the black resin composition, when applied at a thickness of 40-70 μm on a polyimide and processed at a spray impact of 0.10-10.0 $kg/cm^2$ of the development equipment, allows a black resin cured film to be obtained such that, as illustrated in FIG. 1, when the vertical line (L) that is perpendicular to the surface of the polyimide (B) and that passes through the substrate-adhered edge (E) between the black resin cured film (A) and the polyimide (B) is drawn, the distance (U) from the intersection point between the vertical line (L) and the top portion of the black resin cured film (A) to the edge of the top portion is 25 μm or less.

Further, the black resin composition preferably contains at least (a) a carboxyl group-containing resin, (b) a photopolymerization initiator, and (c) a colorant.

More preferably, an embodiment of the present invention is a black resin composition that, in addition to the at least components (a)-(c), includes (d) organic fine particles, and (e) a phosphinate compound. (a) The carboxyl group-containing photosensitive resin is a carboxyl group-containing photosensitive resin having one or more partial structures selected from a bisphenol A structure, a bisphenol F structure, a biphenol structure, a biphenol novolac structure, a bisxylenol structure, a biphenyl novolac structure and a urethane structure. (b) The photopolymerization initiator is a photopolymerization initiator having a structure represented by a general formula (1) or a general formula (2) to be described later, or is a photopolymerization initiator obtained by combining a photopolymerization initiator having a structure represented by the general formula (1) and a photopolymerization initiator having a structure represented by the general formula (2). (c) The colorant contains at least a perylene-based colorant and/or a phthalocyanine-based colorant. When a coating film obtained by curing the black resin composition has a thickness of 20 μm, a blackness (L*) value is 10-30.

Further, in the black resin composition according to an embodiment of the present invention, with respect to a solid content including all components, it is preferable that a total amount of carboxyl groups and hydroxyl groups is managed to 0.05-3.00 mol/kg and a total amount of unsaturated double bond groups is managed to 0.20-4.00 mol/kg.

In the following, various components are described in detail.

[(a) Carboxyl Group-Containing Photosensitive Resin]

(a) The carboxyl group-containing resin is not particularly limited as long as the carboxyl group-containing resin is a compound that contains at least one carboxyl group in a structure thereof and in which a chemical bond is formed by a radical generated by light or heat. From a point of view of insulation performance, heat resistance, flexibility, and crack resistance, (a) the carboxyl group-containing photosensitive resin preferably has one or more partial structures selected from a bisphenol A structure, a bisphenol F structure, a biphenol structure, a biphenol novolac structure, a bisoxylenol structure, a biphenyl novolac structure and a urethane structure. Further, from a point of view that it is easy to arbitrarily control viscosity and a thixotropic index and that developability and photosensitivity are imparted, (a) the carboxyl group-containing photosensitive resin preferably is soluble with respect to an organic solvent, is a compound formed by a polymerization reaction of two or more monomers, and is a polymer having a molecular weight of 1,000 or more and 1,000,000 or less. Among those, (a) the carboxyl group-containing photosensitive resin more preferably is a compound in which a chemical bond is formed by a photopolymerization initiator, and is a compound having at least one unsaturated double bond in a molecule thereof. Further, the unsaturated double bond preferably is an acrylic group ($CH_2=CH$— group), a methacryloyl group ($CH_2=C(CH_3)$- group) or a vinyl group (—CH=CH— group).

(a) The carboxyl group-containing photosensitive resin according an embodiment of the present invention is not particularly limited as long as (a) the carboxyl group-containing photosensitive resin has the above-described characteristics. However, examples of (a) the carboxyl group-containing photosensitive resin include acid-modified acrylic (methacrylic) resins obtained by modifying various epoxy resins of a bisphenol A type, a bisphenol F type, a phenol novolac type, a cresol novolac type and the like with a monocarboxylic acid containing an unsaturated group and then acid-modifying with a polybasic acid anhydride containing a saturated or unsaturated group, a urethane-modified acrylic (methacrylic) resin obtained by a reaction of a hydroxyl group-containing acrylic (methacrylic) resin and an isocyanate compound, a polyester-modified acrylic (methacrylic) resin obtained by a reaction of a hydroxyl group-containing acrylic (methacrylic) resin and a carboxyl group-containing compound, and the like.

It is possible to use one kind of (a) a carboxyl group-containing photosensitive resin. However, using two or more kinds of (a) carboxyl group-containing photosensitive resins in combination is preferable in improving heat resistance of an insulating film (black resin cured film) after photocuring.

The organic solvent is not particularly limited. However, examples of the organic solvent include sulfoxide-based solvents such as dimethyl sulfoxide and diethyl sulfoxide, formamide-based solvents such as N,N-dimethylformamide and N,N-diethylformamide, acetamide-based solvents such as N,N-dimethylacetamide and N,N-diethylacetamide, pyrrolidone-based solvents such as N-methyl-2-pyrrolidone and N-vinyl-2-pyrrolidone, or hexamethylphosphoramide, γ-butyrolactone and the like. Further, when necessary, these organic polar solvents and aromatic hydrocarbons such as xylene or toluene may be used in combination.

Further, the examples of the organic solvent include solvents of symmetrical glycol diethers such as methyl monoglyme (1,2-dimethoxyethane), methyl diglyme (bis(2-methoxyether) ether), methyl triglyme (1,2-bis(2-methoxyethoxy) ethane), methyl tetraglyme (bis [2-(2-methoxyethoxyethyl)]ether), ethyl monoglyme (1,2-diethoxyethane), ethyl diglyme (bis(2-ethoxyethyl) ether), and butyl diglyme (bis(2-butoxyethyl) ether); acetates such as methyl acetate, ethyl acetate, isopropyl acetate, n-propyl acetate, butyl acetate, propylene glycol monomethyl ether acetate, ethylene glycol monobutyl ether acetate, diethylene glycol monoethyl ether acetate (also known as carbitol acetate, 2-(2-butoxyethoxy)ethyl acetate)), diethylene glycol monobutyl ether acetate, 3-methoxybutyl acetate, ethylene glycol monomethyl ether acetate, ethylene glycol monoethyl ether acetate, dipropylene glycol methyl ether acetate, propylene glycol diacetate, and 1,3-butylene glycol diacetate; and ethers such as dipropylene glycol methyl ether, tTripropylene glycol methyl ether, propylene glycol n-propyl ether, dipropylene glycol n-propyl ether, propylene glycol n-butyl ether, dipropylene glycol n-butyl ether, tripropylene glycol n-propyl ether, propylene glycol phenyl ether, dipropylene glycol dimethyl ether, 1,3-dioxolane, ethylene glycol monobutyl ether, diethylene glycol monoethyl ether, diethylene glycol monobutyl ether, and ethylene glycol monoethyl ether.

Organic solvent solubility, which is an indicator of solubility with respect to an organic solvent, can be measured as an amount in parts by weight of a resin dissolved with respect to 100 parts by weight of an organic solvent. When the amount in parts by weight of the resin dissolved with respect to 100 parts by weight of an organic solvent is 5 parts by weight or more, it can be determined that the resin is soluble with respect to the organic solvent. An organic solvent solubility measurement method is not particularly limited. However, for example, measurement can be performed using a method in which 5 parts by weight of a resin is added with respect to 100 parts by weight of an organic solvent, and, after being stirred at 40° C. for one hour, the solution is cooled to room temperature and is left alone for 24 hours or more, and whether or not the solution is uniform without occurrence of insolubles and precipitates is confirmed.

A weight average molecular weight of (a) the carboxyl group-containing photosensitive resin according to an embodiment of the present invention is preferably 1,000 or more and 1,000,000 or less, more preferably 1,500 or more and 100,000 or less, even more preferably 2,000 or more and 50,000 or less, and particularly preferably 3,000 or more and 25,000 or less. The weight average molecular weight can be measured using, for example, the following method.

(Weight Average Molecular Weight Measurement)
Equipment used: Tosoh HLC-8220 GPC equivalent
Columns: Tosoh TSK gel Super AWM-H (6.0 mmI.D.×15 cm)×2
Guard column: Tosoh TSK guard column Super AW-H
Eluent: 30 mM LiBr+20 mM H3PO4 in DMF
Flow rate: 0.6 mL/min
Column temperature: 40° C.
Detection condition: RI: polarity (+), response (0.5 sec)
Sample concentration: about 5 mg/mL
Standard product: PEG (polyethylene glycol).

Controlling the weight average molecular weight to the above range allows the obtained black resin cured film to have excellent flexibility and chemical resistance, and thus is preferable. When the weight average molecular weight is 1,000 or less, flexibility and chemical resistance may deteriorate, and when the weight average molecular weight is 1,000,000 or more, viscosity of a resin composition may increase.

Examples of the polymerization reaction include chain polymerization, sequential polymerization, living polymerization, addition polymerization, polycondensation, addition condensation, radical polymerization, ionic polymerization, cationic polymerization, anionic polymerization, coordination polymerization, ring opening polymerization, copolymerization and the like.

That (a) the carboxyl group-containing photosensitive resin in an embodiment of the present invention is blended such that an amount of (a) the carboxyl group-containing photosensitive resin is 10-70 parts by weight with respect to a total of 100 parts by weight of the components (a), (b) and (c) and other components is preferable in improving photosensitivity of the resin composition and adhesion with the polyimide.

When the amount of (a) the carboxyl group-containing resin is less than the above range, alkali resistance of the black resin cured film may decrease and it may be difficult to add contrast during exposure and development. Further, when the amount of (a) the carboxyl group-containing resin is more than the above range, since stickiness of a coating film obtained by applying the resin composition onto a substrate and drying the solvent is increased, productivity is reduced, and further, since a cross-link density becomes too high, the black resin cured film may become brittle and fragile. By setting the amount of (a) the carboxyl group-containing resin to the above range, it is possible to set a resolution during exposure and development to an optimum range.

[(b) Photopolymerization Initiator]

(b) The photopolymerization initiator in an embodiment of the present invention is a compound that is activated by energies at specific wavelengths such as UV light, laser light and LED light or combinations of energies, and initiates and promotes a reaction of a radical polymerizable group.

The component (b) according to an embodiment of the present invention is not particularly limited as long as the component (b) is a compound having the above characteristics. However, examples of the component (b) include Michler's ketone, 4,4'-bis(diethylamino)benzophenone, 4,4',4"-tris(dimethylamino)triphenylmethane, 2,2'-bis(2-chlorophenyl)-4,4',5,5'-tetraphenyl-1,2'-diimidazole, acetophenone, benzoin, 2-methylbenzoin, benzoin methyl ether, benzoin ethyl ether, benzoin isopropyl ether, benzoin isobutyl ether, 2-t-butyl anthraquinone, 1,2-benzo-9,10-anthraquinone, methyl anthraquinone, thioxanthone, 2,4-diethylthioxanthone, 2-isopropyl thioxanthone, 1-hydroxycyclohexyl phenyl ketone, diacetylbenzyl, benzyl dimethyl ketal, benzyl diethyl ketal, 2 (2'-furylethylidene)-4,6-bis(trichloromethyl)-S-triazine, 2[2'(5"-methylfuryl)ethylidene]-4,6-bis(trichloromethyl)-S-triazine, 2 (p-methoxyphenyl)-4,6-bis(trichloromethyl)-S-triazine, 2,6-di(p-azidobenzal)-4-methylcyclohexanone, 4,4'-diazidochalcone, di(tetraalkylammonium)-4,4'-diazidostilbene-2,2'-disulfonate, 2,2-dimethoxy-1,2-diphenylethan-1-one, 1-hydroxy-cyclohexyl-phenyl-ketone, 2-hydroxy-2-methyl-1-phenyl-propan-1-one, 1-[4-(2-hydroxyethoxy)-phenyl]-2-hydroxy-2-methyl-1-propan-1-one, 2-methyl-1-[4-(methylthio)phenyl]-2-morpholinopropan-1-one, 2-benzyl-2-dimethylamino-1-(4-morpholinophenyl)-butane-1, bis(2,4,6-trimethylbenzoyl)-phenylphosphine oxide, bis(2,6-dimethoxybenzoyl)-2,4,4-trimethyl-pentylphosphine oxide, 2,4,6-trimethylbenzoyl-diphenyl-phosphine oxide, 2-hydroxy-2-methyl-1-phenyl-propane-1-ketone, bis(n5-2,4-cyclopentadiene-1-yl)-bis(2,6-difluoro-3-(1H-pyrrol-1-yl)-phenyl) titanium, 1,2-octanedione, 1-[4-(phenylthio)-, 2-(O-benzoyloxime)], iodonium, (4-methylphenyl) [4-(2-methylpropyl)phenyl]-hexafluorophosphate (1-), ethyl-4-dimethylaminobenzoate, 2-ethylhexyl-4-dimethylaminobenzoate, ethanone, 1-[9-ethyl-6-(2-methylbenzoyl)-9H-carbazol-3-yl]-, 1-(O-acetyloxyium), 9H-thioxanthene-2-carboxaldehyde 9-oxo-2-(0-acetyloxime), and the like. It is desirable to appropriately select the component (b), and it is desirable to use one or more kinds of the compounds in combination.

It is preferable that the component (b) according to an embodiment of the present invention is blended such that an amount of the component (b) is 0.1-20 parts by weight with respect to 100 parts by weight of the component (a) and a component containing at least one or more acrylic group (CH2=CH— group), methacryloyl group (CH=C(CH3)-group) or vinyl group (—CH=CH— group) in a molecule thereof, and it is more preferable that the amount of the component (b) is 0.2-10 parts by weight. Setting the above blending ratio allows photosensitivity of the black resin composition to be improved, and thus is preferable. When the amount of the component (b) is less than the above range, a reaction of a radical polymerizable group during light irradiation hardly occurs and curing may often become insufficient. Further, when the amount of component (b) is more than the above range, it becomes difficult to adjust a light irradiation amount and an over-exposure state may occur. Therefore, in order to allow a photocuring reaction to efficiently proceed, it is preferable to adjust the amount of component (b) to the above range.

(b) The photopolymerization initiator in an embodiment of the present invention preferably is an α-aminoacetophenone-based photopolymerization initiator such as 2-methyl-1-[4-(methylthio)phenyl]-2-morpholinopropanone-1,2-benzyl-2-dimethylamino-1-(4-morpholinophenyl), 2-(dimethylamino)-2-[(4-methylphenyl)methyl]-1-[4-(4-morpholinyl)phenyl]-1-butanone, or N,N-dimethylaminoacetophenone, an oxime ester-based photopolymerization initiator such as 1,2-octanedione, 1-[4-(phenylthio)-, 2-(O-benzoyloxime)], iodonium, (4-methylphenyl) [4-(2-methylpropyl)phenyl]-hexafluorophosphate (1-), ethyl-4-dimethylaminobenzoate, 2-ethylhexyl-4-dimethylaminobenzoate, ethanone, 1-[9-ethyl-6-(2-methylbenzoyl)-9H-carbazol-3-yl]-, 1-(0-acetyloxyium), or 9H-thioxanthene-2-carboxaldehyde 9-oxo-2-(O-acetyloxime), a titanocene-based photopolymerization initiator such as 2,4,6-trimethylbenzoyl-diphenyl-phosphine oxide, 2-hydroxy-2-methyl-1-phenyl-propane-1-ketone, or bis(n5-2,4-cyclopentadiene-1-yl)-bis(2,6-difluoro-3-(1H-pyrrol-1-yl)-phenyl) titanium. Further, a photopolymerization initiator having a structure represented by the following general formula (1) or (2), or a photopolymerization initiator obtained by combining these, allows a photocuring reaction to efficiently proceed and thus is particularly preferable. Or, a photopolymerization initiator obtained by combining a photopolymerization initiator having a structure represented by the following general formula (2) and a photopolymerization initiator having a structure represented by the following general formula (11) may also be used. A photopolymerization initiator having a structure represented by the general formula (1), (2) or (11) is an oxime ester-based polymerization initiator. Examples of such (b) photopolymerization initiator include an oxime ester-based photopolymerization initiator manufactured by BASF Corporation under a trade name IrgacureOXE-03, and oxime ester-based photopolymerization initiators manufactured by ADEKA Corporation under trade names NCI-831, NCI-831E, and the like.

[Chemical Formula 6]

General Formula (1)

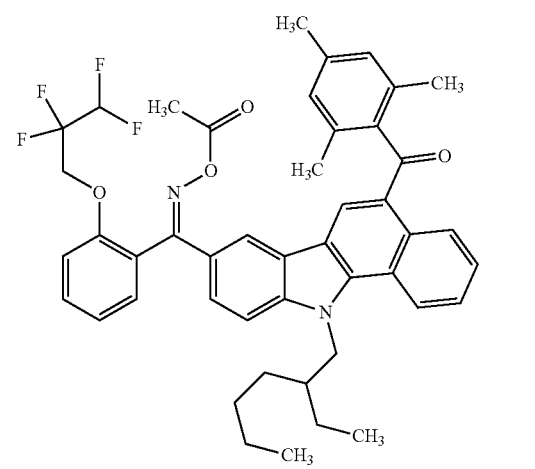

[Chemical Formula 7]

General Formula (2)

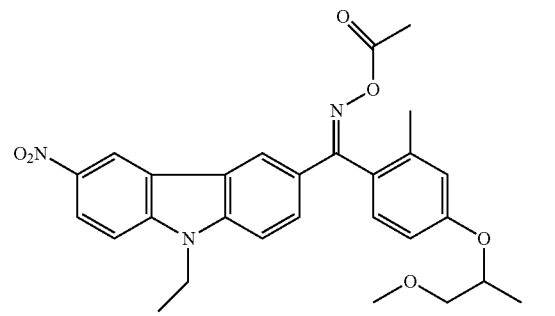

-continued

[Chemical Formula 8]

General Formula (11)

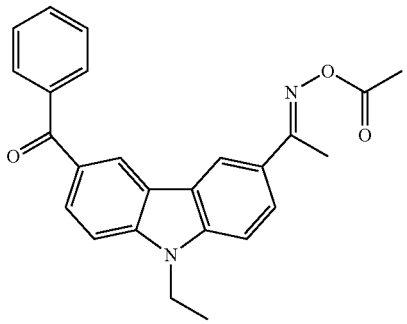

Further, that a relation between an additive amount (X) of the oxime ester-based photopolymerization initiator having a structure represented by the general formula (1) or the general formula (11) and an additive amount (Y) of the oxime ester-based photopolymerization initiator having a structure represented by the general formula (2) is X:Y=0.1: 0.9-0.9:0.1 is preferable from a point of view that an undercut due to an insufficient photocuring reaction at a bottom of the black resin cured film is reduced while an excessive photocuring reaction on a surface of the black resin cured film is suppressed.

It is more preferable that (b) the photopolymerization initiator contains an α-aminoacetophenone-based photopolymerization initiator. Examples of such an α-aminoacetophenone-based photopolymerization initiator include 2-methyl-1-[4-(methylthio)phenyl]-2-morpholinopropanone-1,2-benzyl-2-dimethylamino-1-(4-morpholinophenyl), 2-(dimethylamino)-2-[(4-methylphenyl)methyl]-1-[4-(4-morpholinyl)phenyl]-1-butanone, N,N-dimethylaminoacetophenone, and the like. As commercially available products, Irgacure907, Irgacure369, Irgacure379 and the like manufactured by BASF Corporation can be used. By containing an α-aminoacetophenone-based photopolymerization initiator, a wide range of incident light can be effectively utilized for a photocuring reaction and thus there is an advantage that a desired photocuring reaction can be completed in a shorter time.

[(c) Colorant]

(c) The colorant according to an embodiment of the present invention is not limited as long as the colorant is either a dye or a pigment and can blacken the black resin composition according to an embodiment of the present invention. Further, multiple organic colorants may be combined. As a combination of organic colorants, a blue colorant, a red colorant, a yellow colorant, an orange colorant, and a purple colorant can be arbitrarily combined. In the following, specific examples are illustrated with color index numbers.

(Blue Colorant)

A blue colorant according to an embodiment of the present invention is not particularly limited. However, examples of the blue colorant include C. I. Pigment Blue 15, 15:1, 15:2, 15:3, 15:4, 15:6, 16, and 60, which are pigments based on phthalocyanine, anthraquinone, dioxazine and the like, and Solvent Blue 35, 63, 68, 70, 83, 87, 94, 97, 122, 136, 67, and 70, which are dyes. In addition to the above, metal-substituted or unsubstituted phthalocyanine compounds can also be used. In particular, a copper phthalocyanine-based compound is preferable from a point of view of coloring power.

(Red Colorant)

A red colorant according to an embodiment of the present invention is not particularly limited. However, examples of the red colorant include C. I. C. I. Pigment Red 122, 149, 166, 177, 179, 242, 224, 254, 264, and 272.

(Yellow Colorant)

A yellow colorant according to an embodiment of the present invention is not particularly limited. However, examples of the yellow colorant include C. I. Pigment Yellow 83, 110, 128, 138, 139, 150, 151, 154, 155, 180, and 181.

(Orange Colorant)

An orange colorant according to an embodiment of the present invention is not particularly limited. However, examples of the orange colorant include C. I. Pigment Orange 5, 13, 14, 16, 17, 24, 34, 36, 38, 40, 43, 46, 49, 51, 55, 59, 61, 63, 64, 71, and 73.

(Purple Colorant)

A purple colorant according to an embodiment of the present invention is not particularly limited. However, examples of the purple colorant include C. I. Pigment Violet 19, 23, 29, 30, 32, 36, 37, 38, 39, 40, and 50, and Solvent Violet 13, and 36.

A combination of colorants for blackening the black resin composition according to an embodiment of the present invention is not particularly limited. However, in the following, specific examples are described. Ratios described below represent weight ratios.

With respect 1.0 of the blue colorant, the orange colorant is combined at a ratio of 1.5-3.0.

With respect 1.0 of the blue colorant, the red colorant is combined at a ratio of 1.2-3.0. With respect 1.0 of the blue colorant, the purple colorant is combined at a ratio of 1.2-3.0.

With respect 1.0 of the blue colorant, the yellow colorant is combined at a ratio of 1.5-4, and the orange colorant is combined at a ratio of 1.0-2.5.

With respect 1.0 of the blue colorant, the red colorant is combined at a ratio of 1.0-2.0, and the yellow colorant is combined at a ratio of 1.5-3.0.

With respect 1.0 of the blue colorant, the yellow colorant is combined at a ratio of 1.0-3.0, and the purple colorant is combined at a ratio of 1-2.0.

With respect 1.0 of the blue colorant, the orange colorant is combined at a ratio of 0.5-2.0, and the purple colorant is combined at a ratio of 0.5-2.0.

In particular, the combination of the blue colorant, the orange colorant and the purple colorant allows the blackness (L*) and a colorant amount to be controlled, and thus is preferable.

Particularly preferably, that (c) the colorant preferably contains at least a perylene-based colorant and/or a phthalocyanine-based colorant is preferable from a point of view of both ensuring opacity and maintaining a pattern shape.

A content of (c) the colorant in the black resin composition according to an embodiment of the present invention is not particularly limited as long as the blackness (L*) value is in a range of 10-30 when a coating film of the black resin composition has a thickness of 20 μm in order to obtain a black resin cured film that has an excellent pattern shape while ensuring sufficient opacity. However, the content of (c) the colorant, with respect to 100 parts by weight of the components (a)-(e) and other components, is preferably 3-10 parts by weight, and more preferably 5-7 parts by weight. When the amount of the colorant is less than 3 parts by weight, the blackness (L*) increases and opacity tends to be impaired. Further, when the amount of the colorant is more than 10 parts by weight, the blackness (L*) decreases and a thixotropic index increases, and thus, there is a tendency that clogging during ink filtration and deterioration during printing may occur, and further, decline in resolution may occur.

The blackness (L*) value of the black resin composition according to an embodiment of the present invention is preferably 10-30, more preferably 13-27, and even more preferably 15-26. By setting the blackness (L*) value to the above range, it is possible to both ensure opacity of the obtained black resin composition and maintain a pattern shape.

Here, a method for measuring blackness of a resin composition is not particularly limited. However, for example, the blackness can be obtained using the following measurement method. Values of an L*a*b* color system were measured according to JIS Z 8729 using a handy type color difference meter NR-11 B manufactured by Nippon Denshoku Industries Corporation. Here, an L* value, which is an index representing brightness, was evaluated as an indicator of the blackness. A smaller L* value means a better blackness.

[(d) Organic Fine Particles]

From a point of view of adhesion between the black resin cured film and a substrate, flexibility of the black resin cured film, suppressing an outflow when the black resin composition is printed on a substrate, and suppressing warping or cracking of the black resin cured film due to that a stress generated in an FPC is relaxed, it is preferable that the black resin composition according to an embodiment of the present invention contains (d) the organic fine particles.

(d) The organic fine particles according to an embodiment of the present invention are particles of a compound containing carbon, and are spherical polymer particles, including also elliptical particles, having an average particle size of 0.05-20 μm.

The average particle size of the component (d) according to an embodiment of the present invention can be measured, for example, as a volume-based median diameter (particle size corresponding to 50% of a cumulative distribution value) using the following method.

(Average Particle Size Measurement)

Apparatus: LA-950V2 equivalent manufactured by Horiba Ltd.

Measurement method: laser diffraction/scattering.

The average particle size of (d) the organic fine particles is preferably 0.05-15 μm, more preferably 0.05-15 μm, and even more preferably 0.10-5 μm. Controlling the average particle size to the above range allows the obtained black resin cured film to have excellent flexibility and chemical resistance, and thus is preferable. When the average particle size is less than 0.05 μm, unevenness is not effectively formed on a surface of the black resin cured film, and the black resin cured film may be poor in a tack free property. When the average particle size is 20 μm or more, folding endurance may deteriorate, and particles may be exposed in an opening part during formation of a fine pattern, resulting in a poor resolution. The component (d) according to an embodiment of the present invention is not particularly limited. However, examples of the component (d) include: polymethyl methacrylate-based spherical organic beads manufactured by Ganz Chemical Co., Ltd. under product names Ganz Pearl GM-0600 and GM-0600 W; cross-linked polymethyl methacrylate-based spherical organic beads manufactured by Ganz Chemical Co., Ltd. under product names Ganz Pearl GM-0801S, GM-0807S, GM-1001-S, GM-1007S, GM-1505S-S, GMX-0610, GMX-0810, GMP-0800, GMDM-050M, GMDM-080M, GMDM-100M and GMDM-150M, and manufactured by Sekisui Plastics Co., Ltd. under product names Techpolymer MBX-5, MBX-8, and MBX-12; cross-linked polybutylmethacrylate-based spherical organic beads manufactured by Ganz Chemical Co., Ltd. under product names Ganz Pearl GB-05S, GB-08S, GB-10S and GB-15S, and manufactured by Sekisui Plastics Co., Ltd. under product names Techpolymer BM30X-5 and BM30X-8; cross-linked acrylic spherical organic beads manufactured by Ganz Chemical Co., Ltd. under a product name Ganz Pearl GMP-0820; acrylic copolymer-based spherical organic beads manufactured by Ganz Chemical Co., Ltd. under a product name Ganz Pearl GBM-55COS; cross-linked styrene-based spherical organic beads manufactured by Ganz Chemical Co., Ltd. under product names Ganz Pearl GS-0605 and GS-1105, and manufactured by Sekisui Plastics Co., Ltd. under product names Techpolymer SBX-6 and SBX-8; cross-linked polyacrylic acid ester-based organic beads manufactured by Sekisui Plastics Co., Ltd. under product names Techpolymer ABX-8, AF10X-8, AFX-15 and ARX-15; nylon-based spherical organic beads manufactured by Ganz Chemical Co., Ltd. under a product name Ganz Pearl GPA-550; silicone-based spherical organic beads manufactured by Ganz Chemical Co., Ltd. under product names Ganz Pearl SI-020, SI-030 and SI-045; cross-linked silicone-based spherical organic beads manufactured by Ganz Chemical Co., Ltd. under a product name Ganz Pearl SIG-070; cross-linked urethane-based spherical organic beads manufactured by Dainichiseika Color & Chemicals Mfg. Co., Ltd. under product names Dimic Beads UCN-8070CM Clear, UCN-8150CM Clear, UCN-5070D Clear, and UCN-5150D Clear, and manufactured by Negami Kogyo Co., Ltd. under product names Art Pearl C-100 transparent, C-200 transparent, C-300 transparent, C-300WA, C-400 transparent, C-400WA, C-600 transparent, C-800 transparent, C-800 WA, P-400T, P-800T, U-600T, CF-600T, JB-400T, JB-800T, CE-400T and CE-800T; and the like. These can each be used alone or two or more of these can be used in combination.

Among the above-described spherical organic beads, particularly, using the cross-linked spherical organic beads containing a urethane bond in a molecule thereof as the component (d) of an embodiment of the present invention reduces warpage of the black resin cured film, improves flexibility to withstand repetitive folding, and improves adhesion between the black resin cured film and the polyimide, and thus is preferable.

A blending amount of the component (d) according to an embodiment of the present invention with respect to 100 parts by weight of components other than the component (d) is preferably 30-100 parts by weight, and more preferably 40-80 parts by weight, and thereby, it is possible to effectively form unevenness on a surface of the obtained black resin cured film, and the black resin cured film can have an excellent tack free property, and filling curing due to the component (d) is obtained. Therefore, warpage of the black resin cured film is reduced, and, due to a stress relaxation effect and improvement in fracture toughness, flexibility to withstand repetitive folding is improved. When the blending amount of the component (d) is less than 30 parts by weight, the black resin cured film may be poor in a tack-free property and in flexibility to withstand repetitive folding. When the blending amount of the component (d) exceeds 100 parts by weight, flame resistance and coatability when a resin composition solution is applied may deteriorate, and appearance defects due to foaming of a coating film during coating or due to lack of leveling may occur.

[(e) Phosphinate Compound]

From a point of view of improving flame resistance of the black resin cured film and improving coatability when the black resin composition is printed on a substrate, the black resin composition according to an embodiment of the present invention preferably contains (e) a phosphinate compound. The phosphinate according to an embodiment of the present invention is a compound represented by the following general formula (10).

[Chemical Formula 9]

General Formula (10)

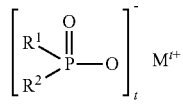

(where $R^1$ and $R^2$ each independently represent a linear or branched alkyl or aryl group having 1-6 carbon atoms; M represents a metal selected from at least one of a group consisting of Mg, Ca, Al, Sb, Sn, Ge, Ti, Fe, Zr, Zn, Ce, Bi, Sr, Mn, Li, Na and K; and t is an integer of 1-4).

The phosphinate according to an embodiment of the present invention is not particularly limited as long as the phosphinate has the above structure. However, examples of the phosphinate include aluminum tris diethylphosphinate, aluminum trismethyl ethylphosphinate, aluminum tris diphenyl phosphinate, zinc bisdiethylphosphinate, zinc bismethylethylphosphinate, zinc bisdiphenylphosphinate, titanyl bisdiethylphosphinate, titanyl bismethylethylphosphinate, titanyl bisdiphenylphosphinate and the like. These phosphinates can each be used alone or two or more of these phosphinates can be used in combination. That (e) the phosphinate compound according to an embodiment of the present invention further contains an aluminum element allows high flame resistance to be obtained, and thus is preferable. Among these phosphinates, using aluminum tris diethylphosphinate and aluminum trismethylethylphosphinate, which each contain an aluminum element, allows even higher flame resistance to be obtained, and thus is preferable.

A content of the component (e) according to an embodiment of the present invention with respect to 100 parts by weight of all solid components is preferably 20-80 parts by weight, and more preferably 25-75 parts by weight, and thereby, the obtained black resin cured film has excellent flame resistance and electrical insulation reliability. When the content of the component (e) is less than 20 parts by weight, the black resin cured film may be poor in flame resistance. When the content of the component (e) exceeds 80 parts by weight, coatability when a resin composition solution is applied may deteriorate, and appearance defects due to foaming of a coating film during coating or due to lack of leveling may occur.

[Other Components]

In addition to (a) the carboxyl group-containing resin, (b) the photopolymerization initiator, (c) the colorant, (d) the organic fine particles and (e) the phosphinate compound, when necessary, the photosensitive thermosetting resin composition (black resin composition) according to an embodiment of the present invention may contain additives such as a binder polymer other than (a) the carboxyl group-containing photosensitive resin, a radical polymerizable compound, a thermosetting resin, a filler, a flame retardant, an adhesion imparting agent, a polymerization inhibitor, and an organic solvent.

[Binder Polymer Other Than (a) Carboxyl Group-Containing Photosensitive Resin]

(A) A binder polymer other than (a) the carboxyl group-containing photosensitive resin used in an embodiment of the present invention is a compound that is soluble in an organic solvent and is formed by a polymerization reaction of two or more monomers, and is not particularly limited as long as the binder polymer is a polymer having a molecular weight of 1,000 or more and 1,000,000 or less.

A weight average molecular weight of the binder polymer other than (a) the carboxyl group-containing resin according to an embodiment of the present invention is preferably 1,000 or more, 1,000,000 or less, more preferably 1,500 or more and 100,000 or less, more preferably 2,000 or more and 50,000 or less, and particularly preferably 3,000 or more and 25,000 or less. The weight average molecular weight can be measured in the same manner as (a) the carboxyl group-containing resin.

Controlling the weight average molecular weight to the above range allows the obtained black resin cured film to have excellent flexibility and chemical resistance, and thus is preferable. When the weight average molecular weight is 1,000 or less, flexibility and chemical resistance may deteriorate, and when the weight average molecular weight is 1,000,000 or more, viscosity of a resin composition may increase.

Examples of the polymerization reaction include chain polymerization, sequential polymerization, living polymerization, addition polymerization, polycondensation, addition condensation, radical polymerization, ionic polymerization, cationic polymerization, anionic polymerization, coordination polymerization, ring opening polymerization, copolymerization and the like. Further, examples of a binder polymer obtained by such a polymerization reaction include polyurethane-based resin, poly (meth) acrylic resin, polyvinyl-based resin, polystyrene-based resin, polyethylene-based resin, polypropylene-based resin, polyimide-based resin, polyamide-based resin, polyacetal-based resin, polycarbonate-based resin, polyester-based resin, polyphenylene ether-based resin, polyphenylene sulfide-based resin, polyethersulfone-based resin, polyetheretherketone-based resin, and the like.

The binder polymer other than (a) the carboxyl group-containing resin according to an embodiment of the present invention is not particularly limited as long as the binder polymer is within the above range. However, for example, by having, in a molecule thereof, at least one functional group such as a hydroxyl group, a ketone group, an acyl group, a formyl group, a benzoyl group, a carboxyl group, a cyano group, a thiol group, an imino group, an azo group, an aji group, a sulfo group, a nitro group, a urethane bond, an imide bond, an amic acid bond, a carbonate bond, an ester bond, an oxime bond, a sulfide bond, and a urea bond, the binder polymer allows affinity with other components to be ensured, and further is also preferable for improving adhesion to various substrates. Particularly preferred is a binder polymer having a hydroxyl group, a benzoyl group, a carboxyl group, a thiol group, a urethane bond, an imide bond, an amic acid bond, a carbonate bond, an ester bond, or a urea bond. An amount of the binder polymer other than (a) the carboxyl group-containing photosensitive resin can be adjusted to an optimum range according to processing characteristics of the black resin composition and characteristics of the black resin cured film. However, the amount of the binder polymer with respect to 100 parts by weight of (a) the carboxyl group-containing photosensitive resin component is preferably 5-200 parts by weight, and more preferably 10-180 parts by weight, and thereby, the obtained resin composition has excellent developability, adhesion, chemical resistance, electrical insulation reliability, and the like. When the amount of the binder polymer exceeds 200 parts by weight, photosensitivity and developability of the resin composition may be impaired.

[Radical Polymerizable Compound]

From a point of view of promoting a photocuring reaction and from a point of view of stability in a resin composition and an organic solvent, the black resin composition according to an embodiment of the present invention preferably contains a radical polymerizable compound. The radical polymerizable compound used in an embodiment of the present invention is a compound in which a chemical bond is formed by a radical generated by light or heat. Among those, the radical polymerizable compound preferably is a compound in which a chemical bond is formed by a photopolymerization initiator, and is a compound having at least one unsaturated double bond in a molecule thereof. Further, the unsaturated double bond preferably is an acrylic group (CH2=CH— group), a methacryloyl group (CH=C(CH3)- group) or a vinyl group (—CH=CH— group).

Preferred examples of such a radical polymerizable compound include, but are not limited to, bisphenol F EO modified (n=2-50) diacrylate, bisphenol A EO modified (n=2-50) diacrylate, bisphenol S EO modified (n=2-50) diacrylate, bisphenol F EO modified (n=2-50) dimethacrylate, bisphenol A EO modified (n=2-50) dimethacrylate, bisphenol S EO modified (n=2-50) dimethacrylate, 1,6-hexanediol diacrylate, neopentyl glycol diacrylate, ethylene glycol diacrylate, pentaerythritol diacrylate, trimethylolpropane triacrylate, pentaerythritol triacrylate, dipentaerythritol hexaacrylate, tetramethylolpropane tetraacrylate, tetraethylene glycol diacrylate, 1,6-hexanediol dimethacrylate, neopentyl glycol dimethacrylate, ethylene glycol dimethacrylate, pentaerythritol dimethacrylate, trimethylolpropane trimethacrylate, pentaerythritol trimethacrylate, dipentaerythritol hexamethacrylate, tetramethylolpropane tetramethacrylate, tetraethylene glycol dimethacrylate, methoxydiethylene glycol methacrylate, methoxy polyethylene glycol methacrylate, ρ-methacryloyloxyethyl hydrogen phthalate, β-methacryloyloxyethyl hydrogen succinate, 3-chloro-2-hydroxypropyl methacrylate, stearyl methacrylate, phenoxyethyl acrylate, phenoxydiethylene glycol acrylate, phenoxy polyethylene glycol acrylate, β-acryloyloxyethyl hydrogen succinate, lauryl acrylate, ethylene glycol dimethacrylate, diethylene glycol dimethacrylate, triethylene glycol dimethacrylate, polyethylene glycol dimethacrylate, 1,3-butylene glycol dimethacrylate, 1,6-hexanediol dimethacrylate, neopentyl glycol dimethacrylate, polypropylene glycol dimethacrylate, 2-hydroxy-1,3-dimethacryloxypropane, 2, 2-bis [4-(methacryloxyethoxy) phenyl] propane, 2, 2-bis [4-(methacryloxy-diethoxy) phenyl] propane, 2, 2-bis [4-(methacryloxy-polyethoxy) phenyl] propane, polyethylene glycol diacrylate, tripropylene glycol diacrylate, polypropylene glycol diacrylate, 2,2-bis [4-(acryloxy-diethoxy) phenyl] propane, 2,2-bis [4-(acryloxy-polyethoxy) phenyl] propane, 2-hydroxy-1-acryloxy-3-methacryloxypropane, trimethylolpropane trimethacrylate, tetramethylolmethane triacrylate, tetramethylolmethane tetraacrylate, methoxydipropylene glycol methacrylate, methoxytriethylene glycol acrylate, nonylphenoxy polyethylene glycol acrylate, nonylphenoxy polypropylene glycol acrylate, 1-acryloyloxypropyl-2-phthalate, isostearyl acrylate, polyoxyethylene alkyl ether acrylate, nonylphenoxyethylene glycol acrylate, polypropylene glycol dimethacrylate, 1,4-butanediol dimethacrylate, 3-methyl-1,5-pentanediol dimethacrylate, 1,6-mexanediol dimethacrylate, 1,9-nonanediol methacrylate, 2,4-diethyl-1,5-pentanediol dimethacrylate, 1,4-cyclohexanedimethanol dimethacrylate, dipropylene glycol diacrylate, tricyclodecane dimethanol diacrylate, 2,2-hydrogenated bis [4-(acryloxy-polyethoxy) phenyl] propane, 2,2-bis [4-(acryloxy-polypropoxy) phenyl] propane, 2,4-diethyl-1,5-pentanediol diacrylate, ethoxylated trimethylolpropane triacrylate, propoxylated trimethylolpropane triacrylate, isocyanuric acid tri (ethane acrylate), pentaslitol tetraacrylate, ethoxylated pentaslitol tetraacrylate, propoxylated pentaslitol tetraacrylate, ditrimethylolpropane tetraacrylate, dipentaerythritol polyacrylate, triallyl isocyanurate, glycidyl methacrylate, glycidyl allyl ether, 1,3,5-triacryloylhexahydro-s-triazine, triallyl 1,3,5-benzenecarboxylate, triallylamine, triallyl citrate, triallylphosphate, alober Vital, diallylamine, diallyldimethylsilane, diallyl disulfide, diallyl ether, diallyl isophthalate, diallyl terephthalate, 1,3-diaryloxy-2-propanol, diallyl sulfide diallyl maleate, 4,4'-isopropylidenediphenol dimethacrylate, 4,4'-isopropylidenediphenol diacrylate, and the like. In particular, the number of repeating EO (ethylene oxide) units contained in a molecule of diacrylate or methacrylate is preferably in a range of 2-50, and more preferably 2-40. By using a compound of which the number of repeating EO units is in the range of 2-50, solubility of a resin composition in a water-based developer represented by an alkaline aqueous solution is improved, and a development time is shortened. Further, a stress is unlikely to remain in the black resin cured film obtained by curing the black resin composition. For example, among printed wiring boards, when the black resin cured film is laminated on a flexible printed wiring board using a polyimide resin as a base material, it is possible to suppress a curl of the printed wiring board.

In particular, using the EO-modified diacrylate or dimethacrylate in combination with an acrylic resin having three or more acrylic groups or methacrylic groups improves developability, and thus is particularly preferable. For example, acrylic resins are preferably used such as ethoxylated isocyanuric acid EO-modified triacrylate, ethoxylated isocyanuric acid EO modified trimethacrylate, ethoxylated trimethylolpropane triacrylate, ethoxylated trimethylolpropane triacrylate, ethoxylated trimethylolpropane triacrylate, trimethylolpropane triacrylate, propoxylated trimethylolpropane triacrylate, pentaerythritol triacrylate, ethoxylated pentaerythritol tetraacrylate, ethoxylated pentaerythritol tetraacrylate, ditrimethylolpropane tetraacrylate, ditrimethylolpropane tetraacrylate, propoxylated pentaerythritol tetraacrylate, pentaerythritol tetraacrylate, dipentaerythritol hexaacrylate, 2,2,2-trisacryloyloxymethylethyl succinic acid, 2,2,2-trisacryloyloxymethyl ethyl phthalic acid, propoxylated ditrimethylolpropane tetraacrylate, propoxylated dipentaerythritol hexaacrylate, ethoxylated isocyanuric acid triacrylate, ε-caprolactone-modified tris-(2-acryloxyethyl) isocyanurate, caprolactone-modified ditrimethylolpropane tetraacrylate, compounds represented by the following general formula (3)

[Chemical Formula 10]

General Formula (3)

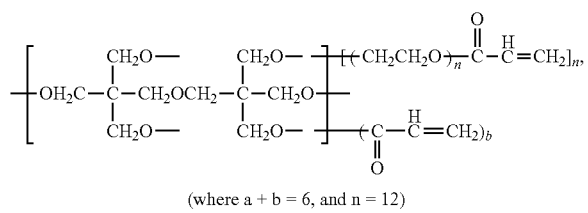

(where a + b = 6, and n = 12)

compounds represented by the following general formula (4)

[Chemical Formula 11]

General Formula (4)

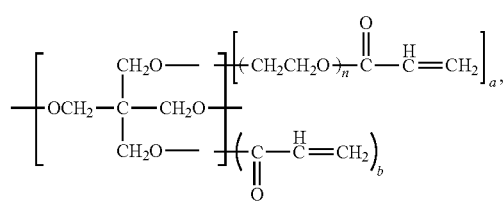

(where a + b = 4, and n = 4)

compounds represented by the following formula (5)

[Chemical Formula 12]

General Formula (5)

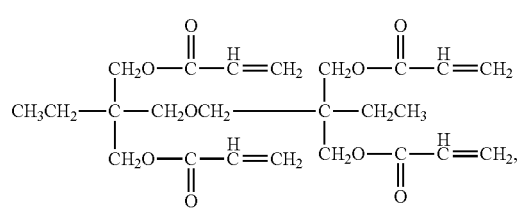

compounds represented by the following general formula (6),

[Chemical Formula 13]

General Formula (6)

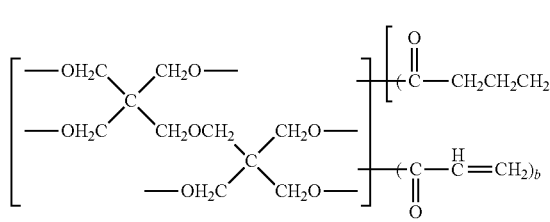

(where m=1, a=2, b=4; or, m=1, a=3, b=3; or, m=1, a=6, b=0; or, m=2, a=6, b=0), compounds represented by the following general formula (7)

[Chemical Formula 14]

General Formula (7)

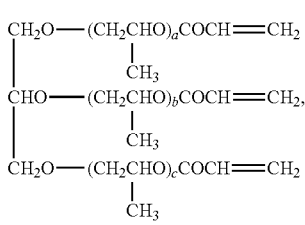

(where a + b + c = 3.6)

compounds represented by the following formula (8)

[Chemical Formula 15]

General Formula (8)

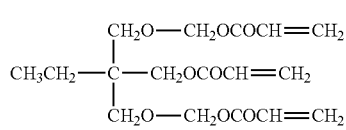

and compounds represented by the following general formula (9)

[Chemical Formula 16]

General Formula (9)

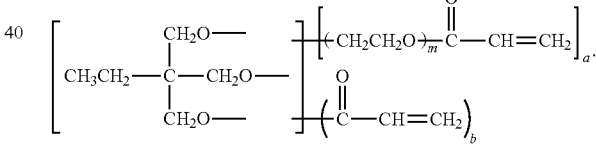

(where m•a = 3, a + b = 3; here "m•a" is a product of m and a)

Further, compounds having a hydroxyl group or a carbonyl group in a molecular structure, such as 2-hydroxy-3- phenoxypropyl acrylate, phthalic acid monohydroxyethyl acrylate, ω-carboxy-polycaprolactone monoacrylate, acrylic acid dimer, pentaerythritol and tetraacrylate, are also preferably used.

In addition, a radical polymerizable compound such as an epoxy-modified acrylic (methacrylic) resin, a urethane-modified acrylic (methacrylic) resin, a polyester-modified acrylic (methacrylic) resin also may be used.

It is possible to use one kind of a radical polymerizable compound. However, using two or more kinds of radical polymerizable compounds in combination is preferable in improving heat resistance of the black resin cured film after photocuring.

That the radical polymerizable compound in an embodiment of the present invention is blended such that an amount of the radical polymerizable compound is 10-200 parts by weight with respect to a total of 100 parts by weight of components excluding the component (b) is preferable in improving photosensitivity of the photosensitive resin composition.

When the amount of the radical polymerizable compound is less than the above range, alkali resistance of the black resin cured film may decrease and it may be difficult to add contrast during exposure and development. Further, when the amount of the radical polymerizable compound is more than the above range, since stickiness of a coating film obtained by applying the photosensitive resin composition onto a substrate and drying the solvent is increased, productivity is reduced, and further, since a cross-link density becomes too high, the black resin cured film may become brittle and fragile. By setting the amount of the radical polymerizable compound to the above range, it is possible to set a resolution during exposure and development to an optimum range.

[Thermosetting Resin]

From a point of view of sufficiently improving surface hardness, heat resistance and flame resistance of the black resin cured film, the black resin composition according to an embodiment of the present invention preferably includes a thermosetting resin. The thermosetting resin in an embodiment of the present invention is a compound that forms a cross-linked structure by heating and functions as a thermosetting agent. For example, it is possible to use: thermosetting resins such as an epoxy resin, a bismaleimide resin, a bisallylnadiimide resin, an acrylic resin, a methacrylic resin, a hydrosilyl hardening resin, an allyl hardening resin, and a unsaturated polyester resin; a side chain reactive group type thermosetting polymer having a reactive group such as an allyl group, a vinyl group, an alkoxysilyl group, a hydrosilyl group or the like at a side chain or a terminal of a polymer chain; and the like. In an embodiment of the present invention, the above-described thermosetting resins can each be used alone or two or more of these thermosetting resins can be used in combination. The black resin composition according to an embodiment of the present invention preferably contains the thermosetting resin as a substance different from the above-described binder polymer.

As the thermosetting resin in an embodiment of the present invention, among the above-described thermosetting resins, it is preferable to use an epoxy resin. Epoxy resins in an embodiment of the present invention include all monomers, oligomers, polymers and the like, regardless of molecular weight, as long as each of them has at least one epoxy group in a molecule thereof, and are compounds that each generate a cross-linked structure by heating and each function as a thermosetting agent. By containing an epoxy resin, the black resin cured film obtained by curing the black resin composition can have heat resistance and can have adhesion to a conductor such as a metal foil or a circuit board. The above epoxy resin is a compound containing at least two epoxy groups in a molecule thereof. Examples of the epoxy resin include: bisphenol A type epoxy resins manufactured by Japan Epoxy Resins Corporation under product names jER828, jER1001, jER1002, manufactured by ADEKA Corporation under product names ADEKA RESIN EP-4100E, ADEKA RESIN EP-4300E, manufactured by Nippon Kayaku Co., Ltd. under product names RE-3105, RE-410S, manufactured by Dainippon Ink and Chemicals, Inc. under product names Epiclon 840S, Epiclon 850S, Epicron 1050, Epicron 7050, and manufactured by Tohto Kasei Corporation under product names Epotote YD-115, Epototo YD-127, Epototo YD-128; bisphenol F type epoxy resins manufactured by Japan Epoxy Resins Corporation under product names jER 806, jER 807, manufactured by ADEKA Corporation under product names ADEKA RESIN EP-4901E, ADEKA RESIN EP-4930, ADEKA RESIN EP-4950, manufactured by Nippon Kayaku Co., Ltd. under product names RE-303S, RE-3045, RE-4035, RE-4045, manufactured by DIC Corporation under product names Epiclon 830, Epiclon 835, manufactured by Tohto Kasei Co., under product names Epotote YDF-170, Epototo YDF-175S, Epotohto YDF-2001; a bisphenol S type epoxy resin manufactured by DIC Corporation under product a name Epichlone EXA-1514; hydrogenated bisphenol A type epoxy resins manufactured by Japan Epoxy Resins Corporation under product names jERYX8000, jERYX8034, jERYL7170, manufactured by ADEKA Corporation under a product name Adekarezin EP-4080E, manufactured by DIC Corporation under a product name Epiclon EXA-7015, and manufactured by Tohto Kasei Co., under product names Epotote YD-3000, Epototo YD-4000D; biphenyl type epoxy resins manufactured by Japan Epoxy Resins Corporation under product names jERYX 4000, jERYL 6121 H, jERYL 6640, jERYL 6677, and manufactured by Nippon Kayaku Co., under product names NC-3000, NC-3000H; phenoxy type epoxy resins manufactured by Japan Epoxy Resins Corporation under product names jER1256, jER4250, jER4275; naphthalene type epoxy resins manufactured by DIC Corporation under product names Epiclon HP-4032, Epicron HP-4700, Epiclon HP-4200, and manufactured by Nippon Kayaku Co., Ltd. under a product name NC-7000L; phenol novolak type epoxy resins manufactured by Japan Epoxy Resins Corporation under product names jER152, jER154, manufactured by Nippon Kayaku Co., Ltd. under a product name EPPN-201-L, manufactured by DIC Corporation under product names Epiclon N-740, Epicron N-770, and manufactured by Tohto Kasei Co., Ltd. under a product name Epotote YDPN-638; cresol novolak type epoxy resins manufactured by Nippon Kayaku Co., Ltd. under product names EOCN-1020, EOCN-102S, EOCN-103S, EOCN-104S, and manufactured by DIC Corporation under product names Epiclon N-660, Epicron N-670, Epicron N-680, Epicron N-695; trisphenol methane type epoxy resin manufactured by Nippon Kayaku Co., Ltd. under product names EPPN-501H, EPPN-501HY, EPPN-502H; dicyclopentadiene type epoxy resins manufactured by Nippon Kayaku Co., Ltd. under a product name XD-1000, and manufactured by DIC Corporation under a product name Epiclon HP-7200; amine type epoxy resins manufactured Tohto Kasei Co., Ltd. under product names Epotote YH-434, and Epototo YH-434L; flexible epoxy resins manufactured by Japan Epoxy Resins Corporation under product names jER871, jER872, jERYL7175, and jERYL7217, and manufactured by DIC Corporation under a product name Epiclon EXA-4850; urethane-modified epoxy resins manufactured by ADEKA Corporation under product names Adekaresin EPU-6, Adekaresin EPU-73, and Adekaresin EPU-78-11; rubber-modified epoxy resins manufactured by ADEKA Corporation under product names Adekarezin EPR-4023, Adekaresin EPR-4026, and Adekaresin EPR-1309; chelate-modified epoxy resins manufactured by ADEKA Corporation under product names Adekarezin EP-49-10, and Adekaresin EP-49-20; and the like. In an embodiment of the present invention, the above-described epoxy resins can each be used alone or two or more of these epoxy resins can be used in combination.

A curing agent of the epoxy resin in an embodiment of the present invention is not particularly limited. However, examples of the curing agent include a phenol novolak resin, a cresol novolak resin, a phenol resin such as a naphthalene type phenol resin, an amino resin, a urea resin, melamine, dicyandiamide, and the like. These curing agents can each be used alone, or two or more of these curing agents can be used in combination.

Further, a curing accelerator is not particularly limited. However, examples of the curing accelerator include: phosphine-based compounds such as triphenylphosphine; amine-based compounds such as tertiary amine, trimethanol amine, triethanol amine, and tetraethanol amine; borate compounds such as 1,8-diaza-bicyclo [5,4,0]-7-undeceniumtetraphenyl borate; imidazoles such as imidazole, 2-ethylimidazole, 2-ethyl-4-methylimidazole, 2-phenylimidazole, 2-undecylimidazole, 1-benzyl-2-methylimidazole, 2-heptadecylimidazole, 2-isopropylimidazole, 2,4-dimethylimidazole, and 2-phenyl-4-methylimidazole; imidazolines such as 2-methylimidazoline, 2-ethylimidazoline, 2-isopropylimidazoline, 2-phenylimidazoline, 2-undecylimidazoline, 2,4-dimethylimidazoline, and 2-phenyl-4-methylimidazoline; azine-based imidazoles such as 2,4-diamino-6-[2'-methyl-imidazolyl-(1')]-ethyl-s-triazine, 2,4-diamino-6-[2'-undecylimidazolyl-(1')]-ethyl-s-triazine, and 2,4-diamino-6-[2'-ethyl-4'-methylimidazolyl-(1')]-ethyl-s-triazine; and the like. These curing accelerators can each be used alone, or two or more of these curing accelerators can be used in combination.

An amount of a thermosetting resin component in an embodiment of the present invention with respect to a total of 100 parts by weight of components excluding the thermosetting resin component is preferably 0.5-100 parts by weight, more preferably 1-50 parts by weight, and particularly preferably 5-20 parts by weight. Adjusting the amount of the thermosetting resin component to the above range allows heat resistance, chemical resistance and electrical insulation reliability of the black resin cured film obtained by curing the resin composition to be improved, and thus, is preferable.

When the amount of the thermosetting resin component is smaller than the above range, the black resin cured film obtained by curing the black resin composition may be poor in heat resistance and electrical insulation reliability. Further, when the amount of the thermosetting resin component is more than the above range, the black resin cured film obtained by curing the black resin composition may become brittle and may be poor in flexibility, and warpage of the black resin cured film also may increase.

[Filler]

From a point of view of adhesion between the black resin cured film and a substrate, suppression of outflow when the black resin composition is printed on the substrate, sufficient improvement in surface hardness, heat resistance and flame resistance of the black resin cured film, and rheology control suitable for printing the black resin composition, the black resin composition according to an embodiment of the present invention preferably contains a filler. The filler in an embodiment of the present invention is not particularly limited as long as the filler is a so-called organic filler or inorganic filler. However, examples of shapes of the filler include spherical, powdery, fibrous, needle-like and scaly shapes, and the like. Examples of organic fillers include: polytetrafluoroethylene powder; powders of polyethylene, benzoguanamine, melamine, phthalocyanine powder, and the like; and multilayered core shells formed using silicone, acrylic, styrene-butadiene rubber, butadiene rubber, and the like. Examples of inorganic fillers include: silica; metal oxides such as titanium oxide and alumina; metal nitrogen compounds such as silicon nitride and boron nitride; metal salts such as calcium carbonate, calcium hydrogen phosphate, calcium phosphate, and aluminum phosphate; and the like. In an embodiment of the present invention, the above-described fillers can each be used alone or two or more of these fillers can be used in combination. n particular, a metal oxide, a metal nitrogen compound or a metal salt has a high affinity with oxygen atoms, hydroxyl groups, adsorbed water, and the like, which are defects on a copper surface, and improves adhesion between the black resin cured film and copper, and thus is preferable.

Further, surfaces of the filler particles may be coated with a silane coupling agent, other organic compounds, or the like to perform surface modification such as hydrophilization or Hydrophobization. In an embodiment of the present invention, the above-described fillers can each be used alone or two or more of these fillers can be used in combination.

As a method for adding a filler, any method such as
1. a method in which a polymerization reaction solution is added before or during polymerization,
2. a method in which, after completion of polymerization, kneading is performed using a triple roll or the like, or
3. a method in which a dispersion liquid containing a filler is prepared and is mixed with a resin composition solution may be used. It is desirable that the filler is appropriately selected. One or more kinds of fillers can be mixed and used. Further, in order to satisfactorily disperse a filler and stabilize a dispersed state, a dispersing agent, a thickening agent and the like can be used to an extent that physical properties of a polyimide film are not affected.

[Flame Retardant]

From a point of view of preventing ignition of an electronic device due to a short-circuit or the like of a circuit, the black resin composition according to an embodiment of the present invention preferably contains a flame retardant. The flame retardant in an embodiment of the present invention is a compound used for imparting flame resistance to the black resin composition. For example, phosphate ester-based compounds, halogen-containing compounds, metal hydroxides, organic phosphorus compounds, silicone-based compounds, and the like can be used. As a method of use, the flame retardant can be used as an additive type flame retardant or a reactive flame retardant. Further, one or two or more flame retardants may be appropriately used in combination. Among these flame retardants, using a non-halogen-based compound is more preferable from a point of view of environmental pollution. In particular, a phosphorus-based flame retardant is preferable. The flame retardant in the black resin composition according to an embodiment of the present invention is preferably blended such that an amount of the flame retardant is 1-100 parts by weight with respect to a total of 100 parts by weight of components other than the flame retardant. The above-described blending ratio allows the flame resistance of the black resin cured film to be improved without impairing the developability and the photosensitivity of the black resin composition and the folding endurance of the obtained black resin cured film, and thus, is preferable. When the amount of the flame retardant component is smaller than the above range, the flame resistance of the black resin cured film obtained by curing the black resin composition may become insufficient. Further, when the amount of the flame retardant component is more than the above range, the developability and the photosensitivity of the black resin composition may decrease.

[Adhesion Imparting Agent and Polymerization Inhibitor]

Examples of the adhesion-imparting agent include a silane coupling agent, triazole-based compounds, tetrazole-based compounds, and triazine-based compounds. Examples of the polymerization inhibitor include hydroquinone, and hydroquinone monomethyl ether. These compounds can each be used alone or two or more kinds of these compounds can be used in combination.

[Solvent]

A solvent in an embodiment of the present invention is not particularly limited as long as the solvent is capable of dissolving a black resin composition component. Examples of the solvent include: sulfoxide-based solvents such as dimethyl sulfoxide and diethyl sulfoxide; symmetrical glycol diethers such as methyl monoglyme (1,2-dimethoxyethane), methyl diglyme (bis(2-methoxyether) ether), methyl triglyme (1,2-bis(2-methoxyethoxy) ethane), methyl tetraglyme (bis [2-(2-methoxyethoxyethyl)]ether), ethyl monoglyme (1,2-diethoxyethane), ethyl diglyme (bis(2-ethoxyethyl) ether), and butyl diglyme (bis(2-butoxyethyl) ether); acetates such as γ-butyrolactone, methyl acetate, ethyl acetate, isopropyl acetate, n-propyl acetate, butyl acetate, propylene glycol monomethyl ether acetate, ethylene glycol monobutyl ether acetate, diethylene glycol monoethyl ether acetate (also known as carbitol acetate, 2-(2-butoxyethoxy)ethyl acetate)), diethylene glycol monobutyl ether acetate, 3-methoxybutyl acetate, ethylene glycol monomethyl ether acetate, ethylene glycol monoethyl ether acetate, dipropylene glycol methyl ether acetate, propylene glycol diacetate, and 1,3-butylene glycol diacetate; ethers such as dipropylene glycol methyl ether, tripropylene glycol methyl ether, propylene glycol n-propyl ether, dipropylene glycol n-propyl ether, propylene glycol n-butyl ether, dipropylene glycol n-butyl ether, tripropylene glycol n-propyl ether, propylene glycol phenyl ether, dipropylene glycol dimethyl ether, 1,3-dioxolane, dthylene glycol monobutyl ether, diethylene glycol monoethyl ether, diethylene glycol monobutyl ether, and ethylene glycol monoethyl ether; and the like. These solvent can each be used alone, or two or more kinds of these solvents can be used in combination. An amount of the solvent in an embodiment of the present invention, with respect to a total of 100 parts by weight of components other than the solvent in the resin composition, is preferably 10-400 parts by weight, more preferably 20-200 parts by weight, and particularly preferably 40-100 parts by weight. Adjusting the amount of the solvent to the above range allows viscosity and stickiness of the resin composition to be adjusted to a range suitable for coating such as screen printing, and thus, is preferable. When the amount of the solvent is smaller than the above range, the viscosity of the resin composition may become extremely high so that coating may become difficult, and bubble entrainment and a leveling property during coating may be poor. Further, when the amount of the solvent is more than the above range, the viscosity of the resin composition may become extremely low so that coating may become difficult, and coatability of a circuit may be poor.

[Method for Forming Black Resin Cured Film]

The black resin composition in an embodiment of the present invention can form the black resin cured film as follows. First, the black resin composition is applied onto the circuit board and is dried to remove the solvent. Application to the substrate can be performed by screen printing, roller coating, curtain coating, spray coating, spin coating using a spinner, or the like. Drying of the coating film (preferably having a thickness of from 5 μm to 100 μm) is performed at 120° C. or less, preferably at 40-100° C. After drying, the dried coating film is irradiated with active light such as ultraviolet light, visible light, electron beam, laser light or the like. In this case, direct writing exposure may be performed using a method in which a negative type photomask is placed, a method in which a negative type glass mask is used in a noncontact manner, or using laser light or an LED direct exposure machine. An appropriate exposure amount varies depending on an exposure apparatus, an exposure light source and an exposure method to be used. Therefore, for example, the exposure amount can be set using a 21-step tablet manufactured by Stoffer or a 14-step step tablet manufactured by Kodack Co., and it suffices when exposure sensitivity of one step or more is obtained. Next, a pattern can be obtained by washing away an unexposed portion with a liquid developer using various methods such as shower, paddle, immersion or ultrasonic wave. Since a time until the pattern is exposed differs depending on a spray pressure and a flow rate of a development device and a temperature of a liquid developer, it is preferable to find an optimum device condition as appropriate. In order to obtain a good pattern, it is particularly important to manage a spray impact of development target to 0.10-10.0 kg/cm$^2$. The spray impact is more preferably 0.50-7.0 kg/cm$^2$, and even more preferably 0.50-5.0 kg/cm$^2$. When the spray impact is below this range, developability of the black resin composition decreases and problems occur such as that residues are generated on a surface of a substrate. When the spray impact is above this range, an undercut of the black resin cured film obtained by curing the black resin composition becomes large, and adhesion cannot be maintained and peeling occurs during development.

As the liquid developer, an alkaline aqueous solution is preferably used. This liquid developer may contain a water-soluble organic solvent such as methanol, ethanol, n-propanol, isopropanol, N-methyl-2-pyrrolidone or the like. Examples of an alkaline compound for providing the alkaline aqueous solution include hydroxide or carbonate or hydrogen carbonate of alkali metal, alkaline earth metal or ammonium ion; amine compound; and the like. Specifically, the examples include sodium hydroxide, potassium hydroxide, ammonium hydroxide, sodium carbonate, potassium carbonate, ammonium carbonate, sodium hydrogen carbonate, potassium hydrogen carbonate, ammonium hydrogen carbonate, tetramethylammonium hydroxide, tetraethylammonium hydroxide, tetrapropylammonium hydroxide, tetraisopropylammonium hydroxide, N-methyl diethanol amine, N-ethyl diethanol amine, N,N-dimethyl ethanolamine, triethanolamine, triisopropanolamine, triisopropylamine, and the like. As long as the aqueous solution is basic, other compounds can also be used.

A concentration of an alkaline compound that can be suitably used in a development process of the black resin composition in an embodiment of the present invention is preferably 0.01 to 10% by weight, and particularly preferably 0.05-5% by weight. Further, a temperature of a liquid developer depends on a composition of the black resin composition and a composition of the liquid developer, and, preferably, the liquid developer is generally used at 0° C. or more and 80° C. or less, and is more generally used at 20° C. or more and 50° C. or less.

A pattern formed by the development process is rinsed to remove unnecessary developer residues. Examples of rinse liquids include water, an acidic aqueous solution, and the like.

Next, by performing a heat curing treatment, it is possible to obtain a black resin cured film having excellent heat resistance and flexibility. A thickness of the black resin cured film is determined by taking into account a wiring thickness, but is preferably about 2-50 µm. In this case, with regard to a final curing temperature, for a purpose of preventing oxidation of wires and the like and not lowering adhesion between a wiring and a base material, it is desirable to perform curing by heating at a low temperature. The heat curing temperature in this case is preferably 100° C. or more and 250° C. or less, more preferably 120° C. or more and 200° C. or less, and particularly preferably 130° C. or more and 190° C. or less. When a final heating temperature is high, oxidation deterioration of a wiring may advance.

In this way, a flexible printed wiring board in which the black resin cured film is laminated is subjected to a gold plating treatment in order to form a switch contact point and an anisotropic conductive film (ACF) connection terminal and to perform component mounting and the like.

The flexible printed wiring board in an embodiment of the present invention has a polyimide with a black resin cured film in which the black resin composition is cured on the polyimide.

[Gold Plating Treatment]

The gold plating treatment in an embodiment of the present invention includes at least (I) a degreasing treatment, (II) an etching treatment, (III) a catalyzing treatment, (IV) an electroless nickel plating treatment, and (V) a gold plating treatment, and is not particularly limited as long as it is a processing process called an electrolytic gold plating process or an electroless gold plating process, which are common wet plating processes.

Further, a gold plating chemical liquid used in (V) the gold plating treatment in an embodiment of the present invention includes at least: a gold salt such as gold potassium cyanide, second potassium gold cyanide, or sodium gold sulfite; a buffer such as organic acid salt, sulfate, boric acid, phosphate, or sulfamic acid; a metal masking agent such as ethylenediaminetetraacetic acid (EDTA), N'-(2-hydroxyethyl)ethylenediamine-N,N,N'-triacetic acid (HEDTA), nitrilotriacetic acid (NTA), diethylenetriaminepentaacetic acid (DTPA), triethylenetetramine hexaacetic acid (TTHA), or hydroxylidene ethylidene phosphone (HEDP); and a crystal adjusting agent such as cobalt, nickel, silver, iron, palladium, copper, thallium, lead, or arsenicum. Examples of such a gold plating chemical liquid include those manufactured by Okuno Pharmaceutical Industry Co., Ltd. under product names Flash Gold 2000, Flash Gold VT, Flash Gold 330, Flash Gold NC, Electroless Noble AU, and Self Gold OTK-IT; those manufactured by Uemura & Co., Ltd. under product names Coblite TMX-22, Coblite TMX-23, Coblite TMX-40, Coblite TSB-71, Coblite TSB-72, Coblite TCU-37, Coblite TUC-38, Coblite TAM-LC, Coblite TCL-61, Coblite TIG-10, Coblite TAW-66, and Aurical TKK-51; and the like.

Further, a heat treatment may also be performed for a purpose of removing moisture in the black resin cured film after the gold plating treatment. A preferable heating temperature range is 50-200° C., and more preferably 80-170° C. A preferable heat treatment time 10 seconds or more, and more preferably 15 minutes or more. The heating temperature and the treatment time can be appropriately selected within ranges that allow characteristics of the black resin cured film to be maintained.

[Method for Calculating the Distance (U) from the Intersection Point Between the Vertical Line (L) and the Top Portion of the Black Resin Cured Film (A) to the Edge of the Top Portion, the Vertical Line (L) being Drawn with Respect to the Surface of the Polyimide (B) and Passing Through the Substrate-Adhered Edge (E) Between the Black Resin Cured Film (A) and the Polyimide (B)]

In a cross section of the black resin cured film according to an embodiment of the present invention, when the vertical line (L) passing through the substrate-adhered edge (E) between the black resin cured film (A) and the polyimide (B) is drawn with respect to the surface of the polyimide (B), a method for calculating the distance (U) from the intersection point between the vertical line (L) and the top portion of the black resin cured film (A) to the edge of the top portion can be confirmed using any method. For example, as described below, the polyimide with the black resin cured film is embedded in a thermosetting resin, and cross-sectioning of the black resin cured film is performed by polishing a cross section in a thickness direction with an ion beam, and the cross section of the black resin cured film is observed with a scanning electron microscope.

[Cross-Sectioning of Black Resin Cured Film]

A predetermined range of the polyimide with the black resin cured film was cut out using a cutter knife, and a protective film layer and a cover glass layer were formed on both a black resin cured film side surface and a base material (that is, polyimide) side surface of the cut out laminate using an epoxy-based embedding resin and a cover glass, and thereafter, a cross section in a thickness direction of the black resin cured film was subjected to cross section polisher processing using an ion beam.

(Cross Section Polisher Processing)

Equipment used: SM-09020CP equivalent manufactured by JEOL Ltd.

Processing condition: acceleration voltage 6 kV.

[Observation of Cross Section of Black Resin Cured Film]

The cross section in the thickness direction of the obtained black resin cured film was observed using a scanning electron microscope.

(Scanning Electron Microscope Observation)

Equipment used: S-3000N equivalent manufactured by Hitachi High-Technologies Corporation Observation condition: acceleration voltage 15 kV Detector: reflected electron detection (composition mode)

Magnification: 1000 times.

An embodiment of the present invention can also be structured as follows.

[1] A production method for a polyimide with a black resin cured film includes a process of obtaining the black resin cured film by curing a black resin composition at a thickness of 40-70 µm on the polyimide. The process of obtaining the black resin cured film includes a process of processing the black resin composition at a spray impact of 0.10-10.0 kg/cm$^2$ of development equipment. In a cross section of the black resin cured film, when a vertical line (L) passing through a substrate-adhered edge (E) between the black resin cured film and the polyimide is drawn with respect to a surface of the polyimide, a distance (U) from an intersection point between the vertical line (L) and a top portion of the black resin cured film to an edge of the top portion is 25 µm or less.

[2] In the production method for a polyimide with a black resin cured film described in the above aspect [1], the black resin cured film obtained by curing the black resin composition has a line width (w) of 100 μm or less and a line length (W) of 500 μm or more.

[3] In the production method for a polyimide with a black resin cured film described in the above aspect [1] or [2], the black resin composition contains at least (a) a carboxyl group-containing photosensitive resin, (b) a photopolymerization initiator, and (c) a colorant.

[4] In the production method for a polyimide with a black resin cured film described in the above aspect [3], (a) the carboxyl group-containing photosensitive resin is a carboxyl group-containing photosensitive resin having one or more partial structures selected from a bisphenol A structure, a bisphenol F structure, a biphenol structure, a biphenol novolac structure, a bisxylenol structure, a biphenyl novolac structure and a urethane structure.

[5] In the production method for a polyimide with a black resin cured film described in the above aspect [3], (b) the photopolymerization initiator is a photopolymerization initiator having a structure represented by the following general formula (1) or the following general formula (2) or is a photopolymerization initiator obtained by combining a photopolymerization initiator having a structure represented by the following general formula (1) and a photopolymerization initiator having a structure represented by the following general formula (2).

[Chemical Formula 17]

General Formula (1)

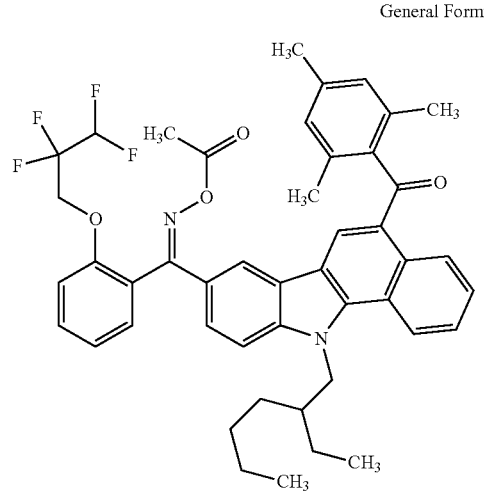

[Chemical Formula 18]

General Formula (2)

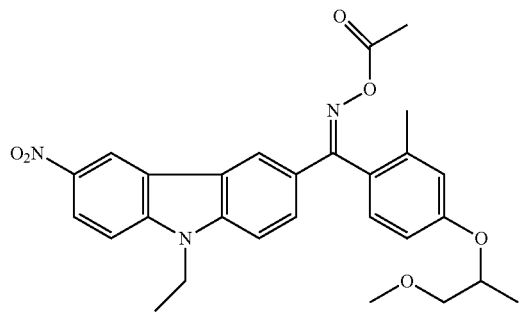

[6] In the production method for a polyimide with a black resin cured film described in the above aspect [3], (b) the photopolymerization initiator is a photopolymerization initiator obtained by combining two kinds of oxime ester-based photopolymerization initiators, the two kinds of oxime ester-based photopolymerization initiators including an oxime ester-based photopolymerization initiator having a structure represented by the following general formula (1) and an oxime ester-based photopolymerization initiator having a structure represented by the following general formula (2), or an oxime ester-based photopolymerization initiator having a structure represented by the following general formula (2) and an oxime ester-based photopolymerization initiator having a structure represented by the following general formula (11).

[Chemical Formula 19]

General Formula (1)

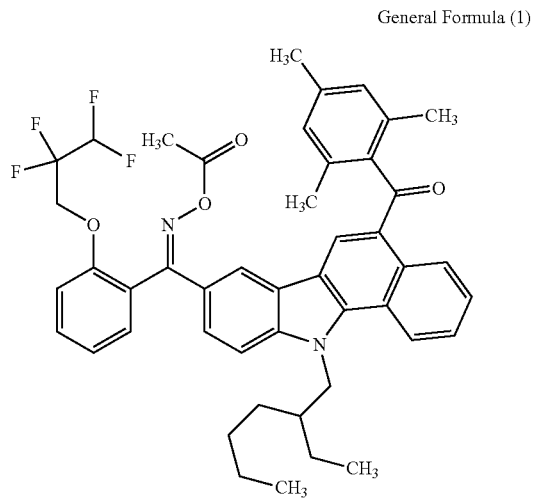

[Chemical Formula 20]

General Formula (2)

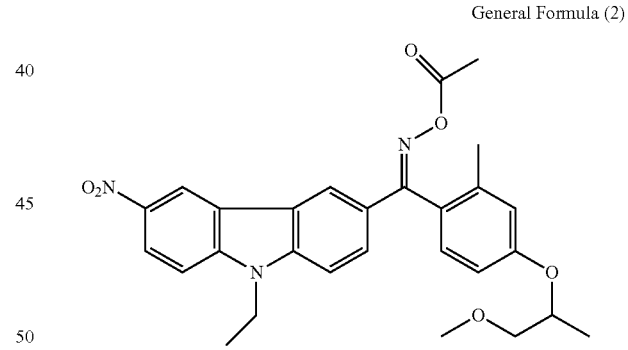

[Chemical Formula 21]

General Formula (11)

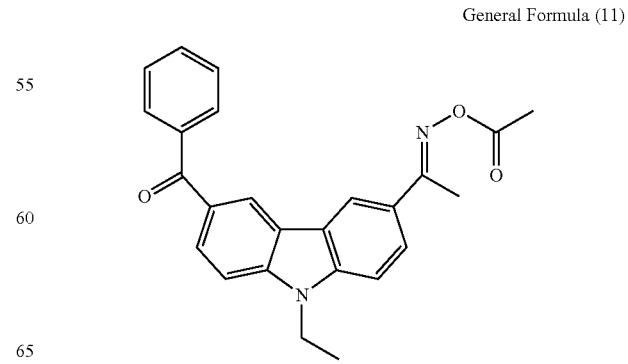

[7] In the production method for a polyimide with a black resin cured film described in the above aspect [6], a relation between an additive amount (X) of the oxime ester-based photopolymerization initiator having a structure represented by the general formula (1) or the general formula (11) and an additive amount (Y) of the oxime ester-based photopolymerization initiator having a structure represented by the general formula (2) is X:Y=0.1:0.9-0.9:0.1.

[8] In the production method for a polyimide with a black resin cured film described in the above aspect [3], (c) the colorant contains at least a perylene-based colorant and/or a phthalocyanine-based colorant.

[9] In the production method for a polyimide with a black resin cured film described in any one of the above aspects [1]-[8], when the black resin cured film obtained by curing the black resin composition has a thickness of 20 μm, a blackness (L*) value is 10-30.

[10] In the production method for a polyimide with a black resin cured film described in any one of the above aspects [1]-[9], the black resin composition further contains an α-aminoacetophenone-based photopolymerization initiator.

[11] In the production method for a polyimide with a black resin cured film described in any one of the above aspects [1]-[10], the black resin composition further contains (d) organic fine particles.

[12] In the production method for a polyimide with a black resin cured film described in the above aspect [11], (d) the organic fine particles contain urethane bonds.

[13] In the production method for a polyimide with a black resin cured film described in any one of the above aspects [1]-[12], the black resin composition further contains (e) a phosphinate compound.

[14] A black resin composition includes, at least, (a) a carboxyl group-containing photosensitive resin, (b) a photopolymerization initiator, (c) a colorant, (d) organic fine particles, and (e) a phosphinate compound. (a) The carboxyl group-containing photosensitive resin is a carboxyl group-containing photosensitive resin having one or more partial structures selected from a bisphenol A structure, a bisphenol F structure, a biphenol structure, a biphenol novolac structure, a bisxylenol structure, a biphenyl novolac structure and a urethane structure. (b) The photopolymerization initiator is a photopolymerization initiator having a structure represented by the following general formula (1) or the following general formula (2) or is a photopolymerization initiator obtained by combining a photopolymerization initiator having a structure represented by the following general formula (1) and a photopolymerization initiator having a structure represented by the following general formula (2). (c) The colorant contains at least a perylene-based colorant and/or a phthalocyanine-based colorant. When the black resin cured film obtained by curing the black resin composition has a thickness of 20 nm, a blackness (L*) value is 10-30.

[Chemical Formula 22]

General Formula (1)

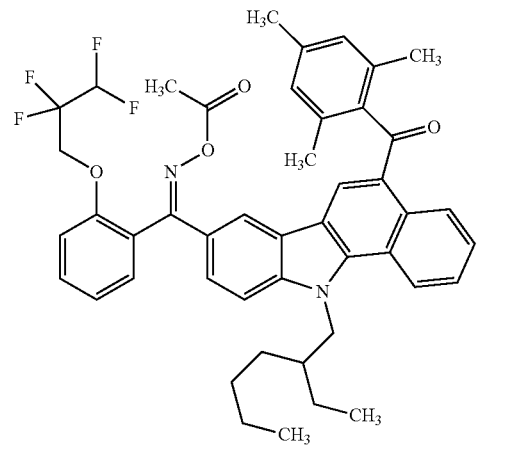

[Chemical Formula 23]

General Formula (2)

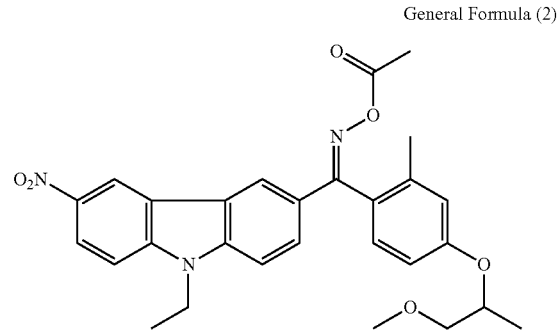

[15] A black resin composition includes, at least, (a) a carboxyl group-containing photosensitive resin, (b) a photopolymerization initiator, (c) a colorant, (d) organic fine particles, and (e) a phosphinate compound. (a) The carboxyl group-containing photosensitive resin is a carboxyl group-containing photosensitive resin having one or more partial structures selected from a bisphenol A structure, a bisphenol F structure, a biphenol structure, a biphenol novolac structure, a bisxylenol structure, a biphenyl novolac structure and a urethane structure. (b) The photopolymerization initiator is a photopolymerization initiator obtained by combining two kinds of oxime ester-based photopolymerization initiators, the two kinds of oxime ester-based photopolymerization initiators including, an oxime ester-based photopolymerization initiator having a structure represented by the following general formula (1) and an oxime ester-based photopolymerization initiator having a structure represented by the following general formula (2), or an oxime ester-based photopolymerization initiator having a structure represented by the following general formula (2) and an oxime ester-based photopolymerization initiator having a structure represented by the following general formula (11), and a relation between an additive amount (X) of the oxime ester-based photopolymerization initiator having a structure represented by the following general formula (1) or the following general formula (11) and an additive amount (Y) of the oxime ester-based photopolymerization initiator having a structure represented by the following general formula (2) is X:Y=0.1:0.9-0.9:0.1. (c) The colorant contains at least a perylene-based colorant and/or a phthalocyanine-based colorant. When the black resin cured film obtained by curing the black resin composition has a thickness of 20 μm, a blackness (L*) value is 10-30.

[Chemical Formula 24]

General Formula (1)

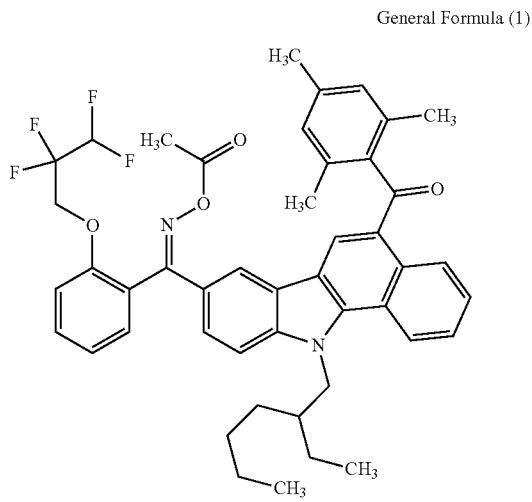

[Chemical Formula 25]

General Formula (2)

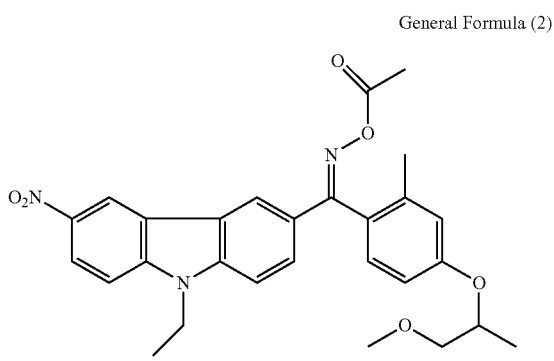

[Chemical Formula 26]

General Formula (11)

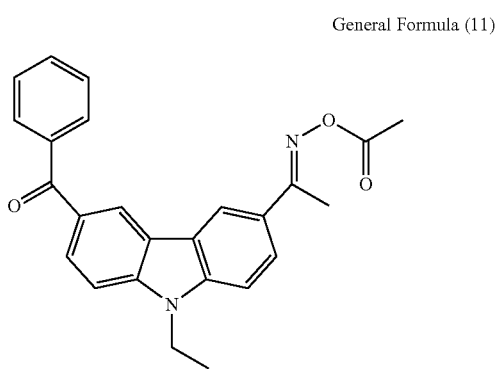

[16] In the black resin composition described in the above aspect [14] or [15], the black resin composition further contains an α-aminoacetophenone-based photopolymerization initiator.

[16] In the black resin composition described in any one of the above aspects [14]-[16], (d) the organic fine particles contain urethane bonds.

[18] A production method for a polyimide with a black resin cured film includes a process of obtaining the black resin cured film by curing the black resin composition described in any one of the above aspects [14]-[17] at a thickness of 40-70 μm on the polyimide. The process of obtaining the black resin cured film includes a process of processing the black resin composition at a spray impact of 0.10-10.0 kg/cm² of development equipment. In a cross section of the black resin cured film, when a vertical line (L) passing through a substrate-adhered edge (E) between the black resin cured film and the polyimide is drawn with respect to a surface of the polyimide, a distance (U) from an intersection point between the vertical line (L) and a top portion of the black resin cured film to an edge of the top portion is 25 μm or less.

[19] In the production method for a polyimide with a black resin cured film described in the above aspect [18], the black resin cured film obtained by curing the black resin composition has a line width (w) of 100 μm or less and a line length (W) of 500 μm or more.

[20] A flexible printed wiring board includes a polyimide with a black resin cured film obtained by curing the black resin composition described in any one of the above aspects [14]-[17] on the polyimide.

[21] A flexible printed wiring board includes a polyimide with a black resin cured film, the black resin cured film having a thickness of 40-70 μm on the polyimide and being a cured film of the black resin composition described in any one of the above aspects [14]-[17]. In a cross section of the black resin cured film, when a vertical line (L) passing through a substrate-adhered edge (E) between the black resin cured film and the polyimide is drawn with respect to a surface of the polyimide, a distance (U) from an intersection point between the vertical line (L) and a top portion of the black resin cured film to an edge of the top portion is 25 μm or less.

The present invention is not limited to the above-described embodiments. Various modifications are possible within the scope of the claims. Embodiments obtained by appropriately combining technical means respectively disclosed in different embodiments are also included in the technical scope of the present invention. Further, by combining technical means that are respectively disclosed in the embodiments, new technical features can be formed.

EXAMPLES

In the following, an embodiment of the present invention is described in detail based on examples. However, the present invention is not limited by these examples.

Synthesis Example 1: Synthesis 1 of (a) the Carboxyl Group-Containing Photosensitive Resin 100.0 g of methyltriglyme (=1,2-bis(2-methoxyethoxy)ethane) as a polymerization solvent was charged into a reaction container equipped with a stirrer, a thermometer, a dropping funnel and a nitrogen introducing tube, and temperature was raised to 80° C. while stirring was performed under a nitrogen stream. A mixture containing 12.0 g (0.14 mol) of methacrylic acid, 28.0 g (0.16 mol) of benzyl methacrylate, 60.0 g (0.42 mol) of butyl methacrylate, and 0.5 g of azobisisobutyronitrile as a radical polymerization initiator, which were premixed at a room temperature, was added dropwise from the dropping funnel into the reaction container over 3 hours in a state in which the temperature is kept at 80° C. After completion of the dropwise addition, the reaction solution was heated to 90° C. while being stirred, and was further stirred for two hours to allow the reaction solution to react while the temperature of the reaction solution was kept at 90° C. By performing the above reaction, a carboxyl group-containing resin solution (a-1)

containing a photosensitive resin that contains a carboxyl group in a molecule thereof was obtained. A solid content concentration of the obtained resin solution was 50%, a weight average molecular weight was 48,000, and an acid value of the solid content was 78 mg KOH/g. The solid content concentration, the weight average molecular weight and the acid value were measured using the following methods.

<Solid Content Concentration>

Measurement was performed according to JIS K 5601-1-2. A drying condition was 170° C.×1 hour.

<Weight Average Molecular Weight>

Measurement was performed under the following conditions.

Equipment used: Tosoh GPC equivalent
Columns: Tosoh TSK gel Super AWM-H (6.0 mmI.D.×15 cm)×2
Guard column: Tosoh TSK guard column Super AW-H
Eluent: 30 mM LiBr+20 mM H3PO4 in DMF
Flow rate: 0.6 mL/min
Column temperature: 40° C.
Detection condition: RI: polarity (+), response (0.5 sec)
Sample concentration: about 5 mg/mL
Standard product: PEG (polyethylene glycol).

<Acid Value>

Measurement was performed according to JIS K 5601-2-1.

Synthesis Example 2: Synthesis 2 of (a) the Carboxyl Group-Containing Photosensitive Resin 40.00 g of methyltriglyme (=1,2-bis(2-methoxyethoxy) ethane) as a polymerization solvent was charged into a reaction container equipped with a stirrer, a thermometer and a nitrogen inlet tube, and, into this, 20.62 g (0.100 mol) of norbornene diisocyanate was charged and was dissolved by heating the mixture to 80° C. while the mixture was stirred under a nitrogen stream.

To this solution, a solution, which was obtained by dissolving 50.00 g (0.025 mol) of polycarbonate diol (manufactured by Asahi Kasei Corporation under a product name PCDL T5652 having a weight average molecular weight of 2000), 3.70 g (0.025 mol) of 2,2-bis(hydroxymethyl) butanoic acid, and 13.02 g (0.100 mol) of 2-hydroxyethyl methacrylate in 40.00 g of methyltriglyme, was added over 1 hour. This solution was heated and stirred at 80° C. for 5 hours to allow the solution to react. By performing the above reaction, a carboxyl group-containing resin solution (a-2) containing a photosensitive resin that contains a urethane bond, a carboxyl group and a (meth) acryloyl group in a molecule thereof was obtained. A solid content concentration of the obtained resin solution was 52%, a weight average molecular weight was 8, 600, and an acid value of the solid content was 18 mg KOH/g. The solid content concentration, the weight average molecular weight and the acid value were measured using the same methods as in Synthesis Example 1.

Synthesis Example 3: Synthesis 1 of a Base Binder Other than (a) the Carboxyl Group-Containing Photosensitive Resin 30.00 g of methyltriglyme (=1,2-bis(2-methoxyethoxy) ethane) as a polymerization solvent was charged into a reaction container equipped with a stirrer, a thermometer and a nitrogen inlet tube, and, into this, 10.31 g (0.050 mol) of norbornene diisocyanate was charged and was dissolved by heating the mixture to 80° C. while the mixture was stirred under a nitrogen stream. To this solution, a solution, which was obtained by dissolving 50.00 g (0.025 mol) of polycarbonate diol (manufactured by Asahi Kasei Corporation under a product name PCDL T5652 having a weight average molecular weight of 2000) and 6.51 g (0.050 mol) of 2-hydroxyethyl methacrylate in 30.00 g of methyltriglyme, was added over 1 hour. This solution was heated and stirred at 80° C. for 5 hours to allow the solution to react. By performing the above reaction, a base binder solution (R-1) was obtained. A solid content concentration of the obtained resin solution was 53%, and a weight average molecular weight was 5,200. The solid content concentration and the weight average molecular weight were measured using the same methods as in Synthesis Example 1.

Synthesis Example 4: Synthesis 2 of a Base Binder Other than (a) the Carboxyl Group-Containing Photosensitive Resin 17.5 g of methyltriglyme (=1,2-bis(2-methoxyethoxy) ethane) as a polymerization solvent was charged into a separable flask equipped with a stirrer, a thermometer, a dropping funnel, a reflux tube and a nitrogen inlet tube, and subsequently, 20.6 g (0.100 mol) of norbornene diisocyanate was charged and was dissolved by heating the mixture to 80° C. while the mixture was stirred under a nitrogen stream. To this solution, a solution, which was obtained by dissolving 50.0 g (0.025 mol) of polycarbonate diol (manufactured by Asahi Kasei Corporation under a product name PCDL T5652 having a weight average molecular weight of 2000) and 8.1 g (0.055 mol) of dimethylol butanoic acid in 50.0 g of methyltriglyme, was added over 1 hour. This solution was stirred for 5 hours at 80° C. while being heated under reflux, and an intermediate was obtained. Thereafter, 1 g of methanol was added and the solution was stirred for 5 hours, and a base binder solution (R-2) was obtained. A solid content concentration of the obtained resin solution was 50%, and a weight average molecular weight was 10,200. The solid content concentration and the weight average molecular weight were measured using the same methods as in Synthesis Example 1.

Synthesis Example 5: Synthesis 3 of a Base Binder Other than (a) the Carboxyl Group-Containing Photosensitive Resin 35.00 g of methyltriglyme (=1,2-bis(2-methoxyethoxy) ethane) as a polymerization solvent was charged into a reaction container equipped with a stirrer, a thermometer and a nitrogen inlet tube, and, into this, 10.31 g (0.050 mol) of norbornene diisocyanate was charged and was dissolved by heating the mixture to 80° C. while the mixture was stirred under a nitrogen stream. To this solution, a solution, which was obtained by dissolving 50.00 g (0.025 mol) of polycarbonate diol (manufactured by Asahi Kasei Corporation under a product name PCDL T5652 having a weight average molecular weight of 2000) in 35.00 g of methyltriglyme, was added over 1 hour. This solution was heated and stirred at 80° C. for 2 hours. After completion of the reaction, 15.51 g (0.050 mol) of 3,3',4,4'-oxydiphthalic acid dianhydride (hereinafter referred to as ODPA) was added to the above-described reaction solution. After the addition, the mixture was warmed to 190° C. to allow the mixture to react for 1 hour. This solution was cooled to 80° C., and 3.60 g (0.200 mol) of pure water was added. After the addition, the temperature of the solution was raised to 110° C. and was heated under reflux for 5 hours. By performing the above reaction, a base binder solution (R-3) was obtained. A solid content concentration of the obtained resin solution was 53%, a weight average molecular weight was 9,200, and an acid value of the solid content was 86 mg KOH/g. The solid content concentration, the weight average molecular weight and the acid value were measured using the same methods as in Synthesis Example 1.

Blending Examples 1-38

Black resin compositions were each prepared by adding (a) a carboxyl group-containing resin, (b) a photopolymerization initiator and (c) a colorant, (d) organic fine particles, (e) a phosphinate compound and other components. Blending amounts of resin solid contents of raw materials forming the black resin compositions and types of the raw materials are listed in Tables 1-4. After mixing a mixed solution with a triple roll, foam in the solution was thoroughly defoamed using a defoaming device, and the following evaluation was performed.

TABLE 1

| Component | Materials forming black resin composition | Blending Example 1 | Blending Example 2 | Blending Example 3 | Blending Example 4 | Blending Example 5 | Blending Example 6 | Blending Example 7 | Blending Example 8 | Blending Example 9 | Blending Example 10 | Blending Example 11 | Blending Example 12 | Blending Example 13 | Blending Example 14 |
|---|---|---|---|---|---|---|---|---|---|---|---|---|---|---|---|
| Component (a) | a-1 | 25.0 | 0 | 0 | 0 | 0 | 0 | 0 | 0 | 0 | 0 | 0 | 0 | 0 | 0 |
|  | a-2 | 0 | 25.0 | 25.0 | 0 | 0 | 0 | 0 | 0 | 0 | 0 | 0 | 0 | 0 | 0 |
|  | UXE-3044<1> | 0 | 0 | 5.0 | 13.0 | 13.0 | 13.0 | 13.0 | 10 | 10 | 10 | 10 | 10 | 10 | 10 |
|  | ZFR-1401H<2> | 0 | 0 | 5.0 | 0 | 0 | 0 | 0 | 0 | 0 | 0 | 0 | 0 | 0 | 0 |
|  | ZAR-2000<3> | 10.0 | 10.0 | 0 | 13.0 | 13.0 | 13.0 | 13.0 | 0 | 0 | 0 | 0 | 0 | 0 | 0 |
| Other components Base binder other than component (a) | R-1 (Urethane acrylate) | 10.0 | 10.0 | 5.0 | 12.0 | 12.0 | 12.0 | 12.0 | 15 | 15 | 15 | 15 | 15 | 15 | 15 |
|  | R-2 (Urethane) | 0 | 0 | 5.0 | 0 | 0 | 0 | 0 | 0 | 0 | 0 | 0 | 0 | 0 | 0 |
|  | R-3 (Urethane imide) | 0 | 0 | 0 | 0 | 0 | 0 | 0 | 30 | 30 | 30 | 30 | 30 | 30 | 30 |
| Component (b) | Irgacure OXE-02<4> | 0 | 1.0 | 1.0 | 1.0 | 1.0 | 0 | 0 | 0 | 0 | 0 | 0 | 0 | 0 | 0 |
|  | KAYACURE DETX-S<5> | 0.3 | 0.3 | 0.3 | 0.3 | 0.3 | 0.3 | 0.3 | 0.3 | 0.3 | 0.3 | 0.3 | 0.3 | 0.3 | 0.3 |
|  | Irgacure OXE-03<6> | 0 | 0 | 0 | 0 | 0 | 1.0 | 0 | 1.0 | 1.0 | 1.0 | 1.0 | 1.0 | 1.0 | 1.0 |
|  | NCI-831<7> | 0 | 0 | 0 | 0 | 0 | 0 | 1.0 | 0 | 0 | 0 | 0 | 0 | 0 | 0 |
|  | Irgacure 369<8> | 0 | 0 | 0 | 0 | 0 | 3.0 | 3.0 | 3.0 | 3.0 | 3.0 | 3.0 | 3.0 | 3.0 | 3.0 |
| Component (c) | MA-100R<9> | 0 | 0 | 0 | 0 | 0 | 0 | 0 | 1.0 | 1.0 | 0 | 0 | 0 | 0 | 0 |
|  | Lumogen Black FK4280<10> | 0 | 0 | 0 | 0 | 0 | 0 | 0 | 0 | 0 | 0 | 0 | 0 | 0 | 0 |
|  | Heliogen Blue D7110F<11> | 0.5 | 0.5 | 0.5 | 0.5 | 0.5 | 0.5 | 0.5 | 0 | 0.5 | 0.5 | 1.0 | 0.4 | 0.4 | 0.3 |
|  | PV Fast Orange GRL<12> | 0.5 | 0.5 | 0.5 | 0.5 | 0.5 | 0.5 | 0.5 | 0 | 0 | 0.5 | 1.0 | 0.4 | 0.4 | 0.3 |
|  | Hostaperm Red violet ER02<13> | 0.5 | 0.5 | 0.5 | 0.5 | 0.5 | 0.5 | 0.5 | 0 | 0 | 0.5 | 1.0 | 0.4 | 0.4 | 0.3 |
| Component (d) | Art Pearl TK-800TR<14> | 14.0 | 14.0 | 14.0 | 15.0 | 15.0 | 15.0 | 15.0 | 16.0 | 16.0 | 16.0 | 16.0 | 16.0 | 0 | 0 |
| Component (e) | Exolit OP 935<15> | 16.0 | 16.0 | 16.0 | 22.0 | 22.0 | 22.0 | 22.0 | 16.0 | 16.0 | 16.0 | 16.0 | 0 | 16.0 | 0 |
| Other components | KAYARAD DPHA<16> | 5.0 | 5.0 | 5.0 | 5.0 | 5.0 | 5.0 | 5.0 | 5.0 | 5.0 | 5.0 | 5.0 | 5.0 | 5.0 | 5.0 |
| Thermosetting resin component | jer828<17> | 5.0 | 5.0 | 5.0 | 6.0 | 6.0 | 6.0 | 6.0 | 13.0 | 13.0 | 13.0 | 13.0 | 13.0 | 13.0 | 13.0 |
|  | YX-4000K<18> | 7.0 | 7.0 | 7.0 | 4.0 | 4.0 | 4.0 | 4.0 | 0 | 0 | 0 | 0 | 0 | 0 | 0 |
| Filler component | Aerosil R-974<19> | 0 | 0 | 0 | 0 | 0 | 0 | 0 | 0 | 0 | 0 | 0 | 3.0 | 3.0 | 3.0 |
| Additive | DICY-7<20> | 1.0 | 1.0 | 1.0 | 0.5 | 0.5 | 0.5 | 0.5 | 1.3 | 1.3 | 1.3 | 1.3 | 1.3 | 1.3 | 1.3 |
| Defoaming agent | FlorenAC-2000<21> | 1.0 | 1.0 | 1.0 | 1.0 | 1.0 | 1.0 | 1.0 | 1.0 | 1.0 | 1.0 | 1.0 | 1.0 | 1.0 | 1.0 |
| Solvent | EDGAC<22> and solvent contained in resin solution | 80 | 80 | 80 | 80 | 80 | 80 | 80 | 80 | 80 | 80 | 80 | 65 | 65 | 40 |

Unit: Parts by weight

TABLE 2

Unit: Parts by weight

| Component | Materials forming black resin composition | Blending Example 15 | Blending Example 16 | Blending Example 17 | Blending Example 18 | Blending Example 19 |
|---|---|---|---|---|---|---|
| Component (a) | a-1 | 0 | 0 | 0 | 0 | 0 |
| | a-2 | 0 | 0 | 0 | 0 | 0 |
| | UXE-3044<1> | 0 | 0 | 13.0 | 13.0 | .0 |
| | ZFR-1401H<2> | 0 | 0 | 0 | 0 | 0 |
| | ZAR-2000<3> | 0 | 0 | 13.0 | 13.0 | 0 |
| | FINEDIC M-8842<23> | 0 | 0 | 0 | 0 | 26.0 |
| Other components Base binder other than component (a) | R-1 (Urethane acrylate) | 35.0 | 30.0 | 12.0 | 12.0 | 0 |
| | R-2 (Urethane) | 10.0 | 15.0 | 0 | 0 | 12.0 |
| | R-3 (Urethane imide) | 0 | 0 | 0 | 0 | 0 |
| Component (b) | Irgacure OXE-02<4> | 1.0 | 1.0 | 0 | 0 | 0 |
| | KAYACURE DETX-S<5> | 0.3 | 0.3 | 0.3 | 0.3 | 0.3 |
| | Irgacure OXE-03<6> | 0 | 0 | 1.0 | 1.0 | 1.0 |
| | NCI-831<7> | 0 | 0 | 0 | 0 | 0 |
| | Irgacure 369<8> | 0 | 0 | 3.0 | 3.0 | 3.0 |
| Component (c) | MA-100R<9> | 0 | 0 | 0 | 0 | 0 |
| | Lumogen Black FK4280 <10> | 0 | 0 | 0 | 0 | 0 |
| | Heliogen Blue D7110F<11> | 0.5 | 0.5 | 0.5 | 0.5 | 0.5 |
| | PV Fast Orange GRL<12> | 0.5 | 0.5 | 0.5 | 0.5 | 0.5 |
| | Hostaperm Red violet ER02<13> | 0.5 | 0.5 | 0.5 | 0.5 | 0.5 |
| Component (d) | Art Pearl TK-800TR<14> | 14.0 | 14.0 | 0 | 15.0 | 15.0 |
| | GR-800<24> | 0 | 0 | 15.0 | 0 | 0 |
| Component (e) | Exolit OP 935<15> | 16.0 | 16.0 | 22.0 | 30.0 | 22.0 |
| Other components | KAYARAD DPHA<16> | 5.0 | 5.0 | 5.0 | 5.0 | 5.0 |
| Thermosetting resin component | jer828<17> | 5.0 | 5.0 | 6.0 | 6.0 | 6.0 |
| | YX-4000K<18> | 7.0 | 7.0 | 4.0 | 4.0 | 4.0 |
| Filler component | Aerosil R-974<19> | 0 | 0 | 0 | 0 | 0 |
| Additive | DICY-7<20> | 1.0 | 1.0 | 0.5 | 0.5 | 0.5 |
| Defoaming agent | Floren AC-2000<21> | 1.0 | 1.0 | 1.0 | 1.0 | 1.0 |
| Solvent | EDGAC<22> and solvent contained in resin solution | 80 | 80 | 80 | 80 | 80 |

TABLE 3

Unit: Parts by weight

| Component | Materials forming black resin composition | Blending Example 20 | Blending Example 21 | Blending Example 22 | Blending Example 23 | Blending Example 24 | Blending Example 25 | Blending Example 26 | Blending Example 27 |
|---|---|---|---|---|---|---|---|---|---|
| Component (a) | a-1 | 0 | 0 | 0 | 0 | 0 | 0 | 0 | 0 |
| | a-2 | 0 | 0 | 0 | 0 | 0 | 0 | 0 | 0 |
| | UXE-3044<1> | 13.0 | 13.0 | 13.0 | 13.0 | 13.0 | 13.0 | 13.0 | 13.0 |
| | ZFR-1401H<2> | 0 | 0 | 0 | 0 | 0 | 0 | 0 | 0 |
| | ZAR-2000<3> | 13.0 | 13.0 | 13.0 | 13.0 | 13.0 | 13.0 | 13.0 | 13.0 |
| Other components Base binder other than component (a) | R-1 (Urethane acrylate) | 12.0 | 12.0 | 12.0 | 12.0 | 12.0 | 12.0 | 12.0 | 12.0 |
| | R-2 (Urethane) | 0 | 0 | 0 | 0 | 0 | 0 | 0 | 0 |
| | R-3 (Urethane imide) | 0 | 0 | 0 | 0 | 0 | 0 | 0 | 0 |
| Component (b) | Irgacure OXE-02<4> | 0.95 | 0.75 | 0.5 | 0.4 | 0.2 | 0.99 | 0.15 | 0 |
| | KAYACURE DETX-S<5> | 0 | 0 | 0 | 0 | 0 | 0 | 0 | 0 |
| | Irgacure OXE-03<6> | 0 | 0 | 0 | 0 | 0 | 0 | 0 | 0.95 |
| | NCI-831<7> | 0.05 | 0.25 | 0.5 | 0.6 | 0.8 | 0.01 | 0.85 | 0.05 |
| | Irgacure 369<8> | 0 | 0 | 0 | 0 | 0 | 0 | 0 | 0 |
| Component (c) | MA-100R<9> | 0 | 0 | 0 | 0 | 0 | 0 | 0 | 0 |
| | Lumogen Black FK4280 <10> | 0 | 0 | 0 | 0 | 0 | 0 | 0 | 0 |
| | Heliogen Blue D7110F<11> | 0.5 | 0.5 | 0.5 | 0.5 | 0.5 | 0.5 | 0.5 | 0.5 |
| | PV Fast Orange GRL<12> | 0.5 | 0.5 | 0.5 | 0.5 | 0.5 | 0.5 | 0.5 | 0.5 |
| | Hostaperm Red violet ER02<13> | 0.5 | 0.5 | 0.5 | 0.5 | 0.5 | 0.5 | 0.5 | 0.5 |
| Component (d) | Art Pearl TK-800TR<14> | 15.0 | 15.0 | 15.0 | 15.0 | 15.0 | 15.0 | 15.0 | 15.0 |
| Component (e) | Exolit OP 935<15> | 22.0 | 22.0 | 22.0 | 22.0 | 22.0 | 22.0 | 22.0 | 22.0 |
| Other components | KAYARAD DPHA<16> | 5.0 | 5.0 | 5.0 | 5.0 | 5.0 | 5.0 | 5.0 | 5.0 |
| Thermosetting resin component | jer828<17> | 6.0 | 6.0 | 6.0 | 6.0 | 6.0 | 6.0 | 6.0 | 6.0 |
| | YX-4000K<18> | 4.0 | 4.0 | 4.0 | 4.0 | 4.0 | 4.0 | 4.0 | 4.0 |
| Filler component | Aerosil R-974<19> | 0 | 0 | 0 | 0 | 0 | 0 | 0 | 0 |
| Additive | DICY-7<20> | 0.5 | 0.5 | 0.5 | 0.5 | 0.5 | 0.5 | 0.5 | 0.5 |
| Defoaming agent | Floren AC-2000<21> | 1.0 | 1.0 | 1.0 | 1.0 | 1.0 | 1.0 | 1.0 | 1.0 |
| Solvent | EDGAC<22> and solvent contained in resin solution | 80 | 80 | 80 | 80 | 80 | 80 | 80 | 80 |

TABLE 4

Unit: Parts by weight

| Component | Materials forming black resin composition | Blending Example 28 | Blending Example 29 | Blending Example 30 | Blending Example 31 | Blending Example 32 | Blending Example 33 | Blending Example 34 | Blending Example 35 | Blending Example 36 | Blending Example 37 | Blending Example 38 |
|---|---|---|---|---|---|---|---|---|---|---|---|---|
| Component (a) | a-1 | 0 | 0 | 0 | 0 | 0 | 0 | 0 | 0 | 25.0 | 0 | 0 |
| | a-2 | 0 | 0 | 0 | 0 | 0 | 0 | 0 | 0 | 0 | 25.0 | 25.0 |
| | UXE-3044<1> | 13.0 | 13.0 | 13.0 | 13.0 | 13.0 | 13.0 | 13.0 | 13.0 | 0 | 0 | 5.0 |
| | ZFR-1401H<2> | 0 | 0 | 0 | 0 | 0 | 0 | 0 | 0 | 0 | 0 | 5.0 |
| | ZAR-2000<3> | 13.0 | 13.0 | 13.0 | 13.0 | 13.0 | 13.0 | 13.0 | 13.0 | 10.0 | 10.0 | 0 |
| Other components Base binder other than component (a) | R-1 (Urethane acrylate) | 12.0 | 12.0 | 12.0 | 12.0 | 12.0 | 12.0 | 12.0 | 12.0 | 10.0 | 10.0 | 5.0 |
| | R-2 (Urethane) | 0 | 0 | 0 | 0 | 0 | 0 | 0 | 0 | 0 | 0 | 5.0 |
| | R-3 (Urethane imide) | 30 | 30 | 30 | 30 | 30 | 30 | 30 | 30 | 25.0 | 0 | 0 |
| Component (b) | Irgacure OXE-02<4> | 0 | 0 | 0 | 0 | 0 | 0 | 0.75 | 0.75 | 0.75 | 0.75 | 0.75 |
| | KAYACURE DETX-S<5> | 0 | 0 | 0 | 0 | 0 | 0 | 0.3 | 0.3 | 0.3 | 0.3 | 0.3 |
| | Irgacure OXE-03<6> | 0.75 | 0.5 | 0.4 | 0.2 | 0.99 | 0.15 | 0 | 0 | 0 | 0 | 0 |
| | NCI-831<7> | 0.25 | 0.5 | 0.6 | 0.8 | 0.01 | 0.85 | 0.25 | 0.25 | 0.25 | 0.25 | 0.25 |
| | Irgacure 369<8> | 0 | 0 | 0 | 0 | 0 | 0 | 0 | 3.0 | 0 | 0 | 0 |
| Component (c) | MA-100R<9> | 0 | 0 | 0 | 0 | 0 | 0 | 0 | 0 | 0 | 0 | 0 |
| | Lumogen Black FK4280 <10> | 0 | 0 | 0 | 0 | 0 | 0 | 0 | 0 | 0 | 0 | 0 |
| | Heliogen Blue D7110F<11> | 0.5 | 0.5 | 0.5 | 0.5 | 0.5 | 0.5 | 0.5 | 0.5 | 0.5 | 0.5 | 0.5 |
| | PV Fast Orange GRL<12> | 0.5 | 0.5 | 0.5 | 0.5 | 0.5 | 0.5 | 0.5 | 0.5 | 0.5 | 0.5 | 0.5 |
| | Hostaperm Red violet ER02<13> | 0.5 | 0.5 | 0.5 | 0.5 | 0.5 | 0.5 | 0.5 | 0.5 | 0.5 | 0.5 | 0.5 |
| Component (d) | Art Pearl TK-800TR<14> | 15.0 | 15.0 | 15.0 | 15.0 | 15.0 | 15.0 | 15.0 | 15.0 | 14.0 | 14.0 | 14.0 |
| Component (e) | Exolit OP 935<15> | 22.0 | 22.0 | 22.0 | 22.0 | 22.0 | 22.0 | 22.0 | 22.0 | 16.0 | 16.0 | 16.0 |
| Other components | KAYARAD DPHA<16> | 5.0 | 5.0 | 5.0 | 5.0 | 5.0 | 5.0 | 5.0 | 5.0 | 5.0 | 5.0 | 5.0 |
| Thermosetting resin component | jer828<17> | 6.0 | 6.0 | 6.0 | 6.0 | 6.0 | 6.0 | 6.0 | 6.0 | 5.0 | 5.0 | 5.0 |
| | YX-4000K<18> | 4.0 | 4.0 | 4.0 | 4.0 | 4.0 | 4.0 | 4.0 | 4.0 | 7.0 | 7.0 | 7.0 |
| Filler component | Aerosil R-974<19> | 0 | 0 | 0 | 0 | 0 | 0 | 0 | 0 | 0 | 0 | 0 |
| Additive | DICY-7<20> | 0.5 | 0.5 | 0.5 | 0.5 | 0.5 | 0.5 | 0.5 | 0.5 | 1.0 | 1.0 | 1.0 |
| Defoaming agent | Floren AC-2000<21> | 1.0 | 1.0 | 1.0 | 1.0 | 1.0 | 1.0 | 1.0 | 1.0 | 1.0 | 1.0 | 1.0 |
| Solvent | EDGAC<22> and solvent contained in resin solution | 80 | 80 | 80 | 80 | 80 | 80 | 80 | 80 | 80 | 80 | 80 |

<1> A product name of a binder polymer (urethane modified epoxy (meth) acrylate, solid content acid value: 60.0 mg KOH/g) manufactured by Nippon Kayaku Co., Ltd.

<2> A product name of a binder polymer (bisphenol F type epoxy acrylate, solid content acid value: 100 mg KOH/g) manufactured by Nippon Kayaku Co., Ltd.

<3> A product name of a binder polymer (bisphenol A type epoxy acrylate, solid content acid value: 100 mg KOH/g) manufactured by Nippon Kayaku Co., Ltd.

<4> A product name of an oxime ester-based photopolymerization initiator manufactured by BASF Corporation <5> A product name of a thioxanthone-based photopolymerization initiator manufactured by Nippon Kayaku Co., Ltd.

<6> A product name of an oxime ester-based photopolymerization initiator manufactured by BASF Corporation <7> An oxime ester-based photopolymerization initiator manufactured by ADEKA Corporation <8> A product name of an α-aminoalkylphenone-based photopolymerization initiator manufactured by BASF Japan Corporation <9> A product name of a carbon black-based colorant manufactured by Mitsubishi Chemical Corporation <10> A product name of a perylene-based colorant manufactured by BASF Corporation <11> A product name of a phthalocyanine-based blue colorant manufactured by BASF Corporation <12> A product name of an orange colorant manufactured by Clariant Japan KK <13> A product name of a purple colorant manufactured by Clariant Japan KK <14> A product name of organic fine particles (urethane-based organic beads of carbonate skeleton, average particle size: 7.0 μm) manufactured by Negami Kogyo Co., Ltd.

<15> A product name of a phosphinate compound (diethylphosphinic acid aluminum salt, average particle size: 2.5 μm) manufactured by Clariant Japan KK <16> A product name of a radical polymerizable compound (dipentaerythritol penta and hexaacrylate) manufactured by Nippon Kayaku Co., Ltd.

<17> A product name of a p-aminophenol type epoxy resin (epoxy equivalent weight 96 g/eq) manufactured by Japan Epoxy Resin Co., Ltd.

<18> A product name of a bifunctional epoxy resin manufactured by Mitsubishi Chemical Corporation <19> A product name of anhydrous silica manufactured by Nippon Aerosil Co., Ltd.

<20> A product name of an additive (dicyandiamide) manufactured by Japan Epoxy Resins Co., Ltd.

<21> A product name of a butadiene-based defoaming agent manufactured by Kyoeisha Chemical Co., Ltd.

<22> A product name of a solvent (ethyldiglycol acetate) manufactured by Daicel Chemical Industries, Ltd.

<23> A product name of an epoxy resin curable carboxyl group-containing polyester resin (acid value: 52-58 mg KOH/g) manufactured by DIC Corporation <24> A product name of organic fine particles (acrylic organic beads, average particle size: 6.0 μm) manufactured by Negami Kogyo Co., Ltd.

<Preparation of Black Resin Cured Film on Polyimide Film (Preparation of Polyimide with Black Resin Cured Film)>

On a polyimide film having a thickness of 25 μm obtained by subjecting a polyimide film having a thickness of 25 μm (manufactured by Kaneka Corporation under a product name 25NPI) and a flexible copper-clad laminated plate (a thickness of a copper foil is 12 μm; a polyimide film is PIXEO BP manufactured by Kaneka Corporation) to full etching using a ferric chloride solution, or, on a polyimide film having a thickness of 25 μm obtained by subjecting Espanex M manufactured by Nippon Steel & Sumikin Chemical Co. Ltd. to full etching using a ferric chloride solution, the black resin composition was printed in an area of 180 mm×270 mm and was dried for 20 minutes at 80° C. such that a final dry thickness is 20, 40, 60, 70, or 80 μm, and thereafter, was exposed by placing a negative photomask with (line width)/(space width)=(50-200 μm)/(400 μm) and (line width: 50-150 μm)/(line length: 150-2000 μm) and irradiating ultraviolet light of an integrated exposure amount of 400 mJ/cm². For the above printing, a Minomatto 5575 screen printing machine (tilt type small screen printer) manufactured by Minogroup, Co., Ltd. was used. Next, using a solution obtained by heating a 1.0% by weight aqueous solution of sodium carbonate to 30° C., spray development was performed for 60 seconds by adjusting a spray impact of a full cone nozzle type spray or a flat nozzle type spray to a calculated value of 0.05-15.0 kg/cm². After the development, washing was thoroughly performed with pure water without using a spray, and thereafter, heating and curing were performed for 90 minutes in an oven at 160° C., and a polyimide with a black resin cured film was produced.

<Evaluation of Undercut of Black Resin Composition>

Values of the distance (U) from the intersection point between the vertical line (L) (of the substrate-adhered edge (E) of the black resin cured film (A) and the polyimide (B)) and the top portion of the black resin cured film to the edge of the top portion in Blending Examples 1-16 and Blending Examples 19-37 for calculated values of a spray impact of a full cone nozzle type spray or a flat nozzle type spray are listed in Tables 5-9. Further, "×" was used to indicate a condition where a fine line did not remain and was peeled off, and "×2" was used to indicate a condition where a development residue was generated.

TABLE 5

| Spray nozzle shape | Spray impact (kg/cm²) | Thickness (um) | Blending Example 1 | Blending Example 2 | Blending Example 3 | Blending Example 4 | Blending Example 5 | Blending Example 6 | Blending Example 7 | Blending Example 8 |
|---|---|---|---|---|---|---|---|---|---|---|
| Full cone type | 0.05 | 40 | 2 | 2 | 3 | 2 | 3 | 0 | 0 | 3 |
| | 0.10 | 40 | 4 | 4 | 4 | 4 | 5 | 2 | 2 | 6 |
| | 0.50 | 40 | 6 | 6 | 6 | 6 | 7 | 4 | 4 | 10 |
| | 1.00 | 40 | 7 | 7 | 7 | 8 | 8 | 5 | 5 | 12 |
| | 5.00 | 40 | 10 | 10 | 11 | 10 | 10 | 8 | 8 | 15 |
| | 10.00 | 40 | 20 | 20 | 21 | 20 | 18 | 14 | 14 | 22 |
| | 12.00 | 40 | 22 | 23 | 23 | 22 | 22 | 20 | 20 | 25 |
| | 15.00 | 40 | 30 | 32 | 33 | 33 | 32 | 25 | 25 | 30 |
| Flat type | 0.50 | 40 | 6 | 6 | 6 | 6 | 7 | 4 | 4 | 10 |
| | 5.00 | 40 | 10 | 10 | 11 | 10 | 10 | 9 | 9 | 15 |
| | 10.00 | 40 | 20 | 20 | 21 | 20 | 18 | 14 | 14 | 23 |
| | 12.00 | 40 | 23 | 23 | 24 | 22 | 22 | 20 | 20 | 25 |
| Full cone type | 5.00 | 60 | 15 | 15 | 15 | 15 | 15 | 12 | 12 | 18 |
| | 5.00 | 70 | 18 | 18 | 19 | 18 | 19 | 17 | 17 | 20 |
| | 10.00 | 70 | 22 | 23 | 23 | 22 | 22 | 20 | 20 | 25 |
| | 0.05 | 70 | 2 | 2 | 2 | 2 | 2 | 4 | 4 | 2 |
| | 0.05 | 80 | x2 | x2 | x2 | x2 | x2 | x2 | x2 | x2 |
| | 12.00 | 80 | 32 | 30 | 33 | 32 | 30 | 25 | 25 | x |

| | Spray nozzle shape | Spray impact (kg/cm²) | Thickness (um) | Blending Example 9 | Blending Example 10 | Blending Example 11 | Blending Example 12 | Blending Example 13 | Blending Example 14 |
|---|---|---|---|---|---|---|---|---|---|
| | Full cone type | 0.05 | 40 | 0 | 0 | 5 | 2 | 2 | 2 |
| | | 0.10 | 40 | 2 | 2 | 8 | 4 | 5 | 4 |
| | | 0.50 | 40 | 5 | 5 | 11 | 8 | 8 | 8 |
| | | 1.00 | 40 | 7 | 6 | 12 | 10 | 9 | 9 |
| | | 5.00 | 40 | 8 | 7 | 13 | 10 | 12 | 11 |
| | | 10.00 | 40 | 15 | 15 | 22 | 21 | 21 | 21 |
| | | 12.00 | 40 | 20 | 20 | 25 | 24 | 24 | 25 |
| | | 15.00 | 40 | 25 | 25 | x | 30 | 30 | 30 |
| | Flat type | 0.50 | 40 | 5 | 5 | 11 | 8 | 8 | 8 |
| | | 5.00 | 40 | 8 | 7 | 13 | 10 | 12 | 11 |
| | | 10.00 | 40 | 16 | 16 | 22 | 21 | 21 | 21 |
| | | 12.00 | 40 | 20 | 20 | 25 | 24 | 24 | 25 |
| | Full cone type | 5.00 | 60 | 12 | 12 | 18 | 14 | 14 | 15 |
| | | 5.00 | 70 | 16 | 16 | 20 | 18 | 18 | 19 |
| | | 10.00 | 70 | 20 | 20 | 25 | 24 | 24 | 25 |
| | | 0.05 | 70 | 4 | 4 | 2 | 2 | 2 | 2 |
| | | 0.05 | 80 | x2 | x2 | x2 | x2 | x2 | x2 |
| | | 12.00 | 80 | 25 | 25 | x | 35 | 35 | 35 |

The substrate was PIXEO BP; the test was performed at line width/line length = 100 μm/500 μm.

TABLE 6

| Spray nozzle shape | Spray impact (kg/cm²) | Thickness (µm) | Substrate | Line width/ Line length (µm) | Blending Example 2 | Blending Example 6 | Blending Example 7 | Blending Example 9 | Blending Example 10 |
|---|---|---|---|---|---|---|---|---|---|
| Full cone type | 0.10 | 40 | PIXEO BP | 100/500 | 4 | 2 | 2 | 2 | 2 |
| | 0.10 | 70 | PIXEO BP | 100/500 | 5 | 4 | 4 | 3 | 3 |
| | 1.00 | 40 | 25NPI | 50/1000 | 9 | 7 | 6 | 7 | 7 |
| | 1.00 | 40 | 25NPI | 100/500 | 9 | 7 | 6 | 7 | 7 |
| | 1.00 | 40 | 25NPI | 100/1000 | 9 | 7 | 6 | 7 | 7 |
| | 1.00 | 40 | 25NPI | 100/2000 | 10 | 7 | 7 | 8 | 8 |
| | 1.00 | 40 | PIXEO BP | 50/1000 | 7 | 5 | 5 | 7 | 6 |
| | 1.00 | 40 | PIXEO BP | 100/500 | 7 | 5 | 5 | 7 | 6 |
| | 1.00 | 40 | PIXEO BP | 100/1000 | 7 | 5 | 5 | 7 | 6 |
| | 1.00 | 40 | PIXEO BP | 100/2000 | 7 | 5 | 5 | 7 | 6 |
| | 1.00 | 40 | Espanex-M | 50/1000 | 8 | 6 | 6 | 7 | 6 |
| | 1.00 | 40 | Espanex-M | 100/500 | 8 | 6 | 6 | 7 | 6 |
| | 1.00 | 40 | Espanex-M | 100/1000 | 8 | 7 | 6 | 7 | 6 |
| | 1.00 | 40 | Espanex-M | 100/2000 | 10 | 7 | 7 | 8 | 8 |
| | 1.00 | 70 | 25NPI | 100/500 | 17 | 15 | 15 | 14 | 15 |
| | 1.00 | 70 | 25NPI | 100/1000 | 17 | 15 | 15 | 14 | 15 |
| | 1.00 | 70 | 25NPI | 100/2000 | 17 | 15 | 15 | 14 | 15 |
| | 1.00 | 70 | PIXEO BP | 50/1000 | 14 | 14 | 13 | 13 | 13 |
| | 1.00 | 70 | PIXEO BP | 100/500 | 14 | 14 | 13 | 13 | 13 |
| | 1.00 | 70 | PIXEO BP | 100/1000 | 16 | 14 | 13 | 13 | 13 |
| | 1.00 | 70 | PIXEO BP | 100/2000 | 16 | 14 | 13 | 13 | 13 |
| | 1.00 | 70 | Espanex-M | 50/1000 | 17 | 15 | 15 | 14 | 15 |
| | 1.00 | 70 | Espanex-M | 100/500 | 17 | 15 | 15 | 14 | 15 |
| | 1.00 | 70 | Espanex-M | 100/1000 | 17 | 15 | 15 | 14 | 15 |
| | 1.00 | 70 | Espanex-M | 100/2000 | 17 | 15 | 15 | 14 | 15 |
| | 5.00 | 40 | PIXEO BP | 100/500 | 10 | 7 | 7 | 8 | 8 |
| | 5.00 | 70 | PIXEO BP | 100/500 | 18 | 17 | 17 | 16 | 16 |
| | 10.00 | 40 | PIXEO BP | 100/500 | 20 | 14 | 14 | 15 | 15 |
| | 10.00 | 70 | PIXEO BP | 100/500 | 23 | 20 | 20 | 20 | 20 |
| Flat type | 0.10 | 40 | PIXEO BP | 100/500 | 4 | 2 | 2 | 2 | 2 |
| | 0.10 | 70 | PIXEO BP | 100/500 | 5 | 4 | 4 | 3 | 3 |
| | 10.00 | 40 | PIXEO BP | 100/500 | 20 | 14 | 14 | 15 | 15 |
| | 10.00 | 70 | PIXEO BP | 100/500 | 23 | 20 | 20 | 20 | 20 |

TABLE 7

| Spray nozzle shape | Spray impact (kg/cm²) | Thickness (µm) | Substrate | Line width/ Line length (µm) | Blending Example 15 | Blending Example 16 | Blending Example 6 | Blending Example 7 |
|---|---|---|---|---|---|---|---|---|
| Full cone type | 0.10 | 40 | PIXEO BP | 100/500 | x2 | x2 | 2 | 2 |
| | 0.10 | 70 | PIXEO BP | 100/500 | x2 | x2 | 4 | 4 |
| | 1.00 | 40 | 25NPI | 50/1000 | x2 | x2 | 7 | 6 |
| | 1.00 | 40 | 25NPI | 100/500 | x2 | x2 | 7 | 6 |
| | 1.00 | 40 | 25NPI | 100/1000 | x2 | x2 | 7 | 6 |
| | 1.00 | 40 | 25NPI | 100/2000 | x2 | x2 | 7 | 7 |
| | 1.00 | 40 | PIXEO BP | 50/1000 | x2 | x2 | 5 | 5 |
| | 1.00 | 40 | PIXEO BP | 100/500 | x2 | x2 | 5 | 5 |
| | 1.00 | 40 | PIXEO BP | 100/1000 | x2 | x2 | 5 | 5 |
| | 1.00 | 40 | PIXEO BP | 100/2000 | x2 | x2 | 5 | 5 |
| | 1.00 | 40 | Espanex-M | 50/1000 | x2 | x2 | 6 | 6 |
| | 1.00 | 40 | Espanex-M | 100/500 | x2 | x2 | 6 | 6 |
| | 1.00 | 40 | Espanex-M | 100/1000 | x2 | x2 | 7 | 6 |
| | 1.00 | 40 | Espanex-M | 100/2000 | x2 | x2 | 7 | 7 |
| | 1.00 | 70 | 25NPI | 100/500 | x2 | x2 | 15 | 15 |
| | 1.00 | 70 | 25NPI | 100/1000 | x2 | x2 | 15 | 15 |
| | 1.00 | 70 | 25NPI | 100/2000 | x2 | x2 | 15 | 15 |
| | 1.00 | 70 | PIXEO BP | 50/1000 | x2 | x2 | 14 | 13 |
| | 1.00 | 70 | PIXEO BP | 100/500 | x2 | x2 | 14 | 13 |
| | 1.00 | 70 | PIXEO BP | 100/1000 | x2 | x2 | 14 | 13 |
| | 1.00 | 70 | PIXEO BP | 100/2000 | x2 | x2 | 14 | 13 |
| | 1.00 | 70 | Espanex-M | 50/1000 | x2 | x2 | 15 | 15 |
| | 1.00 | 70 | Espanex-M | 100/500 | x2 | x2 | 15 | 15 |
| | 1.00 | 70 | Espanex-M | 100/1000 | x2 | x2 | 15 | 15 |
| | 1.00 | 70 | Espanex-M | 100/2000 | x2 | x2 | 15 | 15 |
| | 5.00 | 40 | PIXEO BP | 100/500 | x2 | x2 | 7 | 7 |
| | 5.00 | 70 | PIXEO BP | 100/500 | x2 | x2 | 17 | 17 |
| | 10.00 | 40 | PIXEO BP | 100/500 | x | x | 14 | 14 |
| | 10.00 | 70 | PIXEO BP | 100/500 | x2 | x2 | 20 | 20 |
| | 12.50 | 20 | PIXEO BP | 100/500 | x | x | 32 | 27 |
| | 15.00 | 20 | PIXEO BP | 100/500 | x | x | 38 | 30 |
| | 12.50 | 40 | PIXEO BP | 150/150 | x | x | 28 | 26 |

TABLE 7-continued

| Spray nozzle shape | Spray impact (kg/cm²) | Thickness (μm) | Substrate | Line width/ Line length (μm) | Blending Example 15 | Blending Example 16 | Blending Example 6 | Blending Example 7 |
|---|---|---|---|---|---|---|---|---|
| Flat type | 0.10 | 40 | PIXEO BP | 100/500 | x2 | x2 | 2 | 2 |
| | 0.10 | 70 | PIXEO BP | 100/500 | x2 | x2 | 4 | 4 |
| | 10.00 | 40 | PIXEO BP | 100/500 | x | x | 14 | 14 |
| | 10.00 | 70 | PIXEO BP | 100/500 | x2 | x2 | 20 | 20 |
| | 12.50 | 20 | PIXEO BP | 100/500 | x | x | 34 | 30 |
| | 15.00 | 20 | PIXEO BP | 100/500 | x | x | 40 | 35 |
| | 12.50 | 40 | PIXEO BP | 150/150 | x | x | 30 | 28 |

TABLE 8

| Spray nozzle shape | Spray impact (kg/cm²) | Thickness (μm) | Blending Example 5 | Blending Example 6 | Blending Example 7 | Blending Example 20 | Blending Example 21 | Blending Example 22 | Blending Example 23 | Blending Example 24 | Blending Example 25 |
|---|---|---|---|---|---|---|---|---|---|---|---|
| Full cone type | 0.05 | 40 | 3 | 0 | 0 | 0 | 0 | 0 | 0 | 0 | 0 |
| | 1.00 | 40 | 8 | 5 | 5 | 4 | 0 | 0 | 0 | 5 | 5 |
| | 5.00 | 40 | 10 | 8 | 8 | 6 | 0 | 0 | 3 | 8 | 8 |
| | 10.00 | 40 | 18 | 14 | 14 | 14 | 8 | 8 | 12 | 14 | 12 |
| | 12.00 | 40 | 22 | 20 | 20 | 16 | 12 | 12 | 14 | 18 | 18 |
| | 15.00 | 40 | 32 | 25 | 25 | 22 | 18 | 18 | 22 | 23 | 22 |
| Flat type | 0.50 | 40 | 7 | 4 | 4 | 3 | 0 | 2 | 4 | 4 | 4 |
| | 5.00 | 40 | 10 | 9 | 9 | 6 | 5 | 6 | 10 | 9 | 9 |
| | 10.00 | 40 | 18 | 14 | 14 | 12 | 8 | 10 | 12 | 14 | 13 |
| | 12.00 | 40 | 22 | 20 | 20 | 16 | 12 | 14 | 18 | 20 | 20 |
| Full cone type | 5.00 | 60 | 15 | 12 | 12 | 10 | 8 | 10 | 12 | 12 | 12 |
| | 5.00 | 70 | 19 | 17 | 17 | 16 | 12 | 14 | 16 | 16 | 17 |
| | 10.00 | 70 | 22 | 20 | 20 | 18 | 18 | 18 | 20 | 20 | 20 |
| | 0.05 | 70 | 2 | 4 | 4 | 2 | 0 | 0 | 2 | 4 | 4 |
| | 12.00 | 80 | 30 | 25 | 25 | 22 | 14 | 18 | 22 | 25 | 22 |

| Spray nozzle shape | Spray impact (kg/cm²) | Thickness (μm) | Blending Example 26 | Blending Example 27 | Blending Example 28 | Blending Example 29 | Blending Example 30 | Blending Example 31 | Blending Example 32 |
|---|---|---|---|---|---|---|---|---|---|
| Full cone type | 0.05 | 40 | 0 | 0 | 0 | 0 | 0 | 0 | 0 |
| | 1.00 | 40 | 0 | 0 | 0 | 0 | 0 | 4 | 5 |
| | 5.00 | 40 | 6 | 4 | 0 | 0 | 3 | 6 | 8 |
| | 10.00 | 40 | 14 | 12 | 8 | 8 | 12 | 14 | 14 |
| | 12.00 | 40 | 18 | 14 | 12 | 12 | 14 | 20 | 18 |
| | 15.00 | 40 | 22 | 20 | 18 | 18 | 22 | 25 | 22 |
| Flat type | 0.50 | 40 | 4 | 0 | 0 | 0 | 2 | 2 | 4 |
| | 5.00 | 40 | 8 | 5 | 5 | 5 | 10 | 9 | 8 |
| | 10.00 | 40 | 14 | 10 | 8 | 10 | 12 | 14 | 12 |
| | 12.00 | 40 | 20 | 14 | 12 | 14 | 18 | 20 | 20 |
| Full cone type | 5.00 | 60 | 12 | 10 | 8 | 10 | 12 | 12 | 12 |
| | 5.00 | 70 | 16 | 16 | 20 | 18 | 18 | 17 | 17 |
| | 10.00 | 70 | 20 | 18 | 18 | 18 | 20 | 20 | 20 |
| | 0.05 | 70 | 4 | 2 | 0 | 0 | 2 | 4 | 2 |
| | 12.00 | 80 | 20 | 18 | 15 | 18 | 20 | 25 | 22 |

The substrate was PIXEO BP; the test was performed at line width/line length = 100 μm/500 μm.

TABLE 9

| Spray nozzle shape | Spray impact (kg/cm²) | Thickness (μm) | Blending Example 33 | Blending Example 34 | Blending Example 35 | Blending Example 36 | Blending Example 37 | Blending Example 38 |
|---|---|---|---|---|---|---|---|---|
| Full cone type | 0.05 | 40 | 0 | 0 | 0 | 0 | 0 | 0 |
| | 1.00 | 40 | 0 | 0 | 0 | 0 | 0 | 0 |
| | 5.00 | 40 | 5 | 0 | 0 | 0 | 0 | 0 |
| | 10.00 | 40 | 13 | 6 | 6 | 6 | 6 | 6 |
| | 12.00 | 40 | 17 | 10 | 12 | 10 | 10 | 10 |
| | 15.00 | 40 | 22 | 16 | 16 | 18 | 16 | 16 |
| Flat type | 0.50 | 40 | 4 | 0 | 0 | 0 | 0 | 0 |
| | 5.00 | 40 | 7 | 0 | 0 | 0 | 2 | 1 |
| | 10.00 | 40 | 14 | 6 | 8 | 6 | 6 | 6 |
| | 12.00 | 40 | 20 | 12 | 10 | 10 | 12 | 12 |

TABLE 9-continued

| Spray nozzle shape | Spray impact (kg/cm²) | Thickness (μm) | Blending Example 33 | Blending Example 34 | Blending Example 35 | Blending Example 36 | Blending Example 37 | Blending Example 38 |
|---|---|---|---|---|---|---|---|---|
| Full cone type | 5.00 | 60 | 12 | 2 | 2 | 2 | 2 | 2 |
| | 5.00 | 70 | 16 | 10 | 12 | 10 | 10 | 10 |
| | 10.00 | 70 | 20 | 15 | 15 | 15 | 15 | 15 |
| | 0.05 | 70 | 4 | 0 | 0 | 0 | 0 | 0 |
| | 12.00 | 80 | 21 | 18 | 16 | 18 | 16 | 16 |

The substrate was PIXEO BP; the test was performed at line width/line length = 100 μm/500 μm.

Further, evaluation of adhesion after a gold plating chemical liquid and flux solder test of a polyimide with a black resin cured film prepared under each condition using the above-prepared Blending Examples 1-14 was performed using the following method. Evaluation results are listed in Tables 10 and 11.

<Electroless Gold Plating Treatment Process>

A support was adhered to the polyimide side of the polyimide with a black resin cured film prepared above and an electroless gold plating treatment was performed according to the following. An electroless gold plating treatment process was performed according to standard procedures of electroless gold-plated flash gold 330 of Okuno Pharmaceutical Co., Ltd. as follows.

(I) Degreasing treatment, ICP Clean S-135K, 40° C., 4 minutes, (II) Etching treatment, sulfuric acid 10 mL/L, sodium persulfate acid 100 g/L, copper sulfate pentahydrate, 8 g/L, adjusted to 1 L with ion exchanged water, 30° C., 1 minute, (III) Catalyzed treatment, ICP accelerator (Pd: 0.04%), 30° C., 1 minute, (IV) Electroless nickel plating treatment, ICP-Nicoloni FPF, 84° C., 30 minutes, (V) Gold plating treatment, flash gold 330, 80° C., 8 minutes.

After the electroless gold plating treatment, water washing was performed at a room temperature and drying treatment was performed at 100° C. for 10 seconds.

(i) Evaluation of Adhesion after Gold Plating Test

A tape was pasted on the polyimide with a black resin cured film so as to be perpendicular to a wiring direction of the polyimide with a black resin cured film, and was firmly rubbed so that air will not enter a space portion. Thereafter, a peeling test was performed at a peeling direction of about 60 degrees.

○: Tape peeling did not occur,

Δ: Tape peeling partially occurred, and remaining fine line pattern was 80%, x: Tape peeling occurred, and remaining fine line pattern was less than 80%.

Evaluation results are listed in Tables 10 and 11.

TABLE 10

| Spray nozzle shape | Spray impact (kg/cm²) | Thickness (um) | Blending Example 1 | Blending Example 2 | Blending Example 3 | Blending Example 4 | Blending Example 5 | Blending Example 6 | Blending Example 7 | Blending Example 8 |
|---|---|---|---|---|---|---|---|---|---|---|
| Full cone type | 0.05 | 40 | ○ | ○ | ○ | ○ | ○ | ○ | ○ | ○ |
| | 0.10 | 40 | ○ | ○ | ○ | ○ | ○ | ○ | ○ | ○ |
| | 0.50 | 40 | ○ | ○ | ○ | ○ | ○ | ○ | ○ | ○ |
| | 1.00 | 40 | ○ | ○ | ○ | ○ | ○ | ○ | ○ | ○ |
| | 5.00 | 40 | ○ | ○ | ○ | ○ | ○ | ○ | ○ | ○ |
| | 10.00 | 40 | ○ | ○ | ○ | ○ | ○ | ○ | ○ | ○ |
| | 12.00 | 40 | ○ | ○ | ○ | ○ | ○ | ○ | ○ | ○ |
| | 15.00 | 40 | Δ | Δ | Δ | Δ | Δ | ○ | ○ | Δ |
| Flat type | 0.50 | 40 | ○ | ○ | ○ | ○ | ○ | ○ | ○ | ○ |
| | 5.00 | 40 | ○ | ○ | ○ | ○ | ○ | ○ | ○ | ○ |
| | 10.00 | 40 | ○ | ○ | ○ | ○ | ○ | ○ | ○ | ○ |
| | 12.00 | 40 | ○ | ○ | ○ | ○ | ○ | ○ | ○ | ○ |
| Full cone type | 5.00 | 60 | ○ | ○ | ○ | ○ | ○ | ○ | ○ | ○ |
| | 5.00 | 70 | ○ | ○ | ○ | ○ | ○ | ○ | ○ | ○ |
| | 10.00 | 70 | ○ | ○ | ○ | ○ | ○ | ○ | ○ | ○ |
| | 0.05 | 70 | ○ | ○ | ○ | ○ | ○ | ○ | ○ | ○ |
| | 0.05 | 80 | — | — | — | — | — | — | — | — |
| | 12.00 | 80 | Δ | Δ | Δ | Δ | Δ | ○ | ○ | — |

| Spray nozzle shape | Spray impact (kg/cm²) | Thickness (um) | Blending Example 9 | Blending Example 10 | Blending Example 11 | Blending Example 12 | Blending Example 13 | Blending Example 14 |
|---|---|---|---|---|---|---|---|---|
| Full cone type | 0.05 | 40 | ○ | ○ | ○ | ○ | ○ | ○ |
| | 0.10 | 40 | ○ | ○ | ○ | ○ | ○ | ○ |
| | 0.50 | 40 | ○ | ○ | ○ | ○ | ○ | ○ |
| | 1.00 | 40 | ○ | ○ | ○ | ○ | ○ | ○ |
| | 5.00 | 40 | ○ | ○ | ○ | ○ | ○ | ○ |
| | 10.00 | 40 | ○ | ○ | ○ | ○ | ○ | ○ |
| | 12.00 | 40 | ○ | ○ | ○ | ○ | ○ | ○ |
| | 15.00 | 40 | ○ | ○ | — | Δ | Δ | Δ |

TABLE 10-continued

| | | | | | | | | | |
|---|---|---|---|---|---|---|---|---|---|
| Flat | 0.50 | 40 | ○ | ○ | ○ | ○ | ○ | ○ | |
| type | 5.00 | 40 | ○ | ○ | ○ | ○ | ○ | ○ | |
| | 10.00 | 40 | ○ | ○ | ○ | ○ | ○ | ○ | |
| | 12.00 | 40 | ○ | ○ | ○ | ○ | ○ | ○ | |
| Full | 5.00 | 60 | ○ | ○ | ○ | ○ | ○ | ○ | |
| cone | 5.00 | 70 | ○ | ○ | ○ | ○ | ○ | ○ | |
| type | 10.00 | 70 | ○ | ○ | ○ | ○ | ○ | ○ | |
| | 0.05 | 70 | ○ | ○ | ○ | ○ | ○ | ○ | |
| | 0.05 | 80 | — | — | — | — | — | — | |
| | 12.00 | 80 | ○ | ○ | — | x | x | x | |

The substrate was PIXEO BP; and the test was performed at line width/line length = 100 μm/500 μm.

TABLE 11

| Spray nozzle shape | Spray impact (kg/cm$^2$) | Thickness (μm) | Substrate | Line width/ Line length (μm) | Blending Example 2 | Blending Example 6 | Blending Example 7 | Blending Example 9 | Blending Example 10 |
|---|---|---|---|---|---|---|---|---|---|
| Full | 0.10 | 40 | PIXEO BP | 100/500 | ○ | ○ | ○ | ○ | ○ |
| cone | 0.10 | 70 | PIXEO BP | 100/500 | ○ | ○ | ○ | ○ | ○ |
| type | 1.00 | 40 | 25NPI | 50/1000 | ○ | ○ | ○ | ○ | ○ |
| | 1.00 | 40 | 25NPI | 100/500 | ○ | ○ | ○ | ○ | ○ |
| | 1.00 | 40 | 25NPI | 100/1000 | ○ | ○ | ○ | ○ | ○ |
| | 1.00 | 40 | 25NPI | 100/2000 | ○ | ○ | ○ | ○ | ○ |
| | 1.00 | 40 | PIXEO BP | 50/1000 | ○ | ○ | ○ | ○ | ○ |
| | 1.00 | 40 | PIXEO BP | 100/500 | ○ | ○ | ○ | ○ | ○ |
| | 1.00 | 40 | PIXEO BP | 100/1000 | ○ | ○ | ○ | ○ | ○ |
| | 1.00 | 40 | PIXEO BP | 100/2000 | ○ | ○ | ○ | ○ | ○ |
| | 1.00 | 40 | Espanex-M | 50/1000 | ○ | ○ | ○ | ○ | ○ |
| | 1.00 | 40 | Espanex-M | 100/500 | ○ | ○ | ○ | ○ | ○ |
| | 1.00 | 40 | Espanex-M | 100/1000 | ○ | ○ | ○ | ○ | ○ |
| | 1.00 | 40 | Espanex-M | 100/2000 | ○ | ○ | ○ | ○ | ○ |
| | 1.00 | 70 | 25NPI | 100/500 | ○ | ○ | ○ | ○ | ○ |
| | 1.00 | 70 | 25NPI | 100/1000 | ○ | ○ | ○ | ○ | ○ |
| | 1.00 | 70 | 25NPI | 100/2000 | ○ | ○ | ○ | ○ | ○ |
| | 1.00 | 70 | PIXEO BP | 50/1000 | ○ | ○ | ○ | ○ | ○ |
| | 1.00 | 70 | PIXEO BP | 100/500 | ○ | ○ | ○ | ○ | ○ |
| | 1.00 | 70 | PIXEO BP | 100/1000 | ○ | ○ | ○ | ○ | ○ |
| | 1.00 | 70 | PIXEO BP | 100/2000 | ○ | ○ | ○ | ○ | ○ |
| | 1.00 | 70 | Espanex-M | 50/1000 | ○ | ○ | ○ | ○ | ○ |
| | 1.00 | 70 | Espanex-M | 100/500 | ○ | ○ | ○ | ○ | ○ |
| | 1.00 | 70 | Espanex-M | 100/1000 | ○ | ○ | ○ | ○ | ○ |
| | 1.00 | 70 | Espanex-M | 100/2000 | ○ | ○ | ○ | ○ | ○ |
| | 5.00 | 40 | PIXEO BP | 100/500 | ○ | ○ | ○ | ○ | ○ |
| | 5.00 | 70 | PIXEO BP | 100/500 | ○ | ○ | ○ | ○ | ○ |
| | 10.00 | 40 | PIXEO BP | 100/500 | ○ | ○ | ○ | ○ | ○ |
| | 10.00 | 70 | PIXEO BP | 100/500 | ○ | ○ | ○ | ○ | ○ |
| Flat | 0.10 | 40 | PIXEO BP | 100/500 | ○ | ○ | ○ | ○ | ○ |
| type | 0.10 | 70 | PIXEO BP | 100/500 | ○ | ○ | ○ | ○ | ○ |
| | 10.00 | 40 | PIXEO BP | 100/500 | ○ | ○ | ○ | ○ | ○ |
| | 10.00 | 70 | PIXEO BP | 100/500 | ○ | ○ | ○ | ○ | ○ |

(ii) Evaluation of Adhesion after Flux Solder Heat Resistance Test

A support was adhered to the polyimide side of the polyimide with a black resin cured film and JS-EU-31 manufactured by Hiroki Co., Ltd. was coated on a surface of the black resin cured film. Thereafter, the resulting object was floated in a completely molten solder bath at 280° C. such that a surface coated with the black resin cured film was in contact with the molten solder, and the object was pulled up after 10 seconds. The operation was performed three times. In the same manner as (i) the evaluation of adhesion after the gold plating test, a tape was pasted on the polyimide with the black resin cured film so as to be perpendicular to a wiring direction of the polyimide with the black resin cured film, and was firmly rubbed so that air will not enter a space portion. Thereafter, a peeling test was performed at a peeling direction of about 60 degrees.

○: Tape peeling did not occur,

Δ: Tape peeling partially occurred, and remaining fine line pattern was 80%, x: Tape peeling occurred, and remaining fine line pattern was less than 80%.

Evaluation results are listed in Tables 12 and 13.

TABLE 12

| Spray nozzle shape | Spray impact (kg/cm$^2$) | Thickness (μm) | Blending Example 1 | Blending Example 2 | Blending Example 3 | Blending Example 4 | Blending Example 5 | Blending Example 6 | Blending Example 7 | Blending Example 8 |
|---|---|---|---|---|---|---|---|---|---|---|
| Full cone type | 0.05 | 40 | ○ | ○ | ○ | ○ | ○ | ○ | ○ | ○ |
|  | 0.10 | 40 | ○ | ○ | ○ | ○ | ○ | ○ | ○ | ○ |
|  | 0.50 | 40 | ○ | ○ | ○ | ○ | ○ | ○ | ○ | ○ |
|  | 1.00 | 40 | ○ | ○ | ○ | ○ | ○ | ○ | ○ | ○ |
|  | 5.00 | 40 | ○ | ○ | ○ | ○ | ○ | ○ | ○ | ○ |
|  | 10.00 | 40 | ○ | ○ | ○ | ○ | ○ | ○ | ○ | ○ |
|  | 12.00 | 40 | ○ | ○ | ○ | ○ | ○ | ○ | ○ | ○ |
|  | 15.00 | 40 | Δ | Δ | Δ | Δ | Δ | ○ | ○ | Δ |
| Flat type | 0.50 | 40 | ○ | ○ | ○ | ○ | ○ | ○ | ○ | ○ |
|  | 5.00 | 40 | ○ | ○ | ○ | ○ | ○ | ○ | ○ | ○ |
|  | 10.00 | 40 | ○ | ○ | ○ | ○ | ○ | ○ | ○ | ○ |
|  | 12.00 | 40 | ○ | ○ | ○ | ○ | ○ | ○ | ○ | ○ |
| Full cone type | 5.00 | 60 | ○ | ○ | ○ | ○ | ○ | ○ | ○ | ○ |
|  | 5.00 | 70 | ○ | ○ | ○ | ○ | ○ | ○ | ○ | ○ |
|  | 10.00 | 70 | ○ | ○ | ○ | ○ | ○ | ○ | ○ | ○ |
|  | 0.05 | 70 | ○ | ○ | ○ | ○ | ○ | ○ | ○ | ○ |
|  | 0.05 | 80 | — | — | — | — | — | — | — | — |
|  | 12.00 | 80 | Δ | Δ | Δ | Δ | Δ | ○ | ○ | — |

| Spray nozzle shape | Spray impact (kg/cm$^2$) | Thickness (μm) | Blending Example 9 | Blending Example 10 | Blending Example 11 | Blending Example 12 | Blending Example 13 | Blending Example 14 |
|---|---|---|---|---|---|---|---|---|
| Full cone type | 0.05 | 40 | ○ | ○ | ○ | ○ | ○ | ○ |
|  | 0.10 | 40 | ○ | ○ | ○ | ○ | ○ | ○ |
|  | 0.50 | 40 | ○ | ○ | ○ | ○ | ○ | ○ |
|  | 1.00 | 40 | ○ | ○ | ○ | ○ | ○ | ○ |
|  | 5.00 | 40 | ○ | ○ | ○ | ○ | ○ | ○ |
|  | 10.00 | 40 | ○ | ○ | ○ | ○ | ○ | ○ |
|  | 12.00 | 40 | ○ | ○ | ○ | ○ | ○ | ○ |
|  | 15.00 | 40 | ○ | ○ | — | Δ | Δ | Δ |
| Flat type | 0.50 | 40 | ○ | ○ | ○ | ○ | ○ | ○ |
|  | 5.00 | 40 | ○ | ○ | ○ | ○ | ○ | ○ |
|  | 10.00 | 40 | ○ | ○ | ○ | ○ | ○ | ○ |
|  | 12.00 | 40 | ○ | ○ | ○ | ○ | ○ | ○ |
| Full cone type | 5.00 | 60 | ○ | ○ | ○ | ○ | ○ | ○ |
|  | 5.00 | 70 | ○ | ○ | ○ | ○ | ○ | ○ |
|  | 10.00 | 70 | ○ | ○ | ○ | ○ | ○ | ○ |
|  | 0.05 | 70 | ○ | ○ | ○ | ○ | ○ | ○ |
|  | 0.05 | 80 | — | — | — | — | — | — |
|  | 12.00 | 80 | ○ | ○ | — | X | X | X |

The substrate was PIXEO BP; and the test was performed at line width/line length = 100 μm/500 μm.

TABLE 13

| Spray nozzle shape | Spray impact (kg/cm$^2$) | Thickness (μm) | Substrate | Line width/Line length (μm) | Blending Example 2 | Blending Example 6 | Blending Example 7 | Blending Example 9 | Blending Example 10 |
|---|---|---|---|---|---|---|---|---|---|
| Full cone type | 0.10 | 40 | PIXEO BP | 100/500 | ○ | ○ | ○ | ○ | ○ |
|  | 0.10 | 70 | PIXEO BP | 100/500 | ○ | ○ | ○ | ○ | ○ |
|  | 1.00 | 40 | 25NPI | 50/1000 | ○ | ○ | ○ | ○ | ○ |
|  | 1.00 | 40 | 25NPI | 100/500 | ○ | ○ | ○ | ○ | ○ |
|  | 1.00 | 40 | 25NPI | 100/1000 | ○ | ○ | ○ | ○ | ○ |
|  | 1.00 | 40 | 25NPI | 100/2000 | ○ | ○ | ○ | ○ | ○ |
|  | 1.00 | 40 | PIXEO BP | 50/1000 | ○ | ○ | ○ | ○ | ○ |
|  | 1.00 | 40 | PIXEO BP | 100/500 | ○ | ○ | ○ | ○ | ○ |
|  | 1.00 | 40 | PIXEO BP | 100/1000 | ○ | ○ | ○ | ○ | ○ |
|  | 1.00 | 40 | PIXEO BP | 100/2000 | ○ | ○ | ○ | ○ | ○ |
|  | 1.00 | 40 | Espanex-M | 50/1000 | ○ | ○ | ○ | ○ | ○ |
|  | 1.00 | 40 | Espanex-M | 100/500 | ○ | ○ | ○ | ○ | ○ |
|  | 1.00 | 40 | Espanex-M | 100/1000 | ○ | ○ | ○ | ○ | ○ |
|  | 1.00 | 40 | Espanex-M | 100/2000 | ○ | ○ | ○ | ○ | ○ |
|  | 1.00 | 70 | 25NPI | 100/500 | ○ | ○ | ○ | ○ | ○ |
|  | 1.00 | 70 | 25NPI | 100/1000 | ○ | ○ | ○ | ○ | ○ |
|  | 1.00 | 70 | 25NPI | 100/2000 | ○ | ○ | ○ | ○ | ○ |
|  | 1.00 | 70 | PIXEO BP | 50/1000 | ○ | ○ | ○ | ○ | ○ |
|  | 1.00 | 70 | PIXEO BP | 100/500 | ○ | ○ | ○ | ○ | ○ |
|  | 1.00 | 70 | PIXEO BP | 100/1000 | ○ | ○ | ○ | ○ | ○ |
|  | 1.00 | 70 | PIXEO BP | 100/2000 | ○ | ○ | ○ | ○ | ○ |
|  | 1.00 | 70 | Espanex-M | 50/1000 | ○ | ○ | ○ | ○ | ○ |
|  | 1.00 | 70 | Espanex-M | 100/500 | ○ | ○ | ○ | ○ | ○ |

TABLE 13-continued

| Spray nozzle shape | Spray impact (kg/cm²) | Thickness (μm) | Substrate | Line width/ Line length (μm) | Blending Example 2 | Blending Example 6 | Blending Example 7 | Blending Example 9 | Blending Example 10 |
|---|---|---|---|---|---|---|---|---|---|
| | 1.00 | 70 | Espanex-M | 100/1000 | ○ | ○ | ○ | ○ | ○ |
| | 1.00 | 70 | Espanex-M | 100/2000 | ○ | ○ | ○ | ○ | ○ |
| | 5.00 | 40 | PIXEO BP | 100/500 | ○ | ○ | ○ | ○ | ○ |
| | 5.00 | 70 | PIXEO BP | 100/500 | ○ | ○ | ○ | ○ | ○ |
| | 10.00 | 40 | PIXEO BP | 100/500 | ○ | ○ | ○ | ○ | ○ |
| | 10.00 | 70 | PIXEO BP | 100/500 | ○ | ○ | ○ | ○ | ○ |
| Flat type | 0.10 | 40 | PIXEO BP | 100/500 | ○ | ○ | ○ | ○ | ○ |
| | 0.10 | 70 | PIXEO BP | 100/500 | ○ | ○ | ○ | ○ | ○ |
| | 10.00 | 40 | PIXEO BP | 100/500 | ○ | ○ | ○ | ○ | ○ |
| | 10.00 | 70 | PIXEO BP | 100/500 | ○ | ○ | ○ | ○ | ○ |

Further, evaluation of photosensitivity and the like of the black resin compositions of Blending Examples 1-14 was separately performed using the following method. Evaluation results are listed in Table 14. In the following evaluation, using the same method as the above <Preparation of Black Resin Cured Film on Polyimide Film>, the black resin composition was printed in an area of 250 mm×300 mm on each of the base material and was dried for 20 minutes at 80° C. such that a predetermined final dry thickness was achieved, and thereafter, was exposed by placing a negative photomask and irradiating ultraviolet light of an integrated exposure amount of 400 mJ/cm². Next, using a solution obtained by heating a 1.0% by weight aqueous solution of sodium carbonate to 30° C., spray development was performed for 60 seconds using a full cone type spray nozzle developing device at a discharge pressure of 1.5 kgf/mm² and a spray impact of 2.0 kg/cm². After the development, washing was thoroughly performed with pure water, and thereafter, heating and curing were performed for 90 minutes in an oven at 160° C., and a copper foil with a black resin cured film was produced.

TABLE 14

| Evaluation item | Blending Example 1 | Blending Example 2 | Blending Example 3 | Blending Example 4 | Blending Example 5 | Blending Example 6 | Blending Example 7 | Blending Example 8 |
|---|---|---|---|---|---|---|---|---|
| Blackness (L* value) | 23 | 23 | 23 | 23 | 24 | 26 | 26 | 15 |
| Photosensitivity | ○ | ○ | ○ | ○ | ○ | ○ | ○ | ○ |
| Solvent resistance | ○ | ○ | ○ | ○ | ○ | ○ | ○ | ○ |
| Folding endurance | ○ | ○ | ○ | ○ | ○ | ○ | ○ | ○ |
| Warp | ○ | ○ | ○ | ○ | ○ | ○ | ○ | ○ |
| Insulation reliability | ○ | ○ | ○ | ○ | ○ | ○ | ○ | ○ |
| Press tolerance | ○ | ○ | ○ | ○ | ○ | ○ | ○ | ○ |
| Solder heat resistance | ○ | ○ | ○ | ○ | ○ | ○ | ○ | ○ |
| Flux solder heat resistance | ○ | ○ | ○ | ○ | ○ | ○ | ○ | ○ |

| Evaluation item | Blending Example 9 | Blending Example 10 | Blending Example 11 | Blending Example 12 | Blending Example 13 | Blending Example 14 |
|---|---|---|---|---|---|---|
| Blackness (L* value) | 27 | 27 | 13 | 22 | 22 | 22 |
| Photosensitivity | ○ | ○ | ○ | ○ | ○ | ○ |
| Solvent resistance | ○ | ○ | ○ | ○ | ○ | ○ |
| Folding endurance | ○ | ○ | ○ | ○ | ○ | ○ |
| Warp | ○ | ○ | ○ | ○ | ○ | ○ |
| Insulation reliability | ○ | ○ | ○ | ○ | ○ | ○ |
| Press tolerance | ○ | ○ | ○ | ○ | ○ | ○ |
| Solder heat resistance | ○ | ○ | ○ | ○ | ○ | ○ |
| Flux solder heat resistance | ○ | ○ | ○ | ○ | ○ | ○ |

(iii) Blackness

As a method for measuring blackness of the black resin composition, a color difference meter manufactured by Nippon Denshoku Industries Co., Ltd.: 45-degree color difference meter (NR-11B) was used and values of an L*a*b* color system were measured according to JIS Z 8729. Here, an L* value was used as an indicator of the blackness.

(iv) Photosensitivity

Evaluation of photosensitivity was performed using a pattern of (line width)/(space width)=(100 μm)/(400 μm).

○: A clear photosensitive pattern of (line width)/(space width)=(100 μm)/(400 μm) was drawn on a surface of the polyimide film, line shaking accompanying peeling of a line portion did not occur, and there was no dissolution residue in a space part.

Δ: A clear photosensitive pattern of (line width)/(space width)=(100 μm)/(400 μm) was not drawn on a surface of the polyimide film (there was line thickening of a line width).

x: A photosensitive pattern of (line width)/(space width) =(100 μm)/(400 μm) was not drawn on a surface of the polyimide film, and dissolution residue was generated.

(v) Solvent Resistance

Using the same method as the above <Preparation of Black Resin Cured Film on Polyimide Film> item, a laminated film of the black resin cured film obtained by curing the black resin composition on a surface of a copper foil having a thickness of 35 μm was prepared. However, for exposure, a rectangular opening mask of a 100 μm square was used. The film was immersed in methyl ethyl ketone at 25° C. for 15 minutes, and then was dried, and a state of a surface of the film was observed. The test was performed using a coating film having a thickness of 20 μm.

○: There was no abnormality in the coating film.

x: An abnormality such as swelling or peeling occurred in the coating film.

(vi) Folding Endurance

Using the method as the above <Preparation of Black Resin Cured Film on Polyimide Film> item, a polyimide film with a black resin cured film that was exposed, developed, heated and cured without patterning on a surface of a polyimide film having a thickness of 25 μm (Apical 25NPI, manufactured by Kaneka Corporation) was prepared. The polyimide film with the black resin cured film was cut into a strip of 30 mm×10 mm, and was bent once at a place of 15 mm at 180 degrees with a curvature radius of R=1.0 mm, and confirmation of cracking was performed by visually checking a coating film. The test was performed using a coating film having a thickness of 40 μm.

○: There was no cracking in the black resin cured film.
Δ: There was slight cracking in the black resin cured film.
x: There was cracking in the black resin cured film.

(vii) Warping

Figure 3:
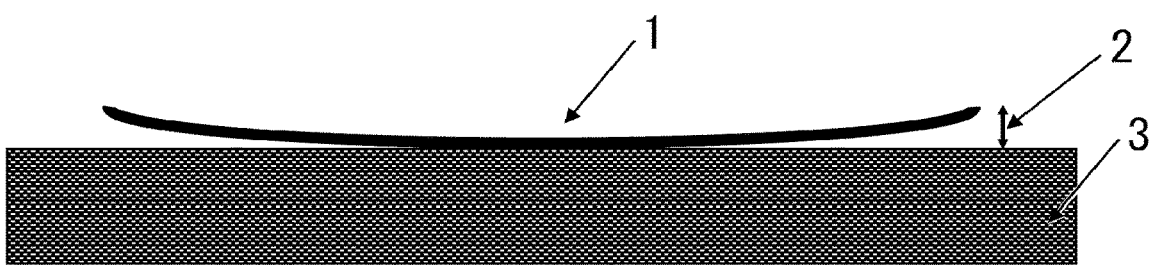
FIG. 3 is a schematic view in which a warpage amount of a polyimide film is measured.

Using the method as the above <Preparation of Black Resin Cured Film on Polyimide Film> item, a polyimide film with a black resin cured film that was exposed, developed, heated and cured without patterning on a surface of a polyimide film having a thickness of 25 μm (Apical 25NPI, manufactured by Kaneka Corporation) was prepared. The prepared polyimide film with the black resin cured film was processed into a 5 cm square, and warpage heights at four corners were measured. A schematic diagram in which a warpage amount of a film is measured is illustrated in FIG. 3. "1" in FIG. 3 is a single-sided substrate having the polyimide film with the black resin cured film, "2" in FIG. 3 is a warpage amount, and "3" in FIG. 3 is a smooth table. According to FIG. 3, a warpage height is a warpage amount indicated by "2."

The test was performed using a coating film having a thickness of 40 μm.

○: An average warpage height was less than 20 mm.
Δ: An average warpage height was 20 mm or more, and a tubular shape was not formed.
x: The film for the warping test formed a tubular shape.

(viii) Insulation Reliability

A comb-shaped pattern with (line width)/(space width)= (100 μm)/(100 μm) was prepared on a flexible copper-clad laminated plate (a copper foil had a thickness of 12 μm; a polyimide film was Apical 25NPI manufactured by Kaneka Corporation; and the copper foil was bonded using a polyimide-based adhesive), and was immersed in a 10% by volume sulfuric acid aqueous solution for 1 minute, and thereafter, was washed with pure water, and the copper foil was subjected to a surface treatment. Thereafter, using the same method as the above <Preparation of Black Resin Cured Film on Polyimide Film>, a black resin cured film was prepared on the comb-shaped pattern and a test specimen was prepared. A direct current of 100 V was applied to both terminal portions of the test specimen in an environmental testing machine at 85° C. and 85% RH, and a change in insulation resistance, occurrence of migration, and the like were monitored. The test was performed using a coating film having a thickness of 20 μm.

○: After the test was started, in 1,000 hours, a resistance value of $10^8$ or more was observed, and there was no occurrence of migration, dendrite, and the like.

x: After the test was started, in 1,000 hours, there was occurrence of migration, dendrite, and the like.

(viii) Press Tolerance

Using the same method as the above <Preparation of Black Resin Cured Film on Polyimide Film> item, a laminated film of the black resin cured film obtained by curing the black resin composition on a surface of a copper foil having a thickness of 35 μm was prepared. However, for exposure, a rectangular opening mask of a 100 μm square was used. Exposure was performed by irradiating ultraviolet light of an integrated exposure amount of 400 mJ/cm². Thereafter, the laminated film of the black resin cured film prepared above was heated and pressed at 165° C. for 90 minutes by hot pressing, and a deformation amount of a rectangular opening part was measured. The test was performed using a coating film having a thickness of 20 μm.

○: The opening part was opened by 90 μm or more after hot pressing.
Δ: The opening part was opened by 80-90 μm after hot pressing.
x: The opening part was opened by only 80 μm or less after hot pressing.

Further, level 2 did not open and a test could not be performed.

(ix) Solder Heat Resistance

Using the method as the above <Preparation of Black Resin Cured Film on Polyimide Film> item, a polyimide film with a black resin cured film was prepared on a surface of a polyimide film having a thickness of 75 μm (Apical 75NPI, manufactured by Kaneka Corporation). However, for exposure, a negative mask was not used. Exposure was performed by irradiating ultraviolet light of an integrated exposure amount of 400 mJ/cm² to an entire surface. The above black resin cured film was floated in a completely molten solder bath at 280° C. such that a surface coated with the black resin cured film was in contact with the molten solder, and the black resin cured film was pulled up after 10 seconds. This operation was performed three times, and an adhesive strength of the black resin cured film was evaluated using a cross-cut tape method according to JIS K5400. The test was performed using a coating film having a thickness of 20 μm.

◯: There was no peeling in the test using the cross-cut tape method.

Δ: 95% or more of the squares remained.

x: A remaining amount of the squares was less than 80%.

(x) Flux Solder Heat Resistance

Using the same method as the above <Preparation of Black Resin Cured Film on Polyimide Film> item, a laminated film of the black resin cured film obtained by curing the black resin composition on a surface of a polyimide film having a thickness of 75 μm (Apical 75NPI manufactured by Kaneka Corporation) was prepared. However, for exposure, a negative mask was not used. Exposure was performed by irradiating ultraviolet light of an integrated exposure amount of 400 mJ/cm² to an entire surface. JS-EU-31 manufactured by Hiroki Co., Ltd. was coated on a surface of the black resin cured film. Thereafter, the resulting object was floated in a completely molten solder bath at 280° C. such that a surface coated with the black resin cured film was in contact with the molten solder, and the object was pulled up after 10 seconds. This operation was performed three times, and an adhesive strength of the black resin cured film was evaluated using a cross-cut tape method according to JIS K5400. The test was performed using a coating film having a thickness of 70 μm.

◯: There was no peeling in the test using the cross-cut tape method.

A: 95% or more of the squares remained.

x: A remaining amount of the squares was less than 80%.

<Evaluation of Characteristics of Black Resin Cured Film>

Further, photosensitivity and the like of the black resin compositions of Blending Examples 6, 7 and 17-19 were evaluated. Evaluation methods are the same as the above-described methods. Evaluation results are listed in Table 15. In the following evaluation, using the same method as the above <Preparation of Black Resin Cured Film on Polyimide Film>, the black resin composition was printed in an area of 250 mm×300 mm on each of the base material and was dried for 20 minutes at 80° C. such that a predetermined final dry thickness was achieved, and thereafter, was exposed by placing a negative photomask and irradiating ultraviolet light of an integrated exposure amount of 400 mJ/cm². Next, using a solution obtained by heating a 1.0% by weight aqueous solution of sodium carbonate to 30° C., spray development was performed using a full cone type spray nozzle developing device at a discharge pressure of 1.5 kgf/mm² and at a spray impact of 2.0 kg/cm² for 60 seconds or at a spray impact of 10.0 kg/cm² for 60 seconds. After the development, washing was thoroughly performed with pure water, and thereafter, heating and curing were performed for 90 minutes in an oven at 160° C., and a copper foil with a black resin cured film was produced.

TABLE 15

| Evaluation item | Blending Example 6 | Blending Example 7 | Blending Example 6 | Blending Example 7 | Blending Example 17 | Blending Example 18 | Blending Example 19 |
| --- | --- | --- | --- | --- | --- | --- | --- |
| Spray impact (kg/cm²) | 2.0 | 2.0 | 10.0 | 10.0 | 2.0 | 2.0 | 2.0 |
| Electroless gold plating resistance | ◯ | ◯ | ◯ | ◯ | ◯ | ◯ | X |
| Evaluation of adhesion after flux solder heat resistance test | ◯ | ◯ | ◯ | ◯ | ◯ | ◯ | X |
| Blackness (L* value) | 26 | 26 | 26 | 26 | 25 | 22 | 22 |
| Photosensitivity | ◯ | ◯ | ◯ | ◯ | ◯ | ◯ | X |
| Solvent resistance | ◯ | ◯ | ◯ | ◯ | ◯ | ◯ | X |
| Folding endurance | ◯ | ◯ | ◯ | ◯ | ◯ | ◯ | ◯ |
| Warp | ◯ | ◯ | ◯ | ◯ | ◯ | ◯ | ◯ |
| Insulation reliability | ◯ | ◯ | ◯ | ◯ | X | ◯ | X |
| Press tolerance | ◯ | ◯ | ◯ | ◯ | Δ | ◯ | X |
| Solder heat resistance | ◯ | ◯ | ◯ | ◯ | Δ | ◯ | X |
| Flux solder heat resistance | ◯ | ◯ | ◯ | ◯ | Δ | ◯ | X |

<Evaluation of Characteristics of Black Resin Cured Film>

Further, photosensitivity and the like of the black resin compositions of Blending Examples 6, 7, 20, 21, 27, 28 and 33-37 were evaluated. Evaluation results are listed in Table 16. Among evaluation methods, evaluation methods other than a method for evaluating adhesion after a gold plating test and a method for evaluating adhesion after a flux solder heat resistance test are the same as the above-described methods. In the following evaluation, using the same method as the above <Preparation of Black Resin Cured Film on Polyimide Film>, the black resin composition was printed in an area of 250 mm×300 mm on each of the base material and was dried for 20 minutes at 80° C. such that a predetermined final dry thickness was achieved, and thereafter, was exposed by placing a negative photomask and irradiating ultraviolet light of an integrated exposure amount of 400 mJ/cm². Next, using a solution obtained by heating a 1.0% by weight aqueous solution of sodium carbonate to 30° C., spray development was performed for 60 seconds using a full cone type spray nozzle developing device at a discharge pressure of 1.5 kgf/mm² and a spray impact of 2.0 kg/cm². After the development, washing was thoroughly performed with pure water, and thereafter, heating and curing were performed for 90 minutes in an oven at 160° C., and a copper foil with a black resin cured film was produced.

TABLE 16

| Evaluation item | Blending Example 6 | Blending Example 7 | Blending Example 6 | Blending Example 7 | Blending Example 20 | Blending Example 21 | Blending Example 20 | Blending Example 21 | Blending Example 27 | Blending Example 28 |
|---|---|---|---|---|---|---|---|---|---|---|
| Spray impact (kg/cm$^2$) | 2.0 | 2.0 | 10.0 | 10.0 | 2.0 | 2.0 | 10.0 | 10.0 | 2.0 | 2.0 |
| Electroless gold plating resistance | ◎ | ◎ | ○ | ○ | ◎ | ◎ | ◎ | ◎ | ◎ | ◎ |
| Evaluation of adhesion after flux solder heat resistance test | ◎ | ◎ | ○ | ○ | ◎ | ◎ | ◎ | ◎ | ◎ | ◎ |
| Blackness (L* value) | 26 | 26 | 26 | 26 | 26 | 26 | 26 | 26 | 26 | 26 |
| Photosensitivity | ○ | ○ | ○ | ○ | ○ | ○ | ○ | ○ | ○ | ○ |
| Solvent resistance | ○ | ○ | ○ | ○ | ○ | ○ | ○ | ○ | ○ | ○ |
| Folding endurance | ○ | ○ | ○ | ○ | ○ | ○ | ○ | ○ | ○ | ○ |
| Warp | ○ | ○ | ○ | ○ | ○ | ○ | ○ | ○ | ○ | ○ |
| Insulation reliability | ○ | ○ | ○ | ○ | ○ | ○ | ○ | ○ | ○ | ○ |
| Press tolerance | ○ | ○ | ○ | ○ | ○ | ○ | ○ | ○ | ○ | ○ |
| Solder heat resistance | ○ | ○ | ○ | ○ | ○ | ○ | ○ | ○ | ○ | ○ |
| Flux solder heat resistance | ○ | ○ | ○ | ○ | ○ | ○ | ○ | ○ | ○ | ○ |

| Evaluation item | Blending Example 27 | Blending Example 28 | Blending Example 33 | Blending Example 34 | Blending Example 35 | Blending Example 36 | Blending Example 37 | Blending Example 38 |
|---|---|---|---|---|---|---|---|---|
| Spray impact (kg/cm$^2$) | 10.0 | 10.0 | 10.0 | 10.0 | 10.0 | 10.0 | 10.0 | 10.0 |
| Electroless gold plating resistance | ◎ | ◎ | ◎ | ◎ | ◎ | ◎ | ◎ | ◎ |
| Evaluation of adhesion after flux solder heat resistance test | ◎ | ◎ | ◎ | ◎ | ◎ | ◎ | ◎ | ◎ |
| Blackness (L* value) | 26 | 26 | 26 | 26 | 26 | 26 | 26 | 26 |
| Photosensitivity | ○ | ○ | ○ | ○ | ○ | ○ | ○ | ○ |
| Solvent resistance | ○ | ○ | ○ | ○ | ○ | ○ | ○ | ○ |
| Folding endurance | ○ | ○ | ○ | ○ | ○ | ○ | ○ | ○ |
| Warp | ○ | ○ | ○ | ○ | ○ | ○ | ○ | ○ |
| Insulation reliability | ○ | ○ | ○ | ○ | ○ | ○ | ○ | ○ |
| Press tolerance | ○ | ○ | ○ | ○ | ○ | ○ | ○ | ○ |
| Solder heat resistance | ○ | ○ | ○ | ○ | ○ | ○ | ○ | ○ |
| Flux solder heat resistance | ○ | ○ | ○ | ○ | ○ | ○ | ○ | ○ |

Adhesion Evaluation Method after Gold Plating Test According to Table 16

A tape was pasted on the polyimide with a black resin cured film so as to be perpendicular to a wiring direction of the polyimide with a black resin cured film, and was firmly rubbed so that air will not enter a space portion. Thereafter, a peeling test was performed at a peeling direction of about 60 degrees.

◎: remaining fine line pattern was 95-100%
○: remaining fine line pattern was 80-95%
Δ: Tape peeling partially occurred, and remaining fine line pattern was 80%,
x: Tape peeling occurred, and remaining fine line pattern was less than 80%.

Adhesion Evaluation after Flux Solder Heat Resistance Test According to Table 16

A support was adhered to the polyimide side of the polyimide with a black resin cured film and JS-EU-31 manufactured by Hiroki Co., Ltd. was coated on a surface of the black resin composition cured film. Thereafter, the resulting object was floated in a completely molten solder bath at 280° C. such that a surface coated with the black resin composition cured film was in contact with the molten solder, and the object was pulled up after 10 seconds. The operation was performed three times. In the same manner as (i) the evaluation of adhesion after the gold plating test, a tape was pasted on the polyimide with the black resin cured film so as to be perpendicular to a wiring direction of the polyimide with the black resin cured film, and was firmly rubbed so that air will not enter a space portion. Thereafter, a peeling test was performed at a peeling direction of about 60 degrees.

◎: remaining fine line pattern was 95-100%
○: remaining fine line pattern was 80-95%
Δ: Tape peeling partially occurred, and remaining fine line pattern was 80%, x: Tape peeling occurred, and remaining fine line pattern was less than 80%.

Among Blending Examples 1-38, preferable blending examples are Blending Examples 1-14 and 20-38, more preferable blending examples are Blending Examples 20-23, 27-30 and 34-38, and even more preferable blending examples are Blending Examples 21, 22, 28, 29 and 34-38.

INDUSTRIAL APPLICABILITY

The present invention can provide a polyimide with a black resin cured film that has excellent flame resistance and high opacity and allows a shape and adhesion to be sufficiently maintained with respect to a gold plating chemical liquid or a flux solder in a mounting process, and can provide a method for producing the polyimide with the black resin cured film, and can provide a flexible printed wiring board having the polyimide with the black resin cured film. Therefore, the polyimide with the black resin cured film and the flexible printed board having the polyimide with the black resin cured film can be suitably used for a film-like printed wiring board mounted in a small device such as a mobile phone, a digital camera, or the like.

DESCRIPTION OF REFERENCE NUMERALS

1: single-sided substrate having a polyimide film with a black resin cured film
2: warpage amount
3: smooth table

What is claimed is:

1. A method of producing a polyimide comprising a black resin cured film, the method comprising:
   applying a black resin composition on a polyimide;
   conducting a spray development by adjusting a spray impact force of a nozzle to spray a liquid developer with respect to the black resin composition to from 0.10 to 10.0 kg/cm$^2$; and
   curing the black resin composition after the development such that a black resin cured film is formed having a thickness of from 40 to 70 μm on the polyimide,
   wherein the black resin cured film is formed such that in a cross section of the black resin cured film, when a vertical line (L) passing through a substrate-adhered edge (E) between the black resin cured film and the polyimide is drawn with respect to a surface of the polyimide, a distance (U) from an intersection point between the vertical line (L) and a top portion of the black resin cured film to an edge of the top portion is 25 μm or less.

2. The method of claim 1, wherein the black resin cured film has a line width (w) of 100 μm or less and a line length (W) of 500 μm or more.

3. The method of claim 1, wherein the black resin composition comprises:
   (a) a carboxyl group-containing photosensitive resin,
   (b) a photopolymerization initiator, and
   (c) a colorant.

4. The method of claim 3, wherein (a) the carboxyl group-containing photosensitive resin has at least one partial structure selected from the group consisting of a bisphenol A structure, a bisphenol F structure, a biphenol structure, a biphenol novolac structure, a bisxylenol structure, a biphenyl novolac structure and a urethane structure.

5. The method of claim 3, wherein (b) the photopolymerization initiator has the following formula (1) or the following formula (2) or is a mixture of a photopolymerization initiator of the formula (1) and a photopolymerization initiator of the formula (2):

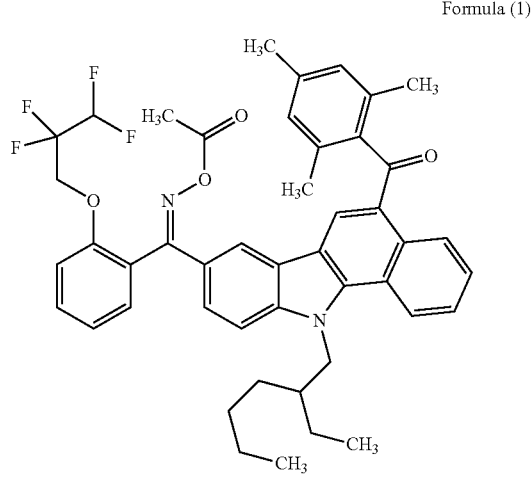

Formula (1)

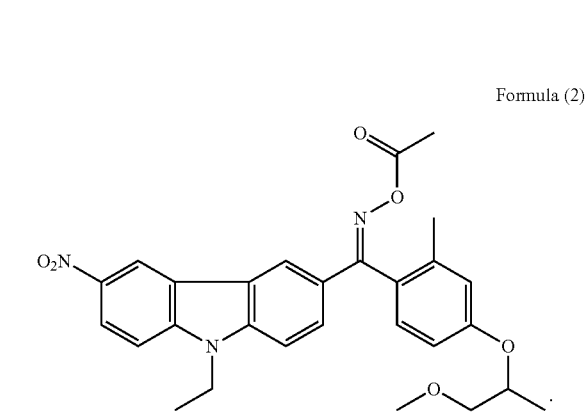

Formula (2)

6. The method of claim 3, wherein (b) the photopolymerization initiator is a mixture of two oxime ester-based photopolymerization initiators, and
   the two oxime ester-based photopolymerization initiators comprise
      an oxime ester-based photopolymerization initiator of the following formula (1) and an oxime ester-based photopolymerization initiator of the following formula (2), or
      the oxime ester-based photopolymerization initiator of the formula (2) and an oxime ester-based photopolymerization initiator of the following formula (11):

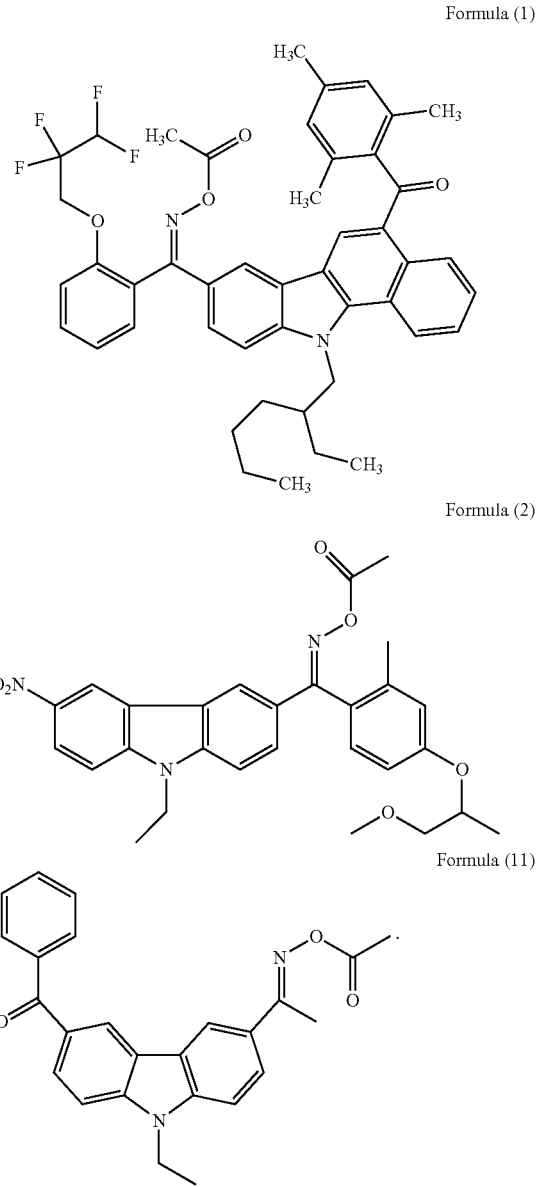

7. The method of claim 6, wherein the two oxime ester-based photopolymerization initiators satisfy a relation X:Y=0.1:0.9-0.9:0.1, wherein X is an additive amount of the oxime ester-based photopolymerization initiator of the formula (1) or the formula (11), and Y is an additive amount of the oxime ester-based photopolymerization initiator of the formula (2).

8. The method of claim 3, wherein (c) the colorant comprises a perylene-based colorant, a phthalocyanine-based colorant, or a combination thereof.

9. The method of claim 1, wherein the black resin cured film is formed such that the black resin cured film has a blackness (L*) value of from 10 to 30 upon being formed in a thickness of 20 μm.

10. The method of claim 1, wherein the black resin composition further contains comprises an α-aminoacetophenone-based photopolymerization initiator.

11. The method of claim 1, wherein the black resin composition further comprises (d) a plurality of organic particles, wherein an average particle size of the organic particles is from 0.05 to 20 μm, wherein the average particle size is measured as a volume-based median diameter, which is a particle size corresponding to 50% of a cumulative distribution value, using laser diffraction/scattering.

12. The method of claim 11, wherein (d) the organic particles comprise urethane bonds.

13. The method of claim 1, wherein the black resin composition further comprises (e) a phosphinate compound.

14. A black resin composition, comprising;

(a) a carboxyl group-containing photosensitive resin;

(b) a photopolymerization initiator;

(c) a colorant;

(d) a plurality of organic particles, wherein an average particle size of the organic particles is from 0.05 to 20 μm, wherein the average particle size is measured as a volume-based median diameter, which is a particle size corresponding to 50% of a cumulative distribution value, using laser diffraction/scattering; and (e) a phosphinate compound, wherein (a) the carboxyl group-containing photosensitive resin has at least one partial structure selected from the group consisting of a bisphenol A structure, a bisphenol F structure, a biphenol structure, a biphenol novolac structure, a bisxylenol structure, a biphenyl novolac structure and a urethane structure, (b) the photopolymerization initiator has a structure of the following formula (1) or is a mixture of a photopolymerization initiator of the formula (1) and a photopolymerization initiator of the following formula (2), (c) the colorant comprises a perylene-based colorant, a phthalocyanine-based colorant or a mixture thereof, and the black resin composition is curable to form a black resin cured film having a blackness (L*) value of from 10 to 30 at a thickness of 20 μm:

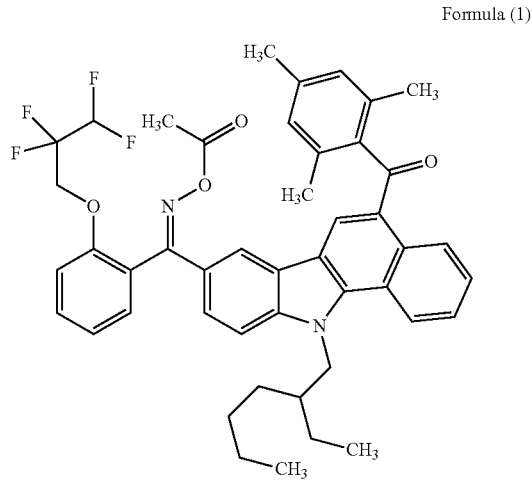

Formula (2)

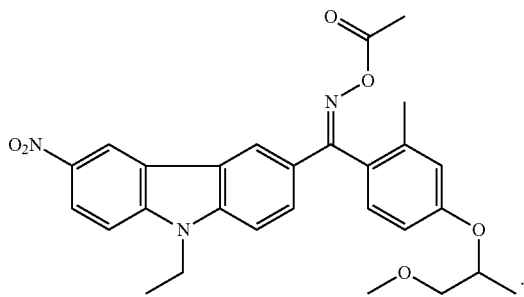

Formula (1)

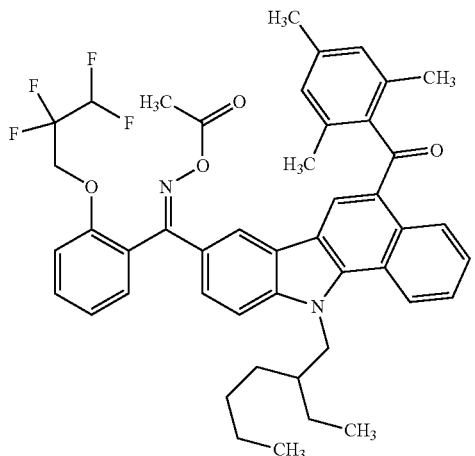

Formula (2)

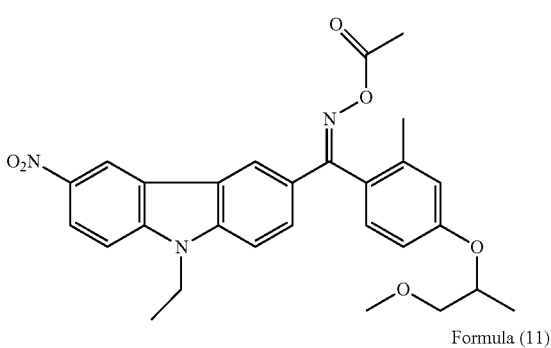

Formula (11)

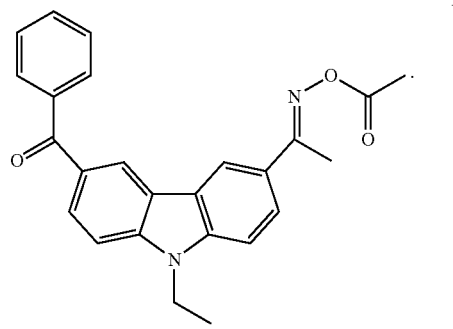

15. A black resin composition, comprising:

(a) a carboxyl group-containing photosensitive resin;

(b) a photopolymerization initiator;

(c) a colorant;

(d) a plurality of organic particles, wherein an average particle size of the organic particles is from 0.05 to 20 μm, wherein the average particle size is measured as a volume-based median diameter, which is a particle size corresponding to 50% of a cumulative distribution value, using laser diffraction/scattering; and (e) a phosphinate compound, wherein (a) the carboxyl group-containing photosensitive resin has at least one partial structure selected from the group consisting of a bisphenol A structure, a bisphenol F structure, a biphenol structure, a biphenol novolac structure, a bisxylenol structure, a biphenyl novolac structure and a urethane structure, (b) the photopolymerization initiator is a mixture of two oxime ester-based photopolymerization initiators, the two oxime ester-based photopolymerization initiators comprise an oxime ester-based photopolymerization initiator of the following formula (1) and an oxime ester-based photopolymerization initiator of the following formula (2), or the oxime ester-based photopolymerization initiator of the formula (2) and an oxime ester-based photopolymerization initiator of the following formula (11), and the two oxime ester-based photopolymerization initiators satisfy a relation X:Y=0.1:0.9-0.9:0.1, wherein X is an additive amount of the oxime ester-based photopolymerization initiator of the formula (1) or the formula (11), and Y is an additive amount of the oxime ester-based photopolymerization initiator of the formula (2), (c) the colorant comprises a perylene-based colorant, a phthalocyanine-based colorant or a combination thereof, and, the black resin composition is curable to form a black resin cured film having a a blackness (L*) value of from 10 to 30 at thickness of 20 μm:

16. The black resin composition of claim 14, wherein the black resin composition further comprises an α-aminoacetophenone-based photopolymerization initiator.

17. The black resin composition of claim 14 wherein (d) the organic particles comprise urethane bonds.

18. A method of producing a polyimide comprising a black resin cured film, the method comprising:

applying the black resin composition of claim 14 on a polyimide:

conducting a spray development by adjusting a spray impact force of a nozzle to spray a liquid developer with respect to the black resin composition to from 0.10 to 10.0 kg/cm²; and curing the black resin composition after the development such that a black resin cured film is formed having a thickness of from 40 to 70 μm on the polyimide, wherein the black resin cured film is formed such that in a cross section of the black resin cured film, when a vertical line (L) passing through a substrate-adhered edge (E) between the black resin cured film and the polyimide is drawn with respect to a surface of the polyimide, a distance (U) from an intersection point between the vertical line (L) and a top portion of the black resin cured film to an edge of the top portion is 25 μm or less.

19. The method of claim 18, wherein the black resin cured film has a line width (w) of 100 μm or less and a line length (W) of 500 μm or more.

20. A flexible printed wiring board, comprising:
a polyimide with a black resin cured film obtained by a process comprising curing the black resin composition of claim 14 on the polyimide.

21. A flexible printed wiring board, comprising:
a polyimide; and
a black resin cured film formed on the polyimide and having a thickness of from 40 to 70 μm, wherein the black resin cured film is a cured film of the black resin composition of claim 14,
wherein the black resin cured film has a structure such that, in a cross section of the black resin cured film, when a vertical line (L) passing through a substrate-adhered edge (E) between the black resin cured film and the polyimide is drawn with respect to a surface of the polyimide, a distance (U) from an intersection point between the vertical line (L) and a top portion of the black resin cured film to an edge of the top portion is 25 μm or less.

* * * * *